(12) United States Patent
Sugiyama

(10) Patent No.: US 12,440,546 B2
(45) Date of Patent: Oct. 14, 2025

(54) COMPOSITION FOR PREVENTING OR TREATING BENIGN TUMOR

(71) Applicant: International Institute of Cancer Immunology, Inc., Suita (JP)

(72) Inventor: Haruo Sugiyama, Minoo (JP)

(73) Assignee: International Institute of Cancer Immunology, Inc., Suita (JP)

( * ) Notice: Subject to any disclaimer, the term of this patent is extended or adjusted under 35 U.S.C. 154(b) by 557 days.

(21) Appl. No.: 17/282,172

(22) PCT Filed: Oct. 4, 2019

(86) PCT No.: PCT/JP2019/039383
§ 371 (c)(1),
(2) Date: Apr. 1, 2021

(87) PCT Pub. No.: WO2020/071551
PCT Pub. Date: Apr. 9, 2020

(65) Prior Publication Data
US 2022/0008528 A1    Jan. 13, 2022

(30) Foreign Application Priority Data
Oct. 5, 2018    (JP) .................................. 2018-190461

(51) Int. Cl.
| *A61K 39/00* | (2006.01) |
| *A61K 35/15* | (2025.01) |
| *A61K 35/17* | (2025.01) |
| *A61K 39/39* | (2006.01) |
| *A61P 35/00* | (2006.01) |
| *C12N 5/0784* | (2010.01) |

(52) U.S. Cl.
CPC ...... *A61K 39/001153* (2018.08); *A61K 35/15* (2013.01); *A61K 35/17* (2013.01); *A61K 39/39* (2013.01); *A61P 35/00* (2018.01); *C12N 5/0639* (2013.01); *A61K 2039/53* (2013.01); *A61K 2039/545* (2013.01); *A61K 2039/55566* (2013.01); *C12N 2501/415* (2013.01)

(58) Field of Classification Search
CPC .............................. A61K 38/08; A61K 38/10; A61K 39/001153; A61K 38/04; A61K 39/46444; A61K 39/464412; A61K 39/4631; A61K 35/17; C07K 14/5434; C07K 2319/03; C07K 2319/33; C07K 7/06; C07K 14/4703; C07K 14/82; A61P 35/00; G01N 33/574; C12N 2501/415
See application file for complete search history.

(56) References Cited

U.S. PATENT DOCUMENTS

| 7,342,092 B2 * | 3/2008 | Sugiyama | C07K 14/82 530/324 |
| 7,420,034 B2 * | 9/2008 | Sugiyama | A61K 39/001153 530/328 |
| 7,517,950 B2 * | 4/2009 | Sugiyama | C07K 14/82 530/300 |
| 9,119,801 B2 * | 9/2015 | Sugiyama | C12N 5/0639 |
| 9,181,302 B2 * | 11/2015 | Li | C07K 7/06 |
| 9,248,173 B2 * | 2/2016 | Li | C07K 14/00 |
| 10,426,822 B2 * | 10/2019 | Sugiyama | G01N 33/56972 |
| 10,525,096 B2 | 1/2020 | Sugiyama | |
| 11,707,512 B2 * | 7/2023 | Sugiyama | C12N 5/0639 514/19.3 |
| 11,759,509 B2 * | 9/2023 | Li | A61P 37/04 514/21.4 |
| 2015/0080321 A1 | 3/2015 | Li et al. | |
| 2015/0238587 A1 | 8/2015 | Li et al. | |
| 2016/0114019 A1 | 4/2016 | Li et al. | |
| 2017/0368131 A1 | 12/2017 | Sugiyama | |

(Continued)

FOREIGN PATENT DOCUMENTS

| CN | 1126761 A | 7/1996 |
| JP | 2013-116891 A | 6/2013 |

(Continued)

OTHER PUBLICATIONS

Haruo Sugiyama Jpn J Clin Oncol May 2010;40(5):377-87.*
Oji et al. International journal of cancer , May 11, 2016, vol. 139, Issue 6, pp. 1391-1401.*
Akihisa Sawada et al. Pediatric Blood a & Cancer , published on Oct. 15, 2015, pp. 234-241.*
Tsuboi et al. Cancer immunology and Immunotherapy 2002, vol. 51, pp. 614-620.*
Extended European Search Report issued May 27, 2022, in corresponding European Patent Application No. 19868580.2, 11 pages.

(Continued)

*Primary Examiner* — Bao Q Li
(74) *Attorney, Agent, or Firm* — Oblon, McClelland, Maier & Neustadt, L.L.P.

(57) ABSTRACT

The present disclosure provides a composition for preventing or treating a benign tumor. Provided is a composition for preventing or treating a benign tumor that comprises a WT1 peptide or an analog thereof, or a nucleic acid molecule encoding a WT1 peptide or an analog thereof. In a specific embodiment, the present disclosure provides a composition for preventing or treating a benign tumor that comprises a WT1 peptide or an analog thereof, or a nucleic acid molecule encoding a WT1 peptide or an analog thereof. In a preferred embodiment, the composition for preventing or treating a benign tumor (e.g. familial adenomatous polyposis) according to the present disclosure comprises a killer type WT1 peptide and/or a helper type WT1 peptide. In a further preferred embodiment, the WT1 peptide is $WT1_{126}$ killer peptide and/or $WT1_{35}$ helper peptide. In another aspect, provided are a method of inducing WT1 peptide-specific CTLs, a method of inducing WT1-specific helper T cells, and a method of inducing dendritic cells presenting a WT1 peptide.

28 Claims, 9 Drawing Sheets
Specification includes a Sequence Listing.

(56) References Cited

U.S. PATENT DOCUMENTS

| | | |
|---|---|---|
| 2018/0140691 A1 | 5/2018 | Takasu et al. |
| 2019/0030149 A1 | 1/2019 | Li et al. |
| 2020/0023029 A1 | 1/2020 | Sugiyama |
| 2020/0078436 A1 | 3/2020 | Sugiyama |
| 2021/0100886 A1 | 4/2021 | Ban et al. |

FOREIGN PATENT DOCUMENTS

| | | |
|---|---|---|
| JP | 2017-523784 A | 8/2017 |
| WO | WO 2014/157692 A1 | 10/2014 |
| WO | WO 2016/022400 A1 | 2/2016 |
| WO | WO 2016/093326 A1 | 6/2016 |
| WO | WO 2018/181648 A1 | 10/2018 |

OTHER PUBLICATIONS

An Coosemans et al., "Wilms' tumor gene 1 (WT1) in endometrial carcinoma", Gynecologic Oncology, vol. 111, No. 3, XP025691010, 2008, pp. 502-508.

International Search Report issued Dec. 17, 2019 in PCT/JP2019/039383, 4 pages.

International Preliminary Report on Patentability and Written Opinion issued Mar. 23, 2021 in PCT/JP2019/039383, 18 pages.

Karl M. Napekoski et al., "Microvenular hemangioma: a clinicopathologic review of 13 cases", Journal of Cutaneous Pathology, 2014, vol. 41, No. 11, pp. 816-822.

Toshiaki Shirakata et al., "WT1 peptide therapy for a patient with chemotherapy-resistant salivary gland cancer", Anticancer Research, 2012, vol. 32, No. 3, pp. 1081-1085.

Ohuchi et al., The dental journal of Health Sciences University of Hokkaido, 2007, vol. 26, No. 2, pp. 85-86.

Langman, G. et al., "WT1 expression in salivary gland pleomorphic adenomas: a reliable marker of the neoplastic myoepithelium.", Modern Pathology, 2011, vol. 24, No. 2, pp. 168-174.

Weber et al., "WT1peptide-specific T cells generated from peripheral blood of healthy donors: possible implications for adoptive immunotherapy after allogeneic stem cell transplantation", Leukemia, 2009, vol. 23, No. 9, pp. 1634-1642.

Koido et al., "Treatment with chemotherapy and dendritic cells pulsed with multiple Wilms' tumor 1 (WT1)-specific MHC class I/II-restricted epitopes for pancreatic cancer", Clinical Cancer Research, 2014, vol. 20, No. 16, pp. 4228-4239.

Amini Nik et al., "Upregulation of Wilms' tumor gene 1 (WT1) in desmoid tumors", International Journal of Cancer, 2005, vol. 114, No. 2, pp. 202-208.

Nomura et al., "A Case of Heterochronous Ascending Colon Carcinoid 7 Years after Curative Resection of Descending Colon Carcinoid", The Japanese Journal of Gastroenterological Surgery, vol. 37, No. 2, pp. 217-222.

Bautz et al., "Prophylactic vaccination targeting ERBB3 decreases polyp burden in a mouse model of human colorectal cancer", Oncoimmunology, 2016, vol. 6, No. 1, pp. 1-6.

Aslan et al., "Investigation of Insulin-Like Growth Factor-1 (IGF-1), P53, and Wilms' Tumor 1 (WT1) Expression Levels in the Colon Polyp Subtypes in Colon Cancer", Medical Science Monitor, 2019, vol. 25, pp. 5510-5517.

Gessler et al., "Homozygous deletion in Wilms tumours of a zinc-finger gene identified by chromosome jumping", Nature, 1990, vol. 343, pp. 774-778.

Combined Chinese Office Action and Search Report issued Jan. 9, 2024, in corresponding Chinese Patent Application No. 201980080769.X (with English Translation and English Translation of Category of Cited Documents), 36 pages.

"Research of Chinese Medical Biology (II)", Proceedings of the Fourth National Symposium on Teaching and Research in Medical Biology, Compiled by Medical Biology Group of the Medical Education Society of the Chinese Medical Association, Chengdu: Sichuan Publishing House of Science and Technology, vol. 2, Apr. 30, 1998, 6 pages (with unedited computer-generated English translation).

Papp, Janos et al., "Contribution of APC and MUTYH mutations to familial adenomatous polyposis susceptibility in Hungary," Familial cancer, vol. 15, 2016, pp. 85-97.

\* cited by examiner

WT1 vaccine: WT1 peptides (WT1$_{126}$ killer peptide + WT1$_{35}$ helper peptide) + Montanide adjuvant
Control vaccine: PBS + Montanide adjuvant

COMPOSITION FOR PREVENTING OR TREATING BENIGN TUMOR

TECHNICAL FIELD

The present disclosure includes medicaments and methods for the prevention or treatment of benign tumors. In one specific example, the present disclosure relates to a composition for preventing or treating familial adenomatous polyposis.

BACKGROUND

Benign tumors are tumors that have no pathologically malignant findings. It is a common understanding that benign tumors are different from malignant tumors and do not show metastasis or infiltration tendency. Most benign tumors are asymptomatic, but when their diameters are large, they can show some symptoms or become malignant by compressing other tissues, and need to be treated or prevented. Therefore, there are little therapeutic and prophylactic agents for benign tumors Familial adenomatous polyposis is a hereditary disease with heterozygous deletion of a tumor suppressor gene APC. From around the age of 20, a homozygous deletion of the APC gene occurs in glandular cells having APC heterozygous deletion in large the intestine and adenomas develop everywhere in the large intestine, and then colon cancer develops from the adenomas. Initially, the adenomas are resected endoscopically as a treatment. However, since the adenomas subsequently become too dense to be resected and cancer develops from the adenomas, total colectomy is often performed. The penetration rate is 100%, and it is an extremely disastrous disease that develops around the age of 20 for all carriers. There are about 6,000 patients in Japan.

Aspirin is known to be effective in preventing the development and/or suppressing the progression of adenomas and adenocarcinoma in familial adenomatous polyposis, but its effect is weak and there is a risk of gastrointestinal bleeding as a side effect of aspirin.

The Wilms tumor gene WT1 was isolated as a gene involved in tumorigenesis of Wilma tumor, which is a pediatric renal tumor (see Non-Patent Document 1), This gene encodes a zinc finger transcription factor associated with the regulatory mechanisms of cell proliferation and differentiation as well as apoptosis and tissue development.

PRIOR ART DOCUMENT

Non-Patent Document

Non-patent document 1: Gessler, M. et al., Nature, Vol. 343, pp. 774-778, 1990

SUMMARY

Means for Solving Problem

Through diligent research, the present inventors have found that a WT1 peptide vaccine is effective in suppressing and/or delaying the development of adenoma in a benign tumor such as familial adenomatous polyposis, and suppressing and/or delaying the development of symptoms from the adenoma, and it is effective for the treatment and prevention of a benign tumor such as familial adenomatous polyposis, which is considered to be intractable because there is no radical treatment except for total resection. The present inventors have found that adenomas of patients with a benign tumor such as familial adenomatous polyposis express the WT1 cancer antigen, and thus come up with the idea that WT1 cancer vaccines may be effective in suppressing and/or delaying the development of adenoma in a benign tumor such as familial adenomatous polyposis, and suppressing and/or delaying the development of symptoms from the adenoma, and then finally accomplished the present invention.

The present disclosure is based on the surprising finding that cells in adenomas of a benign tumor express the WT1 protein. It has been known in the art that the WT1 protein is highly expressed in cancer cells of malignant tumors, and the usefulness of WT1 peptide vaccines in malignant tumors can be readily predicted. The present disclosure has revealed for the first time that cells in adenomas of familial adenomatous polyposis, which is a benign tumor, express the WT1 protein, and come up with the idea of providing therapeutic or prophylactic agents for benign tumors in general. In addition, since the effectiveness of WT1 peptide vaccines depends on the mode of expression (including expression level) of the WT1 protein, it was not reasonably predicted even if the WT1 protein was found to be expressed in adenomas. In this respect, the present disclosure has demonstrated for the first time that WT1 peptide vaccines are effective for benign tumors, and has found unpredictable effects from the prior art.

Accordingly, the present disclosure provides:

(Item X1)

A composition for preventing or treating a benign tumor, comprising a WT1 peptide or an analog thereof.

(Item X2)

The composition according to item X1, wherein the WT1 peptide or the analog thereof includes a killer type peptide and/or a helper type peptide.

(Item X3)

The composition according to item X1 or item X2, wherein the WT1 peptide or the analog thereof includes $WT1_{126}$ killer peptide and/or $WT1_{35}$ helper peptide.

(Item X4)

The composition according to any one of items X1 to X3, wherein the composition comprises a nucleic acid molecule encoding a WT1 peptide or an analog thereof.

(Item X5)

The composition according to any one of items X1 to X4, wherein the nucleic acid molecule includes RNA and/or DNA.

(Item X6)

The composition according to any one of items X1 to X5, wherein the composition further comprises an adjuvant.

(Item X7)

The composition according to any one of items X1 to X6, wherein the adjuvant is Montanide® ISA51 adjuvant.

(Item X8)

The composition according to any one of items X1 to X7, wherein the benign tumor expresses WT1.

(Item X9)

The composition according to any one of items X1 to X8, wherein the benign tumor is selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.

(Item X10)

The composition according to any one of items X1 to X9, wherein the benign tumor is familial adenomatous polyposis.

(Item X11)

The composition according to any one of items X1 to X10, wherein the composition is to be administered once a week.

(Item X12)

A method of inducing WT1-specific CTLs and/or WT1-specific helper T cells for use in preventing or treating a benign tumor, comprising culturing peripheral blood mononuclear cells from a subject in need of treatment for a benign tumor in the presence of the WT1 peptide or the analog thereof according to any one of the preceding items or introducing the nucleic acid molecule encoding a WT1 peptide or an analog thereof according to any one of the preceding items into peripheral blood mononuclear cells from a subject in need of treatment for a benign tumor, and inducing WT1-specific CTLs and/or WT1-specific helper T cells from the peripheral blood mononuclear cells.

(Item X13)

A method of inducing WT1-presenting dendritic cells for use in preventing or treating a benign tumor, comprising culturing immature dendritic cells from a subject in need of treatment for a benign tumor in the presence of the WT1 peptide or the analog thereof according to any one of the preceding items of introducing the nucleic acid molecule 20 encoding a WT1 peptide or an analog thereof according to any one of the preceding items into immature dendritic cells from a subject in need of treatment for a benign tumor, and inducing WT1-presenting dendritic cells.

(Item X13A)

The method of item X12 or 13, further comprising one or more features according to any one or more of items X1 to X11.

(Item X14)

A composition for inducing WT1-specific CTLs and/or WT1-specific helper T cells, comprising a WT1 peptide or an analog thereof, or a nucleic acid molecule encoding a WT1 peptide or an analog thereof, wherein the composition is for use in preventing or treating a benign tumor.

(Item X15)

A composition for inducing WT1-presenting dendritic cells, comprising a WT1 peptide or an analog thereof, or a nucleic acid molecule encoding a WT1 peptide or an analog thereof, wherein the composition is for use in preventing or treating a benign tumor.

(Item X15A)

The composition according to item X14 or item X15, further comprising one or more features according to any one or more of items X1 to X13.

(Item X16)

A composition for preventing or treating a benign tumor, comprising WT1-specific CTLs and/or WT1-specific helper T cells.

(Item X17)

A composition for preventing or treating a benign tumor, comprising WII-presenting dendritic cells.

(Item X17A)

The composition according to item X16 or item X17, further comprising one or more features according to any one or more of items X1 to X13.

The present disclosure also provides:

(Item 1)

A composition for preventing or treating a benign tumor, comprising a WT1 peptide or an analog thereof.

(Item 2)

The composition according to item 1, wherein the WT1 peptide or the analog thereof includes a killer type peptide and/or a helper type peptide.

(Item 3)

The composition according to item 1 or 2, wherein the WT1 peptide or the analog thereof includes $WT1_{126}$ killer peptide, $WT1_{235}$ killer peptide, and/or $WT1_{35}$ helper peptide, or a peptide comprising an amino acid sequence that differs from the amino acid sequence of any one of the $WT1_{120}$ killer peptide, $WT1_{235}$ killer peptide, and $WT1_{35}$ helper peptide in that one to several amino acids are deleted, substituted, and/or added and having CTL-inducing activity.

(Item 4)

The composition according to any one of items 1-3, wherein the WT1 peptide or the analog thereof is a peptide consisting of an amino acid sequence selected from RMFPNAPYL (SEQ ID NO: 2),
RYFPNAPYL (SEQ ID NO: 46),
YMFPNAPYL (SEQ ID NO: 14),
CYTWNOMNL (SEQ ID NO: 45),
CMTWNOMNL (SEQ ID NO: 3),
C-CYTWNOMNL (SEQ ID NO: 47) (wherein C-C shown in the formula means that the C residues are linked together by a disulfide bond), and
C-CMTWNOMNL (SEQ ID NO: 48) (wherein C-C shown in the formula means that the C residues are linked together by a disulfide bond);
or a pharmaceutically acceptable salt thereof.

(Item 5)

The composition according to any one of items 1-4, wherein the WT1 peptide or the analog thereof is the compound of formula (2):

(2)

(wherein C-C shown in the formula means that the C residues are linked together by a disulfide bond),
or a pharmaceutically acceptable salt thereof.

(Item 6)

The composition according to any one of items 1-5, wherein the WT1 peptide or the analog thereof is the compound of formula (3):

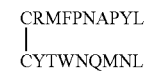

(3)

(wherein C-C shown in the formula means that the C residues are linked together by & disulfide bond), or a pharmaceutically acceptable salt thereof.

(Item 7)

The composition according to any one of items 1-6, wherein the WT1 peptide or the analog thereof is a composition further comprising at least one peptide consisting of an amino acid sequence selected from the group consisting of WAPVLDFAPPGAYSL (SEQ ID NO: 4),
CWAPVLDFAPPGASAYGSL (SEQ ID NO: 50) and
WAPVLDEAPPGASAYGSLC (SEQ ID NO: 51),
or a pharmaceutically acceptable salt thereof.

(Item 8)
The composition according to any one of items 1-7, wherein the WT1 peptide or the analog thereof is a composition comprising the compound of formula (2):

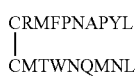

(wherein C-C shown in the formula means that the C residues are linked together by a disulfide bond) or a pharmaceutically acceptable salt thereof, and
a peptide consisting of the amino acid sequence: WAPVLDFAPPGASAYGSL (SEQ ID NO: 4) or a pharmaceutically acceptable salt thereof.

(Item 9)
The composition according to any one of items 1-8, wherein the WT1 peptide or the analog thereof is a composition comprising the compound of formula (3);

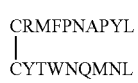

(wherein C-C shown in the formula means that the C residues linked together by a disulfide bond) or a pharmaceutically acceptable salt thereof, and
a peptide consisting of the amino acid sequence: WAPVLDEAPPGASAYGSL (SEQ ID. NO: 4) or a pharmaceutically acceptable salt thereof.

(Item 10)
A composition for preventing or treating a benign tumor, comprising a nucleic acid molecule encoding a WT1 peptide or an analog thereof.

(Item 11)
The composition according to any one of items A1 to A10, wherein the nucleic acid molecule includes RNA and/or DNA, (Item 12)
The composition according to any one of items 1-11, wherein the composition further comprises an adjuvant.

(Item 13)
The composition according to any one of items 1-12, wherein the adjuvant is Montanide® ISA51 adjuvant.

(Item 14)
The composition according to any one of items 1-13, wherein the benign tumor expresses WT1.

(Item 15)
The composition according to any one of items 1-14, wherein the benign tumor is selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.

(Item 16)
The composition according to any one of items 1-15, wherein the benign tumor is familial adenomatous polyposis.

(Item 17)
The composition according to any one of claims 1-16, wherein the composition is to be administered once a week, (Item 18)
A method of inducing WT1-specific CTLs and/or WT1-specific helper T cells for use in preventing or treating a benign tumor, comprising culturing peripheral blood mononuclear cells from a subject in need of treatment for a benign tumor in the presence of the WT1 peptide or the analog thereof according to any one of the preceding items or introducing the nucleic acid molecule encoding a WT1 peptide or an analog thereof according to any one of the preceding items into peripheral blood mononuclear cells from a subject in need of treatment for a benign tumor, and inducing WT1-specific CTLs and/or WT1-specific helper T cells from the peripheral blood mononuclear cells.

(Item 19)
A method of inducing WT1-presenting dendritic cells for use in preventing or treating a benign tumor, comprising culturing immature dendritic cells from a subject in need of treatment for a benign tumor in the presence of the WT1 peptide or the analog thereof according to any one of the preceding items or introducing the nucleic acid molecule encoding a WT1 peptide or an analog thereof according to any one of the preceding items into immature dendritic cells from a subject in need of treatment for a benign tumor, and inducing WT1-presenting dendritic cells.

(Item 19A)
The method of item 18 or 19, further comprising one or more features according to any one or more of items 1-17.

(Item 20)
A composition for inducing WT1-specific CTLs and/or WT1-specific helper T cells, comprising a WT1 peptide or an analog thereof, or a nucleic acid molecule encoding a WT1 peptide or an analog thereof, wherein the composition is for use in preventing or treating a benign tumor.

(Item 21)
A composition for inducing WT1-presenting dendritic cells, comprising a WT1 peptide or an analog thereof, or a nucleic acid molecule encoding a WT1 peptide or an analog thereof, wherein the composition is for use in preventing or treating a benign tumor.

(Item 21A)
The composition of item 20 or 21, further comprising one or more features according to any one or more of items 1-19.

(Item 22)
A composition for preventing or treating a benign tumor, comprising WT1-specific CTLs and/or WT1-specific helper T cells.

(Item 23)
A composition for preventing or treating a benign tumor, comprising WII-presenting dendritic cells.

(Item 23A)
The composition according to item 22 or 23, further comprising one or more features according to any one or more of items 1-19.

(Item A1)
A method of preventing or treating a benign tumor in a subject, comprising administering to the subject an effective amount of a WT1 peptide or an analog thereof.

(Item A2)
The method according to item A1, wherein the WT1 peptide or the analog thereof includes a killer type peptide and/or a helper type peptide.

(Item A3)
The method according to item A1 or A2, wherein the WT1 peptide or the analog thereof includes $WT1_{126}$ killer peptide, $WT1_{235}$ killer peptide, and/or $WT1_{35}$ helper peptide, or a peptide comprising an amino acid sequence that differs from the amino acid sequence of any one of the $WT1_{126}$ killer peptide, $WT1_{235}$ killer peptide, and $WT1_{35}$ helper peptide in that one to several amino acids are deleted, substituted, and/or added and having CTL-inducing activity.

(Item A4)

The composition according to any one of items A1-A3, wherein the WT1 peptide or the analog thereof is a peptide consisting of an amino acid sequence selected from
RMFPNAPYL (SEQ ID NO: 2),
RYFPNAPYL (SEQ ID NO: 46),
YMFPNAPYL (SEQ ID NO: 14),
CYTWNQMNL (SEQ ID NO: 45),
CMTWNQMNL (SEQ ID NO: 3),
C-CYTWNQMNL (SEQ ID NO: 47) (wherein C-C shown in the formula means that the C residues are linked together by a disulfide bond), and
C-CMTWNQMNL (SEQ ID NO: 48) (wherein C-C shown in the formula means that the C residues are linked together by a disulfide bond),
or a pharmaceutically acceptable salt thereof.

(Item A5)

The method according to any one of items A1-A4, wherein the WT1 peptide or the analog thereof is the compound of formula (2):

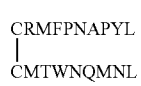

(2)

CRMFPNAPYL
|
CMTWNQMNL (wherein C-C shown in the formula means that the C residues are linked together by a disulfide bond),
or a pharmaceutically acceptable salt thereof.

(Item A6)

The method according to any one of items A1-A5, wherein the WT1 peptide or the analog thereof is the compound of formula (3):

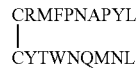

(3)

CRMFPNAPYL
|
CYTWNQMNL (wherein C-C shown in the formula means that the C residues are linked together by a disulfide bond),
or a pharmaceutically acceptable salt thereof.

(Item A7)

The method according to any one of items A1-A6, wherein the WT1 peptide or the analog thereof is a composition further comprising at least one peptide consisting of an amino acid sequence selected from the group consisting of
WAPVLDFAPPGSAYGSL (SEQ ID NO: 4),
CWAPVLDFAPPGASAYGSL (SEQ ID NO: 50) and
WAPVLDEAPPGASAYGSLC (SEQ ID NO: 51),
or a pharmaceutically acceptable salt thereof.

(Item A8)

The method according to any one of items A1-A7, wherein the WT1 peptide or the analog thereof is a composition comprising the compound of formula (2):

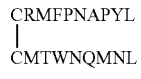

(2)

CRMFPNAPYL
|
CMTWNQMNL (wherein C-C shown in the formula means that the C residues are linked together by 8 disulfide bond) or a pharmaceutically acceptable salt thereof, and
a peptide consisting of the amino acid sequence: WAPVLDFAPPGSAYGSL (SEQ ID NO: 4) or a pharmaceutically acceptable salt thereof.

(Item A9)

The method according to any one of items A1-A8, wherein the WT1 peptide or the analog thereof is a composition comprising the compound of formula (3):

(3)

CRMFPNAPYL
|
CYTWNQMNL (wherein C-C shown in the formula means that the C residues are linked together by a disulfide bond) or a pharmaceutically acceptable salt thereof, and
a peptide consisting of the amino acid sequence: WAPVLDFAPPGSAYGSL (SEQ ID NO: 4) or a pharmaceutically acceptable salt thereof.

(Item A10)

A method of preventing or treating a benign tumor in a subject, comprising administering to the subject effective amount of a nucleic acid molecule encoding a WT1 peptide or an analog thereof.

(Item A11)

The method according to any one of items A1 to A10, wherein the nucleic acid molecule includes RNA and/or DNA.

(Item A12)

The method according to any one of items A1 to A11, wherein the WT1 peptide or the analog thereof, or the nucleic acid molecule encoding a WT1 peptide or an analog thereof, is used in combination with an adjuvant.

(Item A13)

The method according to any one of items A1 to A12, wherein the adjuvant is Montanide® ISA51 adjuvant.

(Item A14)

The method according to any one of items A1 to A13, wherein the benign tumor expresses WT1.

(Item A15)

The method according to any one of items A1 to A14, wherein tumor the benign is selected from the group consisting of familial adenomatous polyposis, non-hereditary colorectal adenoma, intraductal papillary mucinous neoplasm, meningioma, schwannoma, epithelial adenoma £ an organ, papilloma, non-epithelial myoma, lipoma, chondroma, and hemangioma.

(Item A16)

The method according to any one of items A1 to A15, wherein the benign tumor is familial adenomatous polyposis.

(Item A17)

The method according to any one of items A1 to A16, wherein the WT1 peptide or the analog thereof, or the nucleic acid molecule encoding a WT1 peptide or an analog thereof, is administered once a week.

(Item A18)

A method of preventing or treating a benign tumor in a subject, comprising culturing peripheral blood mononuclear cells from a subject in need of treatment for a benign tumor in the presence of the WT1 peptide or the analog thereof according to any one of the preceding items or introducing the nucleic acid molecule encoding a WT1 peptide or an analog thereof according to any one of the preceding items into peripheral blood mononuclear cells from a subject in need of treatment for a benign tumor, and thereby inducing WT1-specific cytotoxic T cells (CTLs) and/or e WT1-specific helper T cells from the peripheral blood mononuclear cells, and administering to the subject the WT1-specific CTLs and/or WT1-specific helper T cells thus prepared.

A method of preventing or treating a benign tumor in a subject, comprising
culturing immature dendritic cells from a subject in need of treatment for a benign tumor in the presence of the WT1 peptide or the analog thereof according to any one of the preceding items or introducing the nucleic acid molecule encoding a WT1 peptide or an analog thereof according to any one of the preceding items into immature dendritic cells from a subject in need of treatment for a benign tumor, and thereby inducing WT1-presenting dendritic cells, and administering to the subject the WT1-presenting dendritic cells thus prepared.

(Item A19A)

The method according to item A18 or A19, further comprising one or more features according to any one or more of items A1 to A17.

(Item A20)

A method of preventing or treating a benign tumor in a subject, comprising administering to the subject an effective amount of WT1-specific CTLs and/or WT1-specific helper T cells induced by a WT1 peptide or an analog thereof, or a nucleic acid molecule encoding a WT1 peptide or an analog thereof.

(Item A21)

A method of preventing or treating a benign tumor in a subject, comprising administering to the subject an effective amount of WT1-presenting dendritic cells induced by a WT1 peptide or an analog thereof, or a nucleic acid molecule encoding a WT1 peptide or an analog thereof.

(Item A21A)

The composition according to item A20 or A21, further comprising one or more features according to any one or more of items A1 to A19.

(Item A22)

A method of preventing or treating a benign tumor in a subject, comprising administering to the subject an effective amount of WT1-specific CTLs and/or WT1-specific helper T cells (Item A23)

A method of preventing or treating a benign tumor in a subject, comprising administering to the subject an effective amount of WT1-presenting dendritic cells.

(Item A23A)

The composition according to item A22 or A23, further comprising one or more features according to any one or more of items A1 to A19.

(Item B1)

A WT1 peptide or an analog thereof for preventing or treating a benign tumor.

(Item B2)

The WT1 peptide or the analog thereof according to item B1, wherein the WT1 peptide or the analog thereof includes a killer type peptide and/or a helper type peptide.

(Item B3)

The WT1 peptide or the analog thereof according to item B1 or B2, wherein the WT1 peptide or the analog thereof includes $WT1_{125}$ killer peptide, $WT1_{235}$ killer peptide, and/or $WT1_{35}$ helper peptide, or a peptide comprising an amino acid sequence that differs from the amino acid sequence of any one of the $WT1_{126}$ killer peptide, $WT1_{235}$ killer peptide, and $WT1_{35}$ helper peptide in that one to several amino acids are deleted, substituted, and/or added and having CTL-inducing activity.

(Item B4)

The WT1 peptide or the analog thereof according to any one of items B1 to B3, wherein the WT1 peptide or the analog thereof is a peptide consisting of an amino acid sequence selected from
RMFPNAPYL (SEQ ID NO: 2),
RYFPNAPYL (SEQ ID NO: 46),
YMFPNAPYL (SEQ ID NO: 14),
CYTWNOMNL (SEQ ID NO: 45),
CMTWNQMNL (SEQ ID NO: 3),
C-CYTWNOMNL (SEQ ID NO: 47) (wherein C-C shown in the formula means that the C residues are linked together by a disulfide bond), and
C-CMTWNQMNL (SEQ ID NO: 48) (wherein C-C shown in the formula means that the C residues are linked together by a disulfide bond),
or a pharmaceutically acceptable salt thereof.

(Item B5)

The WT1 peptide or the analog thereof according to any one of items B1 to B4, wherein the WT1 peptide or the analog thereof is the compound of formula (2);

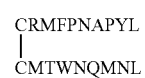

(2)

(wherein C-C shown in the formula means that the C residues are linked together by a disulfide bond),
or a pharmaceutically acceptable salt thereof.

(Item B6)

The WT1 peptide or the analog thereof according to any one of items B1 to B5, wherein the WT1 peptide or the analog thereof is the compound of formula (3):

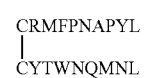

(3)

(wherein C-C shown in the formula means that the C residues are linked together by a disulfide bond),
or a pharmaceutically acceptable salt thereof.

(Item B7)

The WT1 peptide or the analog thereof according to any one of items B1 to B6, wherein the WT1 peptide or the analog thereof is a composition further comprising at least one peptide consisting of an amino acid sequence selected from the group consisting of
WAPVLDFAPPGASAYGSL (SEQ ID NO: 4);
CWAPVIDFARESAAYGEL (SEQ ID NO: 50) and
WAPVLDFAPPGASAYGSLC (SEQ ID NO: 51),
or a pharmaceutically acceptable salt thereof.

(Item B8)

The WT1 peptide or the analog thereof according to any one of items B1 to B7, wherein the WT1 peptide or the analog thereof is a composition comprising the compound of formula (2):

$$\begin{array}{c} \text{CRMFPNAPYL} \\ | \\ \text{CMTWNQMNL} \end{array} \quad (2)$$

(wherein C-C shown in the formula means that the C residues linked together by a disulfide bond) or a pharmaceutically acceptable salt thereof, and
a peptide consisting of the amino acid sequence: WAPVLDFAPPGASAYGSL (SEQ ID NO: 4) or a pharmaceutically acceptable salt thereof.

(Item B9)

The WT1 peptide or the analog thereof according to any one of items B1 to B8, wherein the WT1 peptide or the analog thereof is a composition comprising the compound of formula (3):

$$\begin{array}{c} \text{CRMFPNAPYL} \\ | \\ \text{CYTWNQMNL} \end{array} \quad (3)$$

(wherein C-C shown in the formula means that the C residues are linked together by disulfide bond) or a pharmaceutically acceptable salt thereof, and
a peptide consisting of the amino acid sequence: WAPVLDFAPPGASAYGSL (SEQ ID NO: 4) or a pharmaceutically acceptable salt thereof.

(Item B10)

A nucleic acid molecule encoding a WT1 peptide or an analog thereof for preventing or treating a benign tumor in a subject.

(Item B11)

The nucleic acid molecule according to any one of items B1 to B10, wherein the nucleic acid molecule includes RNA and/or DNA.

(Item B12)

The WT1 peptide or the analog thereof, or the nucleic acid molecule according to any one of items B1 to B11, which is used in combination with an adjuvant.

(Item B13)

The WT1 peptide or the analog thereof, or the nucleic acid molecule according to any one of items B1 to B12, wherein the adjuvant is Montanide® ISA51 adjuvant.

(Item B14)

The WT1 peptide or the analog thereof, or the nucleic acid molecule according to any one of items B1 to B13, wherein the benign tumor expresses WT1.

(Item B15)

The WT1 peptide or the analog thereof, or the nucleic acid molecule according to any one of items B1 to B14, wherein the benign tumor selected the is from group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.

(Item B16)

The WT1 peptide or the analog thereof, or the nucleic acid molecule according to any one of items B1 to B15, wherein the benign tumor is familial adenomatous polyposis.

(Item B17)

The WT1 peptide or the analog thereof, or the nucleic acid molecule according to any one of items B1 to B16, which is to be administered once a week.

(Item B18)

The WT1 peptide or the analog thereof according to any one of the preceding items, or the nucleic acid molecule according to any one of the preceding items, for inducing WT1-specific CTLs and/or WT1-specific helper T cells for use in preventing or treating a benign tumor, wherein the WT1 peptide or the analog thereof is cultured with peripheral blood mononuclear cells from a subject in need of treatment for a benign tumor, or the nucleic acid molecule is introduced into peripheral blood mononuclear cells from a subject in need of treatment for a benign tumor, and thereby WT1-specific CTLs and/or WT1-specific helper T cells are induced.

(Item B19)

The WT1 peptide or the analog thereof according to any one of the preceding items, or the nucleic acid molecule according to any one of the preceding items, for inducing WT1-presenting dendritic cells for use in preventing or treating a benign tumor, wherein the WT1 peptide or the analog thereof is cultured with immature dendritic cells from a subject in need of treatment for a benign tumor, or the nucleic acid molecule is introduced into immature dendritic cells from a subject in need of treatment for a benign tumor, and thereby WT1-presenting dendritic cells are induced.

(Item B19A)

The method according to item B18 or B19, further comprising one or more features according to any one or more of items B1 to B17.

(Item B20)

A WT1 peptide or an analog thereof, or a nucleic acid molecule encoding a WT1 peptide or an analog thereof, for inducing WT1-specific CTLs and/or WT1-specific helper T cells, wherein the WT1 peptide or the analog thereof or the nucleic acid molecule is for use in preventing or treating a benign tumor.

(Item B21)

A WT1 peptide or an analog thereof, or a nucleic acid molecule encoding a WT1 peptide or an analog thereof, for inducing WT1-presenting dendritic cells, wherein the WT1 peptide or the analog thereof or the nucleic acid molecule is for use in preventing or treating a benign tumor.

(Item B21A)

The composition according to item B20 or B21, further comprising one or more features according to any one or more of items B1 to B19.

(Item B22)

A WII-specific CTL and/or WT1-specific helper T cell for preventing or treating a benign tumor in a subject.

(Item B23)

A WT1-presenting dendritic cell for preventing or treating a benign tumor in a subject.

(Item B23A)

The composition according to item B22 or B23, further comprising one or more features according to any one or more of items B1 to B19.

(Item C1)

Use of a WT1 peptide or an analog thereof in the manufacture of a composition for preventing or treating a benign tumor.

(Item C2)

The use according to item C1, wherein the WT1 peptide or the analog thereof includes a killer type peptide and/or a helper type peptide.

(Item C3)

The use according to item C1 or C2, wherein the WII peptide or the analog thereof includes $WT1_{120}$ killer peptide, $WT1_{235}$ killer peptide, and/or $WT1_{35}$ helper peptide, or a peptide comprising an amino acid sequence that differs from the amino acid sequence of any one of the WT1$_{126}$ killer peptide, WT1$_{235}$ killer peptide, and WT1$_{35}$ helper peptide in that one to several amino acids are deleted, substituted, and/or added and having CTL-inducing activity.
(Item C4)

The use according to any one of items C1-C3, wherein the WT1 peptide or the analog thereof is a peptide consisting of an amino acid sequence selected from RMFPNAPYL (SEQ ID NO: 2),
RYFPNAPYL (SEQ ID NO: 46),
YMFPNAPYL (SEQ ID NO: 14),
CYTWNQMNL (SEQ ID NO: 45),
CMTWNOMNL (SEQ ID NO: 3),
C-CYTWNQMNL (SEQ ID NO: 47) (wherein C-C shown in the formula means that the C residues are linked together by a disulfide bond), and
C-CMTWNQMNL (SEQ ID NO; 48) (wherein C-C shown in the formula means that the C residues are linked together by a disulfide bond),
or a pharmaceutically acceptable salt thereof.
(Item C5)

The use according to any one of items C1-C4, wherein the WT1 peptide or the analog thereof is the compound of formula (2):

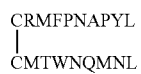

(2)

CRMFPNAPYL
|
CMTWNQMNL (wherein C-C shown in the formula means that the C residues are linked together by a disulfide bond),
or a pharmaceutically acceptable salt thereof.
(Item C6)

The use according to any one of items C1-C5, wherein the WT1 peptide or the analog thereof is the compound of formula (3):

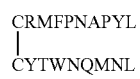

(3)

CRMFPNAPYL
|
CYTWNQMNL (wherein C-C shown in the formula means that the C residues are linked together by a disulfide bond),
or a pharmaceutically acceptable salt thereof.
(Item C7)

The use according to any one of items C1-C6, wherein the WT1 peptide or the analog thereof is a composition further comprising at least one peptide consisting of an amino acid sequence selected from the group consisting of WAPVLDFAPPGASAYGSL (SEQ ID NO: 4),
CWAPVLDFAPPGASAYGSL (SEQ ID NO: 50) and
WAPVLDFAPPSAYGSLC (SEQ ID NO: 51),
or a pharmaceutically acceptable salt thereof.
(Item C8)

The use according to any one of items C1-C7, wherein the WT1 peptide or the analog thereof is a composition comprising the compound of formula (2):

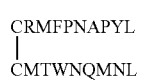

(2)

CRMFPNAPYL
|
CMTWNQMNL (wherein C-C shown in the formula means that the C residues are linked together by a disulfide bond) or a pharmaceutically acceptable salt thereof, and a peptide consisting of the amino acid sequence: WAPVLDFAPPGASAYGSL (SEQ ID NO: 4) or a pharmaceutically acceptable salt thereof.
(Item C9)

The use according to any one of items C1-C8, wherein the WT1 peptide or the analog thereof is a composition comprising the compound of formula (3):

(3)

CRMFPNAPYL
|
CYTWNQMNL (where in C-C shown in the formula means that the C residues are linked together by disulfide bond) pharmaceutically acceptable salt thereof, and a peptide consisting of the amino acid sequence: WAPVLDEAPPGASAYGSL (SEQ ID NO: 4) or a pharmaceutically acceptable salt thereof.
(Item C10)

Use of a nucleic acid molecule encoding a WT1 peptide or an analog thereof in the manufacture of a composition for preventing or treating a benign tumor.
(Item C11)

The use according to any one of items C1 to C10, wherein the nucleic acid molecule includes RNA and/or DNA.
(Item C12)

The use according to any one of items C1 to C11, wherein the WT1 peptide or the analog thereof, or the nucleic acid molecule is used in combination with an adjuvant.
(Item C13)

The use according to any one of items C1 to C12, wherein the adjuvant is Montanide® ISA51 adjuvant.
(Item C14)

The use according to any one of items C1 to C13, wherein the benign tumor expresses WT1.
(Item C15)

The use according to any one of items C1 to C14, wherein the benign tumor is selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.
(Item C16)

The use according to any one of items C1 to C15, wherein the benign tumor is familial adenomatous polyposis.
(Item C17)

The use according to any one of items C1 to C16, wherein the WT1 peptide or the analog thereof, or the nucleic acid molecule encoding a WT1 peptide or an analog thereof, is to be administered once a week.
(Item C18)

Use of the WT1 peptide or the analog thereof according to any one of the preceding items, or the nucleic acid molecule according to any one of the preceding items, for inducing WT1-specific CTLs and/or WT1-specific helper T cells for use in preventing or treating a benign tumor, wherein the WT1 peptide or the analog thereof is cultured with peripheral blood mononuclear cells from a subject in need of treatment for a benign tumor, or the nucleic acid molecule is introduced into peripheral blood mononuclear cells from a subject in need of treatment for a benign tumor, and thereby WT1-specific CTLs and/or WT1-specific helper T cells are induced.
(Item C19)
Use of the WT1 peptide or the analog thereof according to any one of the preceding items, or the nucleic acid molecule according to any one of the preceding items, for inducing WII-presenting cells dendritic for use in preventing or treating a benign tumor, wherein the WT1 peptide or the analog thereof is cultured with immature dendritic cells from a subject in need of treatment for a benign tumor, or the nucleic acid molecule is introduced into immature dendritic cells from a subject in need of treatment for a benign tumor, and thereby WT1-presenting dendritic cells are induced.
(Item C19A)
The method according to item C18 or C19, further comprising one or more features according to any one or more of items C1 to C17.
(Item C20)
Use of a WT1 peptide or an analog, or a nucleic acid molecule encoding a WT1 peptide or an analog, in the manufacture of WT1-specific CTLs and/or WT1-specific helper T cells for use in preventing or treating a benign tumor.
(Item C21)
Use of a WT1 peptide or an analog, or a nucleic acid molecule encoding a WT1 peptide or an analog, in the manufacture of WT1-presenting dendritic cells for use in preventing or treating a benign tumor.
(Item C21A)
The composition according to item C20 or C21, further comprising one or more features according to any one or more of items C1 to C19.
(Item C22)
Use of WT1-specific CTLs and/or WT1-specific helper T cells in the manufacture of a composition for preventing or treating for a benign tumor.
(Item C23)
Use of WT1-presenting dendritic cells in the manufacture of a composition for preventing or treating for benign tumor.
(Item C23A)
The composition according to item C22 or C23, further comprising one or more features according to any one or more of items C1 to C19.

The present disclosure intends that the above one of more features may be combined with any of the specific combinations described herein. Further embodiments and advantages of the present disclosure will be appreciated by those skilled in the art upon reading and understanding the following detailed description as necessary.

Effect of Invention

According to the present invention, prevention, delay and treatment of benign tumors are achieved. In exemplary embodiments, the present invention achieves prevention, delay and treatment of familial adenomatous polyposis. In another aspect, the invention achieves prevention, delay and treatment of symptoms resulting from adenomas of benign tumors (e.g. familial adenomatous polyposis).

Furthermore, the WT1 peptide cancer vaccine of the present disclosure has no serious side effects other than redness and swelling of the skin at the administration site, and is extremely safe. Therefore, the WT1 peptide cancer vaccine can be safely and easily administered to most benign tumor patients and familial adenomatous polyposis patients, and from the viewpoint of patient QOL, avoiding endoscopic resection and surgery. It can be said that it is superior to the conventional technology from the viewpoint of the economic effect of reducing medical expenses.

DETAILED DESCRIPTION OF EMBODIMENTS

Figure 1:
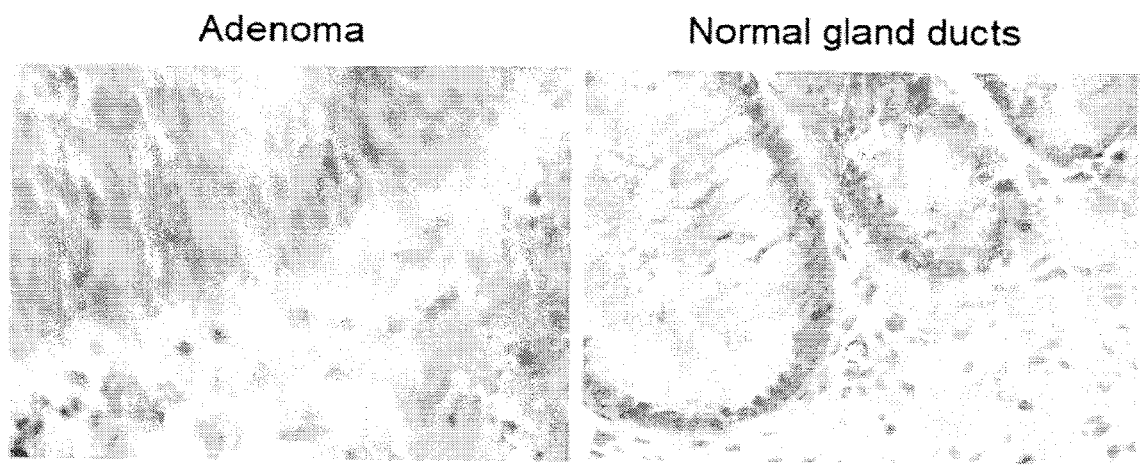
FIG. 1 shows micrographs showing the expression of WT1 protein in adenoma of a human familial adenomatous polyposis patient. The photograph on the left is the one of adenoma tissue, and the photograph on the right is the one of normal gland ducts. In both photographs, the light staining indicates WT1 protein and the dark circular stained regions indicate nuclei.

The present invention will be described hereinafter with its best mode, Throughout the specification, it should be understood that an expression in a singular form includes its plural form, unless otherwise stated. Therefore, it should be understood that a singular article (e.g., "an", or "the" in English) also includes its plural form, unless otherwise stated. It should also be understood that the terms used herein are used in the meanings commonly used in the art unless otherwise stated. Thus, unless otherwise defined, all terminology and scientific terms used herein have the same meaning as commonly understood by those skilled in the art to which this invention belongs. In case of conflict, this specification (comprising definitions) takes precedence.

The definitions of terms and/or basic technical contents particularly used in the present specification will be described below as appropriate.

Definition of Terms

In the present specification, "WT1 (Wilms Tumor Gene 1)", "WT1 protein" or "WT1 peptide" means a polypeptide comprising at least a part (or all) of the Wilms tumor (WT1) gene product or its analogs. Specifically, the "WT1 protein" is preferably typically a human WT1 protein (SEQ ID NO: 1) consisting of 449 amino acids, or a protein consisting of an amino acid sequence that differs from the amino acid sequence of SEQ ID NO: 1 in that one to several (preferably about two to six) amino acids are deleted, substituted, and/or added. The amino acid to be inserted or replaced may be an unnatural amino acid that are not included in the 20 amino acids encoded by genes. The "WT1 peptide" refers to a peptide consisting of a part of the amino acid sequence constituting a WT1 protein. In the present specification, the term "WT1" or "WT1 peptide" shall include the mutant WT1 unless otherwise specified. Also, when "WI1" or "WT1 peptide" is referred to in the present specification, the "WT1" refers to human WT1 unless otherwise specified.

The length of the WT1 peptide used in the present disclosure is not particularly limited to, but preferably, about 7 to about 30 amino acids, A preferred WT1 peptide has a specific pattern of sequence (motif) to be an antigen peptide binding to and presented by an HLA molecule, and has the ability to bind to the HLA molecule. The ability to bind to HLA molecules can be investigated by methods known in the art. Such methods include, for example, computer-based methods such as Rankpep, and BIMAS, SYFPEITHI, and competitive binding tests with known WT1 peptides capable of binding to HLA molecules. WT1 peptides that can be used in the present disclosure are herein described in the section "WT1 peptide", and also in WO2016/093326, which are incorporated herein by reference.

A preferred WT1 peptide used in the present disclosure is a peptide that activates killer T cells and/or helper T cells, Activation of killer T cells and/or helper T cells can be carried out by a single type of peptide or multiple types of peptides (each of which may be specialized to activation of killer or helper T cells). Also, the WT1 peptide used in the pharmaceutical composition of the present disclosure may be a single type of peptide or may include multiple types of peptides. Further, the WT1 peptide used in the medicament or the pharmaceutical composition of the present disclosure may be a killer WT1 peptide or a helper WT1 peptide, or a mixture of these peptides. The WT1 peptide of the present disclosure may be a single peptide or a conjugate, mixture or combination of multiple peptides. More preferred WT1 peptides may include combinations of a killer WT1 peptide and a helper WT1 peptide. Examples of such combinations include the compounds or compositions described in WO2014/157692.

As used herein, a "benign tumor" is a tumor that has no pathologically malignant findings and is understood to be different from a malignant tumor. It is said that a benign tumor does not show metastasis or infiltration tendency. Diagnosis as a benign tumor does not necessarily mean a good clinical prognosis. For example, a low-grade meningioma that develops in the brain stem is a benign tumor, but it is difficult to treat, and it is clinically malignant because it compresses the brain stem and shows a poor prognosis, and thus often requires treatment or prevention. Benign tumors include, but not limited to, familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.

As used herein, the terms "familial adenomatous polyposis", "familial polyposis coli", "familial adenomatous polyposis coli" and "FAP" are used interchangeably, and mean a hereditary disease characterized by mutation of a tumor suppressor gens APC (adenoma polyposis coli) and a large number of adenomas formed in the intestinal tract and it is classified as a benign tumor. As used herein, familial adenomatous polyposis also includes diseases that coincide with tumors in tissues other than the intestinal tract, such as Gardner's syndrome. Typical familial adenomatous polyposis model animals include, but are not limited to, APC$^{Min/+}$ mice (Jackson Institute, Bar Harbor, Maine, USA).

As used herein, the term such as "killer type" or "killer peptide" means that the peptide has an ability to activate cytotoxic T cells (CTLs, killer T cells). Activation of killer T cells means that the cytotoxic activity of killer T cells is increased and/or the number of killer T cells is increased, Whether a peptide is a "killer (type)" peptide is typically determined by a test described hereinafter. That is, it can be determined by detecting CD8 on the surface of T cells by a method such as flow cytometry. Alternatively, it can be determined by measuring the cytotoxic activity against a target by a method such as $^{51}$Cr release assay or lactate dehydrogenase (LDH) assay. In a preferred embodiment, the WT1 peptide of the present disclosure has this killer type of activity.

MHC is called as human leukocyte antigen (HLA) in humans. HLAS corresponding to MHC class I molecules are classified into subtypes such as HLA-A, B, Cw, E and G. The term "MHC class I-restricted" preferably includes "HLA-A-restricted", "HLA-B-restricted" and "HLA-Cw-restricted".

Polymorphisms (alleles) are known for each HLA subtype. Examples of HLA-A polymorphisms include 27 or more types such as HLA-A1, HLA-A0201 and HLA-A24, those of HLA-B polymorphisms include 59 or more types such as HLA-B7, HLA-B40 and HLA-B4403, and those of HLA-Cw polymorphisms include 10 or more types such as HLA-Cw0301, HLA-Cw0401, and HLA-Cw0602. Among these polymorphisms, HLA-A0201 and HLA-A24 are preferable.

The "WT1 peptide" in the present disclosure is a partial peptide consisting of 7 to 30 consecutive amino acids in the amino acid sequence of human WT1 set forth in SEQ ID NO: 1.

As used herein, the term "MHC class I-restricted" means an ability a of peptide to bind to an MHC (major histocompatibility complex) class I molecule and induce CTLs. An "MRC class I-restricted WT1 peptide" is a peptide being capable of binding to an MHC class I molecule to be presented in a form of a complex and inducing CTLs from precursor T cells that recognize the complex in vitro and/or in vivo, and thus it is synonymous with a "WT1 helper peptide". The number of amino acid residues of the "WT1 class I-restricted WT1 peptide" is 7 to 30, preferably 7 to 15, more preferably 8 to 12, still more preferably 8 to 11, and most preferably 8 or 9.

Examples of the "MHC class I-restricted WT1 peptide" include a peptide of 9 amino acid residues that starts at position 2, 3, 4, 6, 7, 10, 17, 18, 20, 23, 24, 26, 29, 30, 32, 33, 37, 38, 39, 40, 47, 63, 64, 65, 70, 73, 80, 81, 82, 83, 84, 85, 86, 88, 92, 93, 96, 98, 99, 100, 101, 104, 107, 110, 118, 119, 120, 123, 125, 126, 128, 130, 136, 137, 138, 139, 141, 143, 144, 146, 152, 161, 163, 165, 168, 169, 174, 177, 179, 180, 185, 187, 191, 192, 194, 202, 204, 206, 207, 208, 209, 210, 211, 213, 217, 218, 219, 221, 222, 223, 225, 227, 228, 230, 232, 233, 235, 239, 240, 242, 243, 244, 250, 251, 252, 260, 261, 263, 269, 270, 272, 273, 276, 278, 279, 280, 285, 286, 287, 289, 292, 293, 294, 295, 298, 299, 301, 302, 303, 306, 309, 312, 313, 315, 316, 317, 318, 319, 324, 325, 326, 327, 329, 332, 334, 337, 340, 343, 345, 347, 349, 351, 354, 356, 358, 362, 363, 364, 366, 368, 371, 372, 373, 375, 379, 383, 384, 386, 387, 389, 390, 391, 394, 396, 401, 406, 408, 409, 410, 412, 415, 416, 417, 418, 419, 420, 423, 424, 425, 426, 427, 428, 429, 432, 433, 434, 436, 437, 439, 440, or 441 of the amino acid sequence of human WT1 as shown in SEQ ID NO: 1, or a peptide comprising a variant thereof (see WO2014/157692). The publication WO2014/157692 is herein incorporated by reference in its entity.

The "MHC class I-restricted WT1 peptide" may preferably be a peptide comprising an amino acid sequence selected from:

RMFPNAPYL, (SEQ ID NO: 2)

CMTWNQMNL, (SEQ ID NO: 3)

ALLPAVPSL, (SEQ ID NO: 52)

SLGEQQYSV, (SEQ ID NO: 53)
and

RVPGVAPTL (SEQ ID NO: 54)

or a peptide comprising an altered amino acid sequence that differs from the amino acid sequence selected from SEQ ID NOS: 2, 3, 52, 53, and 54 by amino acid alteration and having CTL-inducing activity, More preferably, the peptide may be a peptide consisting of an amino acid sequence selected from SEQ ID NOS: 2, 3, 52, 53, and 54.

When "a WT1 peptide or an analog thereof" in the present disclosure is a killer peptide, the peptide comprising an altered amino acid sequence that differs from a given amino acid sequence by amino acid alteration has CTL-inducing activity.

The peptide comprising an altered amino acid sequence that differs from a given amino acid sequence by amino acid alteration and having CTL-inducing activity in the present disclosure is also referred to as an "altered killer peptide". The altered killer peptide is a peptide consisting of an amino acid sequence that differs from a given amino acid sequence in that one to three amino acids are deleted, substituted, and/or added, and being capable of binding to an MAC class I to induce CTLs. The amino acid substitution may be at position 1 (the N-terminus), 2, 3 or 9 when the peptide consists of an amino acid sequence of 9 residues. The number of amino acid addition (which includes insertion) is usually 1 to several, preferably 1 to 3, more preferably 1 or 2, and even more preferably 1. Preferred positions for amino acid addition include the C-terminus. The number of amino acid deletion is preferably 1. In such alterations, the amino acid for addition or substitution may be an unnatural amino acid that is different from the 20 amino acids encoded by genes.

Examples of the altered killer peptides include the following peptides:

as an altered killer peptide of RMFPNAPYL (SEQ ID NO: 2),
RYFPNAPYL (SEQ ID NO: 46) (WO2003/106682),
FMFPNAPYL (SEQ ID NO: 13),
RLFPNAPYL (SEQ ID NO: 18),
RMMPNAPYL (SEQ ID NO: 25),
RMFPNAPXV (SEQ ID NO: 28) or
YMFPNAPYL (SEQ ID NO: 14) (WO2009/072610);
as an altered killer peptide of CMTWNOMNL (SEQ ID NO: 3),
CYTWNOMNL (SEQ ID NO: 45) (WO2002/79253),
Xaa-Met-Thr-Trp-Asn-Gln-Met-Asn-Leu (SEQ ID NO: 55)
(wherein Xaa is Ser or Ala) or
Xaa-Tyr-Thr-Trp-Asn-Gla-Met-Asn-Len (SEQ ID NO: 56)
(wherein Xaa is Ser, Ala, Abu, Arg, Lys, Orn, Cit, Leu, Phe or Asn) (WO2004/026897);
as an altered killer peptide of ALLPAVPSL (SBQ ID NO: 52), AYLPAVPSL (SEQ ID NO: 57) (WO2003/106682);
as an altered killer peptide of SLGEQQYSV (SEQ ID NO: 53),
FLGEQQYSV (SEQ ID NO: 58),
SMGEQQYSV (SEQ ID NO: 59), or
SLMEQOYSV (SEQ ID NO: 60) (WO 2009/072610); and
as an altered killer peptide of RVPGVAPTL (SEQ ID NO: 54), RYPGVAPTL (SEQ ID NO: 61) (WO2003/106682).

Examples of amino acid sequences of peptides that are not partial peptides consisting of continuous 8-35 amino acid residues in the amino acid sequence of human WT1 shown in SEQ ID NO: 1 include the following amino acid sequences (see WO2007/063903).

C-CYIWNOMNL (SEQ ID NO: 47) (wherein C-C shown in the formula means that the C residues are linked together by a disulfide bond) or C-CMIWNOMNL (SEQ ID NO: 48) (wherein C-C shown in the formula means that the C residues are linked together by a disulfide bond).

Examples of the altered killer peptides of the present disclosure also include multimeric peptides such as dimers as shown below (see WO2014/157692):

the compound of formula (2):

(wherein C-C shown in the formula means that the C residues are linked together by a disulfide bond), the compound of formula (3):

(wherein C-C shown in the formula means that the C residues are linked together by a disulfide bond), or the compound of formula (4):

(wherein C-C shown in the formula means that the C residues are linked together by a disulfide bond).

As used herein, the term such as "helper type" or "helper peptide" means that the peptide has an ability to activate helper T cells. Activation of helper T cells means that the function of helper T cells to assist an event such as antibody production from B cells or activation of killer T cells are increased, and/or the number of helper T cells is increased. Whether a peptide is a "helper (type)" peptide is typically determined by a test described hereinafter. That is, it can be determined by detecting CD4 on the surface of T cells by a method such as flow cytometry. Alternatively, it can be determined by stimulating target cells with an antigen and examining if an antigen-specific cytokine such as IFN-α or IFN-γ is produced by immunostaining.

As used herein, the term "MHC class II-restricted" means an ability of a peptide to bind to an MHC class II molecule and induces helper T cells.

HLAS corresponding to MHC class II molecules are classified into subtypes such as HLA-DR, DQ and DP. The term "MHC class II-restricted" preferably includes "HLA-DR-restricted, "HLA-DQ-restricted" and "HLA-DP-restricted".

Thus, an "MHC class II-restricted WT1 peptide" is a peptide being capable of binding to an MAC class II molecule and inducing helper T cells in vitro and/or in vivo. The number of amino acid residues of the "MHC class II-restricted WT1 peptide" is 7 to 30, preferably 14 to 30.

When "a WT1 peptide or an analog thereof" in the present disclosure is a helper peptide, the peptide comprising an altered amino acid sequence that differs from a given amino acid sequence by amino acid alteration has helper T cell-inducing activity.

The peptide comprising an altered amino acid sequence that differs from a given amino acid sequence by amino acid alteration and having helper T cell-inducing activity in the present disclosure is also referred to as an "altered helper peptide". The altered helper peptide is a peptide consisting of an amino acid sequence that differs from a given amino acid sequence in that one to three amino acids are deleted, substituted, and/or added, and being capable of binding to an MHC class II to induce helper T cells. The number of amino acid addition (which includes insertion) is preferably 1 to 3. The number of amino acid deletion is preferably 1 to 5. In such alterations, the amino acid for addition of substitution may be an unnatural amino acid that is different from the 20 amino acids encoded by genes.

Examples of the altered helper peptides include the following peptides:

as an altered helper peptide of SGQARMEPNAPYLP-SCLES (SEQ ID NO: 69), 25
SGOAYMFPNAPYLPSCLES (SEQ ID NO: 70) (WO2004/063217),
SGQARMFPNAPYLPSC (SEQ ID NO: 71) or
SGQAYMFPNAPYLPSC (SEQ ID NO: 72); or
PGCNKRYFKLSHLQMHSRK (SEQ ID NO: 49),
PGCNKRYFKLSHLOMHSRKH (SEO ID NO: 62),
CNKRYFKLSHLQMHSRK (SEQ ID NO: 64),
CNKRYFKLSHLOMHSRKH (SEQ ID NO: 65) or
CNKRYFKLSHLQMHSRKHTG (SEQ ID NO: 66); or
WAPVLDFAPPGASAYGSL (SEQ ID NO: 4),
CWAPVLDEAPPGASAYGSL (SEQ ID NO: 50) or
WAPVLDFAPPGASAYGSLC: (SEQ ID NO: 51).

The "WT1 peptide or an analog thereof" of the present disclosure may have both killer-type and helper-type activities in a composition of a killer peptide and a helper peptide. Examples having both killer-type and helper-type activities include the followings:

a composition comprising a compound selected from the compound of formula (2):

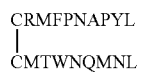

(2)

CRMFPNAPYL
|
CMTWNQMNL (wherein C-C shown in the formula means that the C residues are linked together by a disulfide bond), the compound of formula (3):

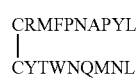

(3)

CRMFPNAPYL
|
CYTWNQMNL (wherein C-C shown in the formula means that the C residues are linked together by a disulfide bond), and the compound of formula (4):

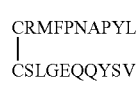

(4)

CRMFPNAPYL
|
CSLGEQQYSV (wherein C-C shown in the formula means that the C residues are linked together by a disulfide bond), or a pharmaceutically acceptable salt thereof, and
a peptide consisting of an amino acid sequence selected from the group consisting of

CNKRYFKLSHLQMHSRK, (SEQ ID NO: 63)

CNKRYFKLSHLQMHSRKH, (SEQ ID NO: 64)

CNKRYFKLSHLQMHSRKHTG, (SEQ ID NO: 65)

WAPVLDFAPPGASAYGSL, (SEQ ID NO: 4)

CWAPVLDFAPPGASAYGSL (SEQ ID NO: 50)
and

WAPVLDFAPPGASAYGSLC (SEQ ID NO: 51)

or a pharmaceutically acceptable salt thereof;
a composition comprising the compound of formula (2):

(2)

CRMFPNAPYL
|
CMTWNQMNL (wherein C-C shown in the formula means that the C residues are linked together by a disulfide bond) or a pharmaceutically acceptable salt thereof, and
a peptide consisting of the amino acid sequence of WAPVLDFAPPGASAYGSL (SEO ID NO: 4) or a pharmaceutically acceptable salt thereof; and
a composition comprising the compound of formula (3):

(3)

CRMFPNAPYL
|
CYTWNQMNL (wherein C-C shown in the formula means that the C residues are linked together by a disulfide bond) or pharmaceutically acceptable salt thereof, and
a peptide consisting of the amino acid sequence of WAPVLDFAPPGASAYGSL (SEQ ID NO: 4) or a pharmaceutically acceptable salt thereof.

As used herein, the term "adjuvant" means an aid to a main agent (e.g. the WT1 peptide in the present disclosure). In the present disclosure, an adjuvant refers to a substance that enhances or improves the immune response induced by a WT1 peptide in a therapeutic or prophylactic composition. In the present disclosure, the adjuvant may be, for example, a sedimentary adjuvant such as sodium hydroxide, aluminum hydroxide, calcium phosphate, aluminum phosphate, alum, Pepesu or carboxyvinyl polymer, or an oil adjuvant such as liquid paraffin, lanolin, Freund, Montanide ISA763AVG, Montanide ISA51, incomplete Freund's adjuvant, or complete Freund's adjuvant.

As used herein, the term "adenoma" refers to a polyp having a high risk of becoming cancerous. The term "polyp" is a general term for mushroom-like or wart-like elevated lesions formed on the inner wall of intestinal tissue such as small intestine, large intestine or rectum. Adenomas are neoplastic polyps and are at high risk of turning into cancers such as colorectal cancer.

Among adenomas, adenomas that develop in the large intestine are collectively called "colorectal adenoma". The colorectal adenoma include hereditary colorectal adenoma (e.g. familial adenomatous polyposis) and non-hereditary colorectal adenoma. The "non-hereditary colorectal adenoma" refers to a disease in which a large number of adenomas are formed in the intestinal tract due to factors such as lifestyle, diet, drinking, smoking, and stress, and it is not characterized by mutation in the APC gene and classified as a benign tumor.

As used herein, "treating" means stopping, preferably curing, the progression of a disease, disorder or symptom of interest in the present disclosure that has already developed. Evaluation of therapeutic effects can be done according to "New Guidelines to Evaluate the Response to Treatment in Solid Tumors" (RECIST) <http://www.jcog.jp/doctor/tool/C_150_0010.pdf> or the latest version thereof. The definition of best response based on WHO or RECIST criteria is as follows.

As used herein, the term "subject" refers to an objective for which the prevention or treatment of the present disclosure is intended (for example, an organism such as a human, or a substance taken from an organism such as cells, blood, or serum).

As used herein, the term "peripheral blood mononuclear cells" or "PBMCs" refers to mononuclear cells or monocytic cells containing monocytes or lymphocytes isolated from peripheral blood. Peripheral blood mononuclear cells include a variety of blood cells such as T cells, B cells, NK cells, monocytes and dendritic cells. By stimulation, peripheral blood mononuclear cells can be differentiated into cells such as cytotoxic T cells or helper T cells.

In the present specification, for example, WT1-specific cytotoxic T cells and helper T cells are referred to as "WT1-specific cytotoxic T cells" and "WT1-specific helper T cells" respectively. WT1-specific cytotoxic T cells and/or WT1-specific helper T cells can be induced by using the

TABLE 1

| Best response | WHO change in sum of products | RECIST change in sums longest diameters |
| --- | --- | --- |
| CR | Disappearance; confirmed at 4 wks† | Disappearance; confirmed at 4 wks† |
| PR | 50% decrease; confirmed at 4 wks† | 30% decrease; confirmed at 4 wks† |
| SD | Neither PR nor PD criteria met | Neither PR nor PD criteria met |
| PD | 25% increase; no CR, PR, or SD documented before increased disease | 20% increase; no CR, PR, or SD documented before increased disease |

WHO = World Health Organization,
RECIST = Response Evaluation Criteria in Solid Tumors,
CR = complete response,
PR = partial response,
SD = stable disease,
PD = progressive disease As used herein, the term "composition for treating" or "therapeutic composition (formulation)" broadly refers to any composition capable of treating a condition of interest (for example, a disease such as familial adenomatous polyposis). In one embodiment of the present disclosure, the be "therapeutic composition" may a pharmaceutical composition comprising an active ingredient and one or more pharmacologically acceptable carriers. The pharmaceutical composition can be produced, for example, by mixing an active ingredient with the above carrier and using any method known in the technical field of pharmaceutics. Also, the therapeutic composition is not limited in terms of the form of use as long as it is used for treatment, and may be an active ingredient alone or a mixture of an active ingredient and any other ingredient. The form of the carrier is not particularly limited, and may be, for example, a solid or liquid (for example, a buffer solution).

As used herein, "preventing" means not causing or at least delaying the disease, disorder or symptom of interest in the present disclosure by any means before it occurs, or even if the cause of the disease, disorder or symptom occurs, not causing any malfunction from the cause.

As used herein, the term "composition for preventing" or "prophylactic composition (formulation)" broadly refers to any composition capable of preventing a condition of interest (for example, a disease such as familial adenomatous polyposis).

As used herein, "improving" means stopping or alleviating the progression of the disease, disorder or symptom of interest in the present disclosure that has already occurred, completely or partially.

WT1 peptide or the analog thereof, or the nucleic acid molecule encoding the same, described in the present disclosure.

As used herein, the term "immature dendritic cell" refers to a dendritic cell capable of presenting a peptide or an antigen from a substance such as a cell when it is sensitized with the peptide or the substance. By stimulation, immature dendritic cells can be differentiated into cells such as dendritic cells that present a specific peptide.

In the present specification, for example, dendritic cells presenting WT1 are referred to as "WT1-presenting dendritic cells". WT1-presenting dendritic cells can be induced by using the WT1 peptide or the analog thereof, or the nucleic acid molecule encoding the same, described in the present disclosure.

Methods of inducing or activating antigen-presenting cells or killer T cells or helper T cells are known to those of skill in the art. In vivo, these cells can be induced or activated by administrating a WT1 peptide to a subject. In vitro, in one example, killer T cells may be obtained by reacting a sample containing lymphocytes derived from a subject with a complex of a WT1 peptide and an HLA molecule. In another example, peripheral blood mononuclear cells derived from a subject may be cultured in the presence of a WT1 peptide and WT1-specific CTLs may be induced from the peripheral blood mononuclear cells. In a further example, antigen-presenting cells that present a WT1 peptide via an HLA molecule may be induced by culturing immature antigen-presenting cells derived from a subject in the presence of the WT1 peptide. Immature antigen-presenting cells refer to cells that can mature to become antigen-presenting cells, and immature dendritic cells s are exemplified. In an alternative example, a WT1 peptide may be added to antigen-presenting cells to activate helper T cells. The antigen-presenting cells or killer T cells or helper T cells used in the medicament or composition of the present disclosure may be those induced or activated using any of the WT1 peptides or derivatives thereof or nucleic acid molecules. The antigen-presenting cells or killer T cells or helper T cells thus induced or activated can be administered to a subject, preferably a subject from which these cells have been obtained to treat or prevent a benign tumor (e.g. familial adenomatous polyposis).

The "analog", "derivative", "analogue" or "mutant" (such as that of a WT1 peptide) as used herein is preferably, but not limited to, a molecule that contains a region being substantially homologous to a protein of interest (such as a WT1 peptide). In various embodiments, such a molecule is at least 30%, 40%, 50%, 60%, 70%, 80%, 90%, 95% or 99% identical to an amino acid sequence of the same size aligned over the amino acid sequence, or to an amino acid sequence aligned by a computer homology program known in the art, or nucleic acid encoding such a molecule is capable of hybridizing to a sequence encoding the recited protein under (highly) stringent, moderately stringent, or non-stringent condition. They are obtained by altering a protein by amino acid substitution, deletion or addition, and such derivatives still exhibit the biological function of the original protein, although not necessarily to the same degree. For example, it is possible to examine the biological function of such proteins by appropriate and available in vitro assays described herein or known in the art. In the present specification, the term "functionally active" or "having the functional activity" as used herein with regard to embodiments relating to the polypeptide or fragment of derivative of the present disclosure means that the polypeptide or fragment or derivative has the structural function, regulatory function, or biochemical function, such as biological activity, of a protein.

In the present disclosure, a fragment of a WT1 peptide is a polypeptide containing a region of the WT1 peptide, and as long as it functions in an object of the present disclosure (for example, a peptide vaccine), it does not necessarily have all the biological functions of the natural WT1 peptide.

As used herein, "protein", "polypeptide", "oligopeptide" and "peptide" are used interchangeably herein to refer to a polymer of amino acids of any length. The polymer may be linear, branched or cyclic. The amino acid may be natural or non-natural, or may be a modified amino acid. The term may also include those assembled into a complex of multiple polypeptide chains. The term also includes naturally or artificially modified amino acid polymers. Such modifications include, for example, disulfide bond formation, glycosylation, lipidation, acetylation, phosphorylation or any other manipulation or modification (e.g. conjugation with a labeling component). The definition also includes, for example, polypeptides containing one or more analogs of amino acids (for example, containing unnatural amino acids), peptide-like compounds (e.g. peptoids) and other modifications known in the art. In the present specification, "amino acid" is a general term for organic compounds having an amino group and a carboxyl group. When a protein or enzyme according to an embodiment of the present disclosure contains "a specific amino acid sequence", any amino acid in the amino acid sequence may be chemically modified. Also, any amino acid in the amino acid sequence may form a salt or a solvate. Further, any amino acid in the amino acid sequence may be L-type or D-type. Even in such cases, the protein according to the embodiment of the present disclosure is said to contain the above-mentioned "specific amino acid sequence". Chemical modifications that amino acids contained in proteins undergo in vivo include, for example, N-terminal modifications (e.g. acetylation and myristoylation), C-terminal modifications (e.g. amidation and addition of glycosylphosphatidylinositol), and side chain modifications (e.g. phosphorylation and glycosylation). Amino acids may be natural or non-natural as long as they meet an object of the present disclosure.

As used herein, "polynucleotide", "oligonucleotide" and "nucleic acid" are used interchangeably herein to refer to a polymer of nucleotides of any length. The term also includes "oligonucleotide derivative" or "polynucleotide derivative" The "oligonucleotide derivative" or "polynucleotide derivative" refers to an oligonucleotide or polynucleotide containing a derivative of a nucleotide or having an unusual bond between nucleotides, and these terms are used interchangeably. Specifically, as such an oligonucleotide, for example, 2'-O-methyl-ribonucleotide, an oligonucleotide derivative in which a phosphate diester bond in an oligonucleotide is converted into a phosphorothioate bond, and an oligonucleotide derivative in which a phosphate diester bond in an oligonucleotide is converted into N3'-P5'phosphoroamidate bond, an oligonucleotide derivative in which a ribose and a phosphate diester bond in an oligonucleotide are converted into a peptide nucleic acid bond, an oligonucleotide derivative in which uracil in an oligonucleotide is replaced with C-5 propynyl uracil, an oligonucleotide derivative in which uracil in an oligonucleotide is replaced with C-5 thiazole uracil, an oligonucleotide derivative in which cytosine in an oligonucleotide is replaced with C-5 propynyl cytosine, an oligonucleotide derivative in which cytosine in an oligonucleotide is replaced with phenoxazine-modified cytosine, an oligonucleotide derivative in which ribose in DNA is replaced with 21-O-propylribose, and an oligonucleotide derivative in which ribose in an oligonucleotide is replaced with 2'-methoxyethoxyribose. Unless otherwise indicated, a given nucleic acid sequence is intended to include, not only the explicitly indicated sequence, but also a variant by conservative modification (e.g. degenerate codon substitution) and a complementary sequence. Specifically, the variant by degenerate codon substitution can be achieved by creating a sequence in which the third position of one or more selected (or all) codons is replaced with a mixed base and/or deoxyinosine residue (Batzer et. al., Nucleic Acid Res. 19:5081 (1991); Ohtsuka et al., J. Biol. Chem. 260; 2605-2608 (1985); Rossolini et al., Mol. Cell. Probes 8:91-98 (1994)). As used herein, the term "nucleic acid" is also used interchangeably with the terms gene, cDNA, mRNA, oligonucleotide, and polynucleotide. As used herein, the "nucleotide" may be natural or non-natural.

As used herein, the term "gene" refers to a factor that defines a genetic trait, and may indicate "polynucleotide", "oligonucleotide" and "nucleic acid".

In the present specification, "homology" of genes means the degree of identity of two or more gene sequences to each other, and generally, having "homology" means having a high degree of identity or similarity. Therefore, the higher the homology of two genes is, the higher the identity or similarity of these sequences is. Whether two genes are homologous can be examined by direct sequence comparison of, in the case of nucleic acids, hybridization under a stringent condition. When two gene sequences are directly compared, the genes are homologous when the DNA sequences are typically at least 50% identical, preferably at least 70% identical, and more preferably at least 80%, 90%, 95%, 96%, 978, 98% or 99% identical to each other. Thus, as used herein, "homologue" or "homologous gene product" refers to a protein of another species, preferably a mammal, more preferably human, that exerts the same biological function as the protein component of the complex further described herein. Such a homologue is also sometimes referred to as an "orthologous gene product." It is understood that such homologues, homologous gene products, and orthologous gene products can also be used as long as they meet an object of the present disclosure.

Amino acids can be referred to herein by either their generally known three-letter symbols or the one-letter symbols recommended by the IUPAC-IUB Biochemical Nomenclature Commission, Nucleotides can also be referred to by the generally recognized single letter codes. In the present specification, comparison of similarity, identity or homology of amino acid sequences or nucleotide sequences is calculated using default parameters by BLAST, tool for sequence analysis. The identity search can be performed using, for example, NCBI's BLAST 2.7.1 (issued 2017 Oct. 19). The value of "identity" in the present specification usually refers to the value when the above BLAST is used and the sequences are aligned under the default conditions. However, if a higher value is obtained when the parameter is changed, the highest value is set as the identity value. When the identity is evaluated in multiple regions, the highest value among them is set as its identity value. The "similarity" is a numerical value that takes into account similar amino acids in addition to identity.

In one embodiment of the present disclosure, the "several" may be, for example, 10, 8, 6, 5, 4, 3, or 2, or less than any of these values. It is known that a polypeptide in which one or several amino acid residues have been deleted, added, or inserted, or replaced by different amino acids maintains its biological activity (Mark et al., Proc Natl Acad Sci USA, 1984 September; 81 (18): 5662-5666, Zoller et al., Nucleic Acids Res. 1982 Oct. 25; 10 (20): 6487-6500, Wang et al., Science 1984 Jun. 29; 224 (4656): 1431-1433). Such altered proteins can be prepared, for example, by site-specific mutagenesis, random mutagenesis, or biopanning using a protein phage library. For site-specific mutagenesis, for example, KOD-Plus-Mutagenesis Kit (TOYOBO CO., LTD.) can be used. From such mutant proteins having alterations such as deletions, a protein having the same activity as its wild type protein can be selected by any of various characterizations such as FACS analysis and ELISA.

In one embodiment of the present disclosure, a numerical value "70% or more", which shows characteristics such as identity, may be, for example, 70% or more, 75% or more, 80% or more, 85% or more, 90% or more, 95% or more, 96% or more, 97% or more, 98% or more, 99% or more, or 100%, and may be within the range of any two of the numerical values mentioned as starting points. The above "identity" is a proportion of the numbers of identical amino acids between two or a plurality of amino acid sequences calculated according to a known method as described above. Specifically, before calculation of the proportion, amino acid sequences to be compared are aligned and a gap is introduced in part of the amino acid sequences if necessary to maximize the proportion of identical amino acids. Methods for alignment, calculation of proportion, and comparison, and related computer programs are well known in the art (e.g. BLAST as described above) As used herein, "identity" and "similarity" can be expressed as values measured by NCBI BLAST unless otherwise specified. Blastp can be used with default settings for the algorithm when amino acid sequences are compared in BLAST. The measurement results are quantified as Positives or Identities.

As used herein, the term "polynucleotide that hybridizes under a stringent condition" refers to a polynucleotide that hybridizes under a well-known condition of stringency commonly used in the art. Such a polynucleotide can be obtained by a method such as colony hybridization, plaque hybridization, or Southern blot hybridization using a polynucleotide selected from the polynucleotides of the present: disclosure as a probe. Specifically, such polynucleotide may be the one that can be identified by performing hybridization with a filter on which DNA derived from a colony or plaque is immobilized at 65° C. in the presence of 0.7 to 1.0 M NaCl, and then washing the filter under 65° C. with 0.1 to 2-fold SSC (saline-sodium citrate) solution (the composition of the 1-fold SSC solution is 150 mM sodium chloride and 15 mM sodium citrate). The "stringent condition" may be, for example, any of the following conditions: (1) Use low ionic strength and high temperature for washing (e.g. at 50° C. with 0,015 M sodium chloride/0.0015 M sodium citrate/ 0.1% sodium dodecyl sulfate), (2) Use a denaturing agent such as formamide during hybridization (e.g. at 42° C. with 50% (v/v) formamide and 0.1% bovine serum albumin/0.1% fico/0.1% polyvinylpyrrolidone/50 mM sodium phosphate buffer (pH6.5), and 750 mM sodium chloride and 75 mM sodium citrate), or (3) Incubate overnight at 37° C. in a solution containing 20% formamide, 5×SSC, 50 mM sodium phosphate (pH7.6), 5×Denhardt's solution, 10% dextran sulfate and 20 mg/ml denatured sheared salmon sperm DNA, and then wash the filter with 1×SSC at about 37-50° C. The formamide concentration may be 50% or more. The washing time may be for 5, 15, 30, 60, or 120 minutes or more, Multiple factors such as temperature and salt concentration can be considered to affect the stringency of the hybridization reaction. For details, see Ausubel et al., Current Protocols in Molecular Biology, Wiley Interscience Publishers, (1995). Examples of a "highly stringent condition" are 0.0015M sodium chloride and 0.0015 M sodium citrate at 65-68° C., or 0.015M sodium chloride, 0.0015M sodium citrate, and 50% formamide at 42° C. Hybridization can be performed according to the protocols described in Molecular Cloning 2nd ed., Current Protocols in Molecular Biology, Supplement 1-38, DNA Cloning 1: Core Techniques, A Practical Approach, Second Edition, Oxford University Press (1995). A sequence containing only A or T is preferably excluded from the sequences that hybridize under a stringent condition. A moderate stringent condition can be readily determined by one of ordinary skill in the art, e.g. based on DNA length, and found in Sambrook et al., Molecular Cloning: A Laboratory Manual, No. 3, Vol. 1, 7.42-7.45 Cold Spring Harbor Laboratory Press, 2001, and with respect to nitrocellulose filters, includes hybridization conditions such as a prewash solution of 5×SSC, 0.5% SDS, and 1.0 mM EDTA (pH8.0) and at about 40-50° C. with 50% formamide and 2×SSC-6×SSC (or a similar hybridization solution such as Stark's solution in about 50% formamide at about 42° C.), and wash conditions at about 60° C. with 0.5 SSC and 0.1% SDS. Accordingly, the polypeptides used in the present disclosure also include a polypeptide encoded by a nucleic acid molecule that hybridizes under a highly or moderately stringent condition to the nucleic acid molecule encoding the polypeptide specifically described herein.

The WT1 peptide of the present disclosure can preferably be "purified" or "isolated". As used herein, a "purified" substance or biological factor (e.g. nucleic acid or protein) is the one in which at least some of the factors associated with the substance or biological factor in nature have been removed. Therefore, a purified biological factor usually has a higher purity than the biological factor in the normal state (i.e., the biological factor is enriched). The term "purified" as used herein means that the biological factor is present preferably at least 75% by weight, more preferably at least 85% by weight, even more preferably at least 95% by weight, and most preferably at least 98% by weight. The substance or biological factor used in the present disclosure is preferably a "purified" substance. As used herein, an "isolated" substance or biological factor (e.g. nucleic acid or protein) is the one in which the factors associated with the substance or biological factor in nature have been substantially removed. The term "isolated" as used herein may have different meanings depending on its purpose and therefore does not necessarily have to be expressed in purity, but if necessary, means that the biological factor is present preferably at least 75% by weight, more preferably, at least 85% by weight, even more preferably at least 95% by weight, and most preferably at least 98% by weight. The substance used in the present disclosure is preferably an "isolated" substance or biological factor.

As used herein, the term "fragment" refers to a polypeptide or polynucleotide having a sequence length from 1 to n−1 with respect to a full-length polypeptide or polynucleotide (length n). The length of the fragment can be appropriately changed according to its purpose. For example, in the case of a polypeptide, the lower limit of the amino acid length is 3, 4, 5, 6, 7, 8, 9, 10, 15, 20, 25, 30, 40, 50 or more, and any length represented by an integer not specifically listed here (e.g. 11) may also be a suitable lower limit. Also, in the case of a polynucleotide, the lower limit of the nucleotide length is 5, 6, 7, 8, 9, 10, 15, 20, 25, 30, 40, 50, 75, 100 or more, and any length represented by an integer not specifically listed here (e.g. 11) may also be a suitable lower limit. As used herein, it is understood that such a fragment falls within the scope of the present disclosure, for example, when the full length functions as a cancer vaccine and the fragment also does.

As used herein, when referring to a gene or a nucleic acid molecule or polypeptide related thereto, the term "biological function" refers to a specific function that the gene, nucleic acid molecule or polypeptide may have in vivo or in vitro, and this may include, but is not limited to, activation of killer T cells or helper T cells. As used herein, a biological function can be exerted by corresponding "biological activity", As used herein, the term "biological activity" refers to an activity that factor (e.g. polynucleotide or protein) can have, and includes different activities to exert any of various functions (e.g. activation of killer T cells or helper T cells). The "biological activity" may be an activity exerted in vivo or an activity exerted in vitro as a result of an event such as secretion. For example, if the factor is an enzyme, its biological activity includes its enzymatic activity. Such biological activity can be measured by techniques well known in the art. Thus, the "activity" may be any of various measurable indicators that indicates or reveals (direct or indirect) binding; or that affects any response (i.e., has a measurable effect in response to some exposure or stimulus), and includes the affinity of a compound that directly binds to a polypeptide or polynucleotide of the present disclosure, and also the amount of upstream or downstream protein or other similar scales of function after some stimulation or event, for example.

As used herein, the term "expression" of a molecule such as a gene, polynucleotide, or polypeptide means that the molecule undergoes a certain action in vivo to take another form. Preferably, the term "expression" means that a molecule such as a gene or polynucleotide is transcribed and translated into the form of a polypeptide, but it may also mean that the molecule is transcribed to produce mRNA. Thus, as used herein, an "expression product" includes such a polypeptide or protein, or mRNA. More preferably, the form of such a polypeptide can be post-translationally processed. For example, the expression level of WT1 can be determined by any method. Specifically, the expression level of WT1 can be known by evaluating the amount of WTL mRNA, the amount of WT1 protein, and the biological activity of WT1 protein. The amount of WT1 mRNA or protein can be determined by methods as detailed elsewhere herein or by other methods known in the art.

As used herein, the term "functional equivalent" refers to any entity that has the same function of interest with, but a different structure from, the original entity, Therefore, it is understood that a functional equivalent of the "WT1 peptide" of the present disclosure includes those that do not have the same sequence as SEQ ID NO: 1 but are mutants or variants thereof (for example, amino acid sequence variants) that have the biological effect of the WT1 peptide, and those that can be transformed into mutants or variants having the biological effect of the WT1 peptide at the time of action (including nucleic acids encoding the mutants or variants and vectors or cells containing such nucleic acids). It is understood that in the present disclosure, functional equivalents of the WT1 peptide can be used in the same manner as the WT1 peptide, even if it is not particularly mentioned. Functional equivalents can be found by searching databases or other sources. As used herein, the term "searching" refers to finding a different nucleic acid sequence having specific function and/or property by utilizing one nucleic acid sequence electronically, biologically, or by some other methods. Electronic searches include BLAST (Altschul et al., J. Mol. Biol. 215:403-410 (1990)), FASTA (Pearson & Lipman, Proc. Natl. Acad. Sci., USA 85:2444-2448 (1988)), the Smith and Waterman method (Smith and Waterman, J, Mol. Biol. 147:195-197 (1981)), and the Needleman and Wunsch method (Needleman and Wunsch, J. Mol. Biol. 48:443-453 (1970)), but are not limited thereto. Biological searches include stringent hybridization, microarrays with genomic DNA attached to nylon membranes or glass plates (microarray assays), PCR and in situ hybridization, but are not limited thereto. In the present specification, it is intended that a gene used in the present disclosure should also include corresponding genes identified by such electronic or biological searches.

The functional equivalent of the present disclosure may be an amino acid sequence that differs from the original amino acid sequence in that one or a plurality of amino acids are inserted, substituted, or deleted in, or added to one or both ends of, the amino acid sequence. In the present specification, the expression "one or several amino acids 15 are inserted, substituted, or deleted in, or added to one or both ends of, the amino acid sequence" means that alteration, such as substitution of one or a plurality of amino acids that can occur in nature, has been made in the amino acid sequence by a well-known technique such as site-specific mutagenesis or by natural mutation. The altered amino acid sequence can be an amino acid sequence that differs from the original amino acid sequence in that 1 to 4, preferably 1 to 3, particularly preferably 1 to 2 or 1 amino acid is inserted, substituted, and/or deleted in, or added to one or both ends of, the amino acid sequence. The altered amino acid sequence may preferably be an amino acid sequence that differs from the amino acid sequence of any one of SEQ ID NOS: 1-5 in that it has conservative substitution of one or a plurality of amino acids (preferably one or several or 1, 2, 3 or 4 amino acids). As used herein, the term "conservative substitution" means substituting one or more amino acid residues with different but chemically similar amino acid residues so as not to substantially alter the function of the protein. For example, one hydrophobic residue may be replaced by another hydrophobic residue, and one polar residue may be replaced by another polar residue having the same charge. Functionally similar amino acids capable of making such substitutions are known in the art for each amino acid. Specifically, examples of non-polar (hydrophobic) amino acids include alanine, valine, isoleucine, leucine, proline, tryptophan, phenylalanine, and methionine. Examples of polar (neutral) amino acids include glycine, serine, threonine, tyrosine, glutamine, asparagine, and cysteine. Examples of positively charged (basic) amino acids include arginine, histidine, and lysine. Also, examples of negatively charged (acidic) amino acids includes aspartic acid and glutamic acid.

(WT1 Peptide)

In the present disclosure, the WT1 peptide may be a peptide derived from a WT1 protein that induces activation of cytotoxic T cells or helper T cells. Examples of the WT1 protein include a WT1 killer peptide, which induces activation of cytotoxic T cells, and a WT1 helper peptide, which induces activation of helper T cells. Examples of the WT1 killer peptide include peptides consisting of 8 to 12 amino acids, preferably 8 to 9 amino acids derived from a WT1 protein. Particularly preferably, the WT1 killer peptide is $WT1_{126}$ peptide: Arg Met Phe Pro Asn Ala Pro Tyr Leu (SEQ ID NO: 2), $WT1_{235}$ peptide: Cys Met Thr Trp Asn Gln Met Asn Leu (SEQ ID NO: 3), or the compound of formula (3):

(wherein C-C shown in the formula means that the C residues are linked together by a disulfide bond), which is a conjugate of $WT1_{126}$ peptide and $WT1_{235}$ peptide. Examples of the WT1 helper peptide include peptides consisting of 14 to 20 amino acids, preferably 16 to 18 amino acids derived from a WT1 protein. Particularly preferably, the WT1 helper peptide is $WT1_{35}$ peptide (Trp Ala Pro Val Leu Asp Phe Ala Pro Pro Gly Ala Ser Ala Tyr Gly Ser Leu; SEQ ID NO: 4), or $WT1_{332}$ peptide: Lys Arg Tyr Phe Lys Leu Ser His Leu Gln Met His Ser Arg Lys His) (SEQ ID NO: 5). A variant peptide that differs from a WT1 peptide in that one or several amino acids are deleted, substituted or added can also be used as the WT1 peptide in the present disclosure. Examples of such variant peptides include variant peptides of $WT1_{126}$ peptide, variant peptides of $WT1_{235}$ peptide, variant peptides of $WT1_{35}$ peptide, and variant peptides of $WT1_{332}$ peptide.

A preferred variant peptide of $WT1_{126}$ peptide is a peptide in which the amino acid residues at positions 4 to 8 from the N-terminus is the same as those at positions 4 to 8 from the N-terminus of $WT1_{126}$ peptide (PNAPY). Such a variant peptide of $WT1_{126}$ peptide is preferably a peptide consisting of the amino acid sequence of any of SEQ ID NOS: 6 to 44:

$WT1_{126}$P1G peptide
(GMFPNAPYL; SEQ ID NO: 6)

$WT1_{126}$P1A peptide
(AMFPNAPYL; SEQ ID NO: 7)

$WT1_{126}$P1V peptide
(VMFPNAPYL; SEQ ID NO: 8)

$WT1_{126}$P1L peptide
(LMFPNAPYL; SEQ ID NO: 9)

$WT1_{126}$P1I peptide
(IMFPNAPYL; SEQ ID NO: 10)

$WT1_{126}$P1M peptide
(MMFPNAPYL; SEQ ID NO: 11)

$WT1_{126}$P1W peptide
(WMFPNAPYL; SEQ ID NO: 12)

$WT1_{126}$P1F peptide
(FMFPNAPYL; SEQ ID NO: 13)

$WT1_{126}$P1Y peptide
(YMFPNAPYL; SEQ ID NO: 14)

$WT1_{126}$P2V peptide
(RVFPNAPYL; SEQ ID NO: 15)

$WT1_{126}$P2Q peptide
(RQFPNAPYL; SEQ ID NO: 16)

$WT1_{126}$P2A peptide
(RAFPNAPYL; SEQ ID NO: 17)

$WT1_{126}$P2L peptide
(RLFPNAPYL; SEQ ID NO: 18)

$WT1_{126}$P2I peptide
(RIFPNAPYL; SEQ ID NO: 19)

$WT1_{126}$P3I peptide
(RMIPNAPYL; SEQ ID NO: 20)

$WT1_{126}$P3L peptide
(RMLPNAPYL; SEQ ID NO: 21)

$WT1_{126}$P3G peptide
(RMGPNAPYL; SEQ ID NO: 22)

$WT1_{126}$P3A peptide
(RMAPNAPYL; SEQ ID NO: 23)

$WT1_{126}$P3V peptide
(RMVPNAPYL; SEQ ID NO: 24)

$WT1_{126}$P3M peptide
(RMMPNAPYL; SEQ ID NO: 25)

$WT1_{126}$P3P peptide
(RMPPNAPYL; SEQ ID NO: 26)

$WT1_{126}$P3W peptide
(RMWPNAPYL; SEQ ID NO: 27)

$WT1_{126}$P9V peptide
(RMFPNAPYV; SEQ ID NO: 28)

$WT1_{126}$P9A peptide
(RMFPNAPYA; SEQ ID NO: 29)

$WT1_{126}$P9I peptide
(RMFPNAPYI; SEQ ID NO: 30)

$WT1_{126}$P9M peptide
(RMFPNAPYM; SEQ ID NO: 31)

$WT1_{126}$P1D peptide
(DMFPNAPYL; SEQ ID NO: 32)

-continued

WT1₁₂₆P1E peptide
(EMFPNAPYL; SEQ ID NO: 33)

WT1₁₂₆P1H peptide
(HMFPNAPYL; SEQ ID NO: 34)

WT1₁₂₆P1K peptide
(KMFPNAPYL; SEQ ID NO: 35)

WT1₁₂₆P1N peptide
(NMFPNAPYL; SEQ ID NO: 36)

WT1₁₂₆P1P peptide
(PMFPNAPYL; SEQ ID NO: 37)

WT1₁₂₆P1Q peptide
(QMFPNAPYL; SEQ ID NO: 38)

WT1₁₂₆P1S peptide
(SMFPNAPYL; SEQ ID NO: 39)

WT1₁₂₆P1T peptide
(TMFPNAPYL; SEQ ID NO: 40)

WT1₁₂₆P2I & P9I peptide
(RIFPNAPYI; SEQ ID NO: 41)

WT1₁₂₆P2I & P9V peptide
(RIFPNAPYV; SEQ ID NO: 42)

WT1₁₂₆P2L & P9I peptide
(RLFPNAPYI; SEQ ID NO: 43)
and

WT1₁₂₆P2L & P9V peptide
(RLFPNAPYV; SEQ ID NO: 44).

Examples of variant peptides of WT1₂₃₅ peptide include a peptide comprising or consisting of WT1₂₃₅: Cys Met Thr Trp Asn Gln Met Asn Leu (SEQ ID NO: 3) or WT1₂₃₅ₘ: Cys Tyr Thr Trp Asn Gln Met Asn Leu (SEQ ID NO: 45), a dimer of peptides comprising or consisting of the amino acid sequence of SEQ ID NO: 3 or 45, a cystine form of a peptide comprising or consisting of the amino acid sequence of SEQ ID NO: 3 or 45, 30 and a peptide comprising or consisting of an amino acid sequence that differs from the above amino acid sequence in that one or several amino acids are substituted, deleted or added in the above amino acid sequence, but are not limited thereto. Among the variant peptides of WT1₂₃₅ peptide, WT1₂₃₅ₘ peptide is particularly preferred because it is an HLA-A*24:02-restricted WT1 peptide while HLA-A*24:02 is the most abundant HLA type in Japanese people, and it has a higher therapeutic efficacy than the wild type WT1₂₃₅ peptide and excellent solubility in water.

Examples of these variant peptides include the followings.
Cys-Cys Tyr Thr Trp Asn Gln Met. Asn Leu (SEQ ID NO: 47) (wherein C-C shown in the formula means that the C residues are linked together by a disulfide bond) or Cys-Cys Met Thr Trp Asn Gln Met Asn Leu (SEQ ID NO: 48) (wherein C-C shown in the formula means that the C residues are linked together by a disulfide bond) is particularly excellent in physicochemical properties and stability because the thiol group of the N-terminal cysteine residue is modified (see WO2007/063903).

From the viewpoint of covering a wide range of HLA subtypes, the variant peptide of the WT1 peptide in this embodiment preferably contains a plurality of peptides corresponding to different HLA subtypes. For example, it preferably contains both the peptide corresponding to HLA-A2 subtype or a pharmaceutically acceptable salt thereof and the peptide corresponding to HLA-A24 subtype or pharmaceutically acceptable salt thereof. In such a case, for example, a pharmaceutical composition may comprise the compound of formula (1):

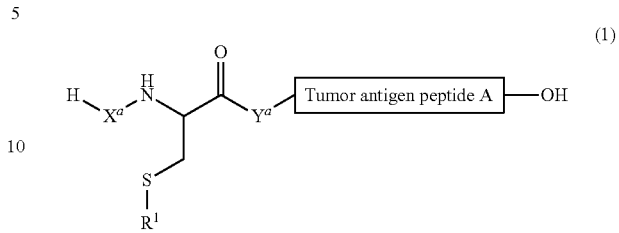

(1)

[wherein $X^a$ and $Y^a$ independently represent a single bond, tumor antigen peptide A represents a peptide consisting of an amino acid sequence selected from RMFPNAPYL. (SEQ ID NO: 2), ALLPAVPSL (SEQ ID NO: 52), SLGEQQYSV (SEO ID NO: 53), RVPGVAPTL: (SEQ ID NO:7), YMEPNAPYL (SEQ ID NO: 14) and VLDFAPPGA (SEO ID NO: 68), and the carbonyl group of the C-terminal amino acid of the tumor antigen peptide A binds to the hydroxyl group in the formula (2),
$R^1$ is hydrogen or tumor antigen peptide B, and the tumor antigen peptide B represents a peptide having a different amino acid sequence from the tumor antigen peptide A and consisting of an amino acid sequence selected from CMTWNOMNL (SEO ID NO: 3) and CYTWNOMNL (SEO ID NO: 45), and the thioether group of the cysteine residue of the tumor antigen peptide B binds to the thioether group in the formula (1)]
or a pharmaceutically acceptable salt thereof.

The compound represented by the above formula (1) has excellent stability against oxidizing agents in solutions due to the reasons such that the cysteine residues form a disulfide bond, and has a stable quality as a raw material for pharmaceutical products.

Further, when the variant peptide of the WT1 peptide in this embodiment comprises the compound represented by the formula (1) (a conjugate of WT1 killer peptides), the conjugate is degraded by reductive cleavage of the disulfide bond between the N-terminal cysteine residues by ERAP1 within the body and produce two epitopes corresponding to different HLA subtypes. A conjugate that produces a plurality of epitopes corresponding to different HLA subtypes in the body such as the conjugate represented by the formula (1) can widely address different HLA subtypes that vary depending on the subjects, and a large population can be covered by a single conjugate, and thus CTLs can be efficiently induced in the subjects (see WO: 2014/157692, which is herein incorporated by reference in its entity.)

The "tumor antigen peptide A" in this embodiment is an MHC class I-restricted WT1 peptide consisting of 7 to 30 amino acid residues. In the tumor antigen peptide A in the formula (1), the amino group of the N-terminal amino acid binds to Ya in the formula (1), and the carbonyl group of the C-terminal amino acid binds to the hydroxyl group in the formula (1).

The compound represented by the formula (1) may be the compound of formula (2):

(2)

(wherein C-C shown in the formula means that the C residues are linked together by a disulfide bond);

the compound of formula (3):

$$\begin{array}{c} \text{CRMFPNAPYL} \\ | \\ \text{CYTWNQMNL} \end{array} \quad (3)$$

(wherein C-C shown in the formula means that the C residues are linked together by a disulfide bond); or the compound of formula (4):

$$\begin{array}{c} \text{CRMFPNAPYL} \\ | \\ \text{CSLGEQQYSV} \end{array} \quad (4)$$

(wherein C-C shown in the formula means that the C residues are linked together by a disulfide bond).

A variant peptide of $WT1_{35}$ peptide may be any peptide so long as it has an amino acid sequence that differs from the amino acid sequence of SEQ ID NO: 4 in that one or several amino acids are substituted or deleted or added.

A variant peptide of $WT1_{332}$ peptide may be any peptide so long as it has an amino acid sequence that differs from the amino acid sequence of SEQ ID NO: 5 in that one or several amino acids are substituted or deleted or added. In a preferred embodiment, a variant peptide of $WT1_{332}$ peptide is preferably a peptide consisting of an amino acid sequence that differs from the amino acid sequence of SEQ ID NO: 5 in that the amino acid residue(s) at position 3, 6, 8 and/or 11 is substituted with an amino acid residue selected from position 3: phenylalanine, tryptophan, valine, isoleucine, leucine, methionine,
 position 6: valine, isoleucine, methionine, aspartic acid, glutamic acid,
 position 8: asparagine, serine, threonine, glutamine, lysine, aspartic acid,
 position 11; aspartic acid, glutamic acid, and glutamine.

Among them, a variant peptide of $WT1_{126}$ peptide is preferably $WT1_{126}$ P1F peptide (SEQ ID NO: 13), $WT1_{126}$ P2L peptide (SEQ ID NO: 18), $WT1_{126}$ P3M peptide (SEQ ID NO: 25) or $WT1_{126}$ P9V peptide (SEQ ID NO: 28), more preferably $WT1_{126}$ P2L peptide, $WT1_{126}$ P3M peptide or WT112, P9V peptide, and even more preferably $WT1_{126}$ P9V peptide.

The WT1 peptide in the prophylactic or therapeutic composition of the present disclosure is preferably WT1124 peptide, $WT1_{126}$ P1F peptide, $WT1_{126}$ P2L peptide, $WT1_{126}$ P3M peptide or $WT1_{126}$ P9V peptide. More preferably, the WT1 peptide is $WT1_{126}$ peptide, $WT1_{126}$ P2L peptide, $WT1_{126}$ P3M peptide or $WT1_{126}$ P9V peptide, even more preferably $WT1_{126}$ peptide or $WT1_{126}$ P9V peptide, and particularly preferably $WT1_{126}$ peptide.

The WT1 peptide can also be a derivative of a WT1 peptide. Examples of derivatives of $WT1_{126}$ peptide, $WT1_{235}$ peptide, $WT1_{35}$ peptide or $WT1_{332}$ peptide include those to which any of various substances is attached at one or both of the N- and C-termini of the amino acid sequence consisting of 9, 16 or 18 consecutive amino acids. For example, an amino acid, a peptide, or an analog thereof may be attached. Without being bound by theory, when such a substance is attached to $WT1_{126}$ peptide, $WT1_{235}$ peptide, $WT1_{35}$ peptide or $WT1_{332}$ peptide, or a variant peptide thereof, the substance is processed, for example by an in vivo enzyme or by a process such as intracellular processing, to eventually provide the peptide consisting of 9, 16 or 18 amino acids, which can be presented on the cell surface to induce WT1-specific CTL reaction.

The WT1 peptide or the analog thereof in this embodiment may further comprise a WT1 helper peptide. When the WT1 peptide or the analog thereof in this embodiment further comprises a peptide comprising an amino acid sequence selected from CNKRYFKLSHLQMHSRK (SEQ ID NO: 63), CNKRYFKLSHLQMHSRKH (SEQ ID NO: 64), CNKRYFKLSHLQMHSRKHTG (SEQ ID NO: 65), WAPVLDFAPPGASAYGSL (SEQ ID NO: 4), CWAPVLDFAPPGASAYGSL (SEQ ID NO: 66) and WAPVLDFAPPGASAYGSLC (SEQ ID NO: 51), it may further comprise a peptide comprising another amino acid sequence selected from the above group, and/or any other WT1 helper peptide.

The WT1 peptide can be prepared by methods commonly used in the art. For example, the peptide may be synthesized by methods described in literatures such as Peptide Synthesis, Interscience, New York, 1966; The Proteins, Vol 2, Academic Press Inc., New York, 1976; Peptide synthesis, Maruzen Co., LTD., 1975, Basics and Experiments of Peptide Synthesis, Maruzen Co., LTD., 1985; or Development of Pharmaceutical Product subsequent vol. 14, Peptide Synthesis, Hirokawa Shoten, 1991.

Screening of such WT1 peptide and variant peptides may be preferably performed by stimulating PBMCs (peripheral blood mononuclear cells) of some patients having a benign tumor (e.g. familial adenomatous polyposis) with each of candidate peptides once, and selecting a candidate peptide showing good reaction in the IFN-γ assay, since it is simple process.

In the present disclosure, a polynucleotide such as DNA or RNA encoding the WT1 protein or WT1 peptide described above can also be used as an active ingredient of the prophylactic or therapeutic composition. That is, cancer immunity can be generated in vivo by inserting a polynucleotide encoding a WT1 protein or WT1 peptide into an appropriate vector, preferably an expression vector, and then administering the vector to an animal including human. Examples of polynucleotides include DNA and RNA, and the polynucleotide is preferably DNA or RNA. The nucleotide sequence of the polynucleotide can be determined based on the amino acid sequence of a WT1 protein or WT1 peptide that is immunogenic to a patient with a benign tumor (e.g. familial adenomatous polyposis). The polynucleotide can be produced by known methods for DNA or RNA synthesis or methods using PCR, for example. The prophylactic or therapeutic composition comprising DNA encoding a WT1 protein or WT1 peptide is also an aspect of the present disclosure. The WT1 protein or WT1 peptide is preferably a WT1 peptide, more preferably $WT1_{126}$ peptide, $WT1_{235}$ peptide, $WT1_{35}$ peptide of $WT1_{332}$ peptide, or a variant peptide thereof, or a combination thereof, even more preferably $WT1_{126}$ peptide, $WT1_{235}$ peptide or $WT1_{35}$ peptide, or a variant peptide thereof, or a combination thereof, and most preferably a combination of the compound of formula (3) (a conjugate of $WT1_{126}$ peptide and $WT1_{235}$ peptide) and $WT1_{35}$ peptide. The DNA may be inserted into any expression vector. RNA per se, without being inserted into a vector, can also be used as an active ingredient of the composition.

The prophylactic or therapeutic composition of the present disclosure can contain an adjuvant. The adjuvant may be any substance so long as it non-specifically enhances immune response to a WT1 protein or WT1 peptide that works as an antigen when it is administered together with, or even separately from, the antigen. Examples of adjuvants include sedimentary adjuvants and oil-based adjuvants. Sedimentary adjuvants include, for example, sodium hydroxide, aluminum hydroxide, calcium phosphate, aluminum phosphate, alum, Pepesu and carboxyvinyl polymers. The oil-based adjuvant is preferably the one in which oil can wrap an aqueous antigen solution to form micelles, and specific examples thereof include liquid paraffin, lanolin, Freund, Montanide ISA763AVG, Montanide ISA51, incomplete Freund adjuvant and complete Freund adjuvant. The adjuvant can also be a mixture of two or more. Preferably, the adjuvant is an oil-based adjuvant. The amount of an adjuvant in the prophylactic or therapeutic composition of the present disclosure is not particularly limited so long as it is an amount that non-specifically enhances immune response to the antigen, and may be appropriately selected depending on the type of the adjuvant and other factors.

The prophylactic or therapeutic composition of the present disclosure can be administered by oral administration or parenteral administration, for example, intraperitoneal administration, subcutaneous administration, intradermal administration, intramuscular administration, intravenous administration or intranasal administration. The parenteral administration includes percutaneous absorption of the active ingredient WT1 protein or WT1 peptide by applying the prophylactic or therapeutic composition to the skin, or by adding the prophylactic or therapeutic composition to a patch and attaching it to the skin. The prophylactic or therapeutic composition of the present disclosure can also be administered by other administration methods including inhalation. Preferably, the prophylactic or therapeutic composition is administered by parenteral administration. More preferably, the prophylactic or therapeutic composition is administered by intradermal administration or subcutaneous administration. Preferable examples of body parts for intradermal administration or subcutaneous administration include the upper arm.

The prophylactic or therapeutic composition of the present disclosure may be in any of various preparation forms such as solid preparations or liquid preparations depending on its administration route. For example, the prophylactic or therapeutic composition can be an internal solid or liquid preparation for oral administration or an injection preparation for parenteral administration.

Examples of internal solid preparations for oral administration include tablets, pills, capsules, powders, and granules.

The internal solid preparations can be prepared according to conventional methods and the WT1 protein or WT1 peptide is used as it is, or mixed or granulated with an additive (for example, by stirring granulation, fluidized bed granulation, dry granulation, or rolling stirring fluidized bed granulation). For example, capsules can be prepared by filling capsules, and tablets can be prepared by tableting. One or more additives may be appropriately blended. Examples of additives include, for example, excipients such as lactose, mannitol, glucose, microcrystalline cellulose, corn starch; binders such as hydroxypropyl cellulose, polyvinylpyrrolidone, magnesium aluminometasilicate; dispersants such as corn starch; disintegrants such as calcium carboxymethyl cellulose; lubricants such as magnesium stearate; solubilizers such as glutamic acid and aspartic acid; stabilizers; cellulose such as hydroxypropyl cellulose, hydroxypropyl methyl cellulose and methyl cellulose, and water-soluble polymers including synthetic polymers such as polyethylene glycol, polyvinylpyrrolidone, and polyvinyl alcohol; and sweeteners such as white sugar, powdered sugar, sucrose, fructose, glucose, lactose, reduced maltose starch syrup, powdered reduced maltose starch syrup, glucose fructose syrup, fructose glucose syrup, honey, sorbitol, maltitol, mannitol, xylitol, erythritol, aspartame, saccharin, or saccharin sodium.

The granules or tablets may be coated, for example with a coating agent, if necessary, and the coating may be two or more layers. Examples of coating agents include white sugar, gelatin, hydroxypropyl cellulose, and hydroxypropyl methylcellulose phthalate. The capsules may be prepared by appropriately selecting any of the above excipients and evenly mixing Pranlukast Hydrate and the selected excipient, and filling the mixture or granulates prepared from the mixture with or without an appropriate coating to a capsule, or encapsulating the same in a capsule base having increased plasticity due to addition of a plasticizer such as glycerin or sorbitol to an appropriate capsule base (such as gelatin). To the capsule base, a colorant or preservative (sulfur dioxide; parabens such as methyl paraoxybenzoate, ethyl paraoxybenzoate, and propyl paraoxybenzoate) can be added, if necessary. The capsules include hard capsules or soft capsules.

Examples of the internal liquid preparation for oral administration include liquids, suspensions, emulsions, syrups, preparations dissolved before use such as dry syrups, and elixirs. For such internal liquid preparations, the WT1 protein or WT1 peptide is dissolved, suspended or emulsified in a diluent commonly used in internal liquid preparations. Examples of diluents include purified water, ethanol, or a mixture thereof. This liquid preparation may also contain any of wetting agents, suspending g agents, emulsifiers, sweeteners, flavors, fragrances, preservatives, and buffers. The dry syrup can be prepared, for example, by mixing Pranlukast Hydrate with white sugar, powdered sugar, sucrose, fructose, glucose, or lactose. The dry syrup may be made into granules according to conventional methods.

Dosage forms for parenteral administration include injections, ointments, gels, creams, patches, aerosols, and sprays, but are preferably injections. For example, it is preferred to prepare an injection using a WT1 protein or WT1 peptide and a conventional carrier.

The injection for parenteral administration may be either an aqueous injection or an oil injection. The aqueous injection may be prepared, for example, by mixing a WT1 peptide protein or WT1 with solution obtained by appropriately adding a pharmaceutically acceptable additive to an aqueous solvent (such as water for injection or purified water) according to a known method, filtering the mixture with a filter for sterilization, and then filling the sterilized mixture in a sterile container. Examples of pharmaceutically acceptable additives include, for example, the above-mentioned adjuvants; isotonic agents such as sodium chloride, potassium chloride, glycerin, mannitol, sorbitol, boric acid, borax, glucose, and propylene glycol; buffers such as phosphate buffers, acetate buffer, borate buffers, carbonate buffers, citrate buffers, tris buffers, glutamate buffers, and epsilon aminocaproic acid buffers; preservatives such as methyl paraoxybenzoate, ethyl paraoxybenzoate, propyl paraoxybenzoate, butyl paraoxybenzoate, chlorobutanol, benzyl alcohol, benzalkonium chloride, sodium dehydroacetate, sodium edetate, boric acid, and borax; thickeners such as hydroxyethyl cellulose, hydroxypropyl cellulose, polyvinyl alcohol, and polyethylene glycol; stabilizers such as sodium hydrogen sulfite, sodium thiosulfate, sodium edetate, sodium citrate, ascorbic acid, and dibutylhydroxytoluene; pH adjusters such as hydrochloric acid, sodium hydroxide, phosphoric acid, and acetic acid. The injection may contain any of suitable solubilizing agents such as alcohols such as ethanol; polyalcohols such as propylene glycol and polyethylene glycol; and nonionic surfactants such as polysorbate 80% polyoxyethylene hydrogenated castor oil 50, lysolecithin, and pluronic polyols. The injection may further contain any of proteins such as bovine serum albumin and keyhole limpet hemocyanin; and polysaccharides such as aminodextran. For preparing an oil-based injection, an oil-based solvent such as sesame oil or soybean oil may be used, and a solubilizing agent such as benzyl benzoate or benzyl alcohol may be added. The prepared injection solution is usually filled in a suitable container such as an ampoule or vial. Liquid preparations such as those for injection can be stored in a frozen state or after the water is removed by freeze-drying. The lyophilized preparation is redissolved by addition of distilled water for injection before use.

Also, the prophylactic or therapeutic composition of the present disclosure may be in a form in which a WT1 protein or WT1 peptide is mixed in liposomes, if required with a polysaccharide and/or any other component to be incorporated into cancer vaccine compositions.

The dose of the prophylactic or therapeutic composition of the present disclosure varies depending on the WT1 protein or WT1 peptide or DNA to be used and a factor such as the age and weight of the patient or the disease to be treated, and in the case of a vaccine composition comprising a WT1 peptide such as $WT1_{126}$ peptide, $WT1_{235}$ peptide, $WT1_{35}$ peptide, OF $WT1_{332}$ peptide, for example, the amount of the WT1 peptide is preferably about 0.1 μg to 1 mg/kg per body weight per day. The dose of the WT1 peptide is usually 0.0001 mg to 1000 mg, preferably 0.01 mg to 1000 mg, more preferably 0.1 mg to 10 mg, and this amount is preferably administered once every few days to several months.

Further, the prophylactic or therapeutic composition of the present disclosure may be administered by collecting PBMCs from peripheral blood of a patient with a benign tumor (e.g. familial adenomatous polyposis), obtaining dendritic cells from the peripheral blood, pulsing the cells with peptide such as $WT1_{126}$ peptide, $WT1_{235}$ peptide, $WT1_{35}$ peptide or $WT1_{332}$ peptide or a polynucleotide such as DNA of RNA comprised in the prophylactic or therapeutic composition as its active ingredient, and returning the cells to the patient by subcutaneous administration or any other administration method. The condition for pulsing dendritic cells with an 25 agent such as a WT1 peptide are not particularly limited as long as the effect of the present disclosure is exhibited, and any of commonly used conditions can be adopted.

When a nucleic acid molecule encoding a WT1 protein or WT1 peptide is used in the prophylactic or therapeutic composition, it is preferred to administer the prophylactic or therapeutic composition such that the nucleic acid molecule is introduced into dendritic cells of a patient with a benign tumor (e.g. familial adenomatous polyposis). The nucleic acid molecule can be introduced into dendritic cells of a patient with a benign tumor (e.g. familial adenomatous polyposis) by, for example, obtaining dendritic cells from a patient with a benign tumor (e.g. familial adenomatous polyposis) as described above, and introducing the nucleic acid molecule into the dendritic cells by using an electric pulse. Since the WT1 protein or WT1 peptide expressed from the nucleic acid molecule introduced into the dendritic cells is presented on the surface of the dendritic cells, returning the dendritic cells pulsed with the nucleic acid molecule to the body of the patient of a benign tumor (e.g. familial adenomatous polyposis) can rapidly induce cancer immunity in the living body. Such a method of treating or preventing cancer by introducing a nucleic acid molecule encoding a WT1 protein or WT1 peptide into dendritic cells of a subject is one of the preferred embodiments of the present disclosure. In the above embodiment, the nucleic acid molecule may be either DNA or RNA, and preferably RNA.

Another aspect of the present disclosure relates a method of inducing WT1-specific CTLs and/or WT1-specific helper T cells comprising culturing peripheral blood mononuclear cells derived from a subject in the presence of a WT1 protein or WT1 peptide, or introducing a nucleic acid molecule encoding a WT1 protein or WT1 peptide into such peripheral blood mononuclear cells, and thereby inducing WT1-specific CTLs and/or WT1-specific helper T cells from the peripheral mononuclear cells. The subject from which the peripheral blood mononuclear cells are derived is not particularly limited. The WT1 protein or WT1 peptide may be $WT1_{126}$ peptide, $WT1_{235}$ peptide, $WT1_{35}$ peptide or $WT1_{332}$ peptide, or a variant peptide thereof, and $WT1_{126}$ peptide, $WT1_{235}$ peptide, $WT1_{35}$ peptide or $WT1_{332}$ peptide is preferred. For example, when peripheral blood mononuclear cells derived from a subject are cultured in the presence of $WT1_{126}$ peptide or $WT1_{235}$ peptide, WT1-specific CTLs are induced from precursor cells of CTLs in the peripheral blood mononuclear cells. When peripheral blood mononuclear cells derived from a subject are cultured in the presence of $WT1_{35}$ peptide or $WT1_{332}$ peptide, WT1-specific helper T cells are induced from precursor cells of helper T cells in the peripheral blood mononuclear cells. The culture condition for peripheral blood mononuclear cells derived from a subject is not particularly limited, and the cells can be cultured under any of commonly used conditions. The CTLs and helper T cells thus obtained recognize $WT1_{126}$ peptide, $WT1_{235}$ peptide, $WT1_{35}$ peptide and $WT1_{332}$ peptide, respectively. Therefore, WT1-specific CTLs and/or WT1-specific helper T cells induced by the present disclosure can be used to specifically damage tumor cells highly expressing WT1 and treating and/or preventing the target benign tumor (e.g. familial adenomatous polyposis). The method for administering the WT1-specific CTLs and/or WT1-specific helper T cells to a subject is not particularly limited, and the cells can be administered in the same manner as the prophylactic or therapeutic composition described above, for example.

Another aspect of the disclosure relates to a kit for inducing WT1-specific CTLs and/or WT1-specific helper T cells comprising a WIL protein or WT1 peptide as an essential component. Preferably, the kit is used in the method of inducing WII-specific CTLs and/or WII-specific helper T cells from a subject as described above. In addition to the WT1 protein or WT1 peptide, such a kit may comprise any other component such as a means for obtaining peripheral blood mononuclear cells, an adjuvant, or a reaction vessel. Using this kit, it is possible to efficiently induce WT1-specific CTLs and/or WT1-specific helper T cells that recognize a cancer antigen such as $WT1_{126}$ peptide, $WT1_{235}$ peptide, $WT1_{35}$ peptide or $WT1_{332}$ peptide.

In yet another embodiment, the present disclosure relates to a method of inducing dendritic cells presenting a WT1 protein or WT1 peptide comprising culturing immature dendritic cells derived from a subject in the presence of a WT1 protein or WT1 peptide, or introducing a nucleic acid molecule encoding a WT1 protein or WT1 peptide into such immature dendritic cells, and thereby inducing dendritic cells presenting the WT1 protein or WT1 peptide from the immature dendritic cells. The WT1 protein or WT1 peptide may be $WT1_{126}$ peptide, $WT1_{235}$ peptide, $WT1_{35}$ peptide or $WT1_{332}$ peptide or a variant peptide thereof, and is preferably $WT1_{126}$ peptide, $WT1_{235}$ peptide, $WT1_{35}$ peptide or $WT1_{332}$ peptide. The nucleic acid molecule encoding a WT1 protein or WT1 peptide may be a nucleic acid molecule encoding the $WT1_{126}$ peptide, $WT1_{235}$ peptide, $WT1_{35}$ peptide or $WT1_{332}$ peptide or a variant peptide thereof, and is preferably a nucleic acid molecule encoding $WT1_{126}$ peptide, $WT1_{235}$ peptide, $WT1_{35}$ peptide or $WT1_{332}$ peptide. The nucleic acid molecule may be either DNA or RNA, and is preferably RNA. The subject from which the immature dendritic cells are derived is not particularly limited. Since immature dendritic cells are contained in cells such as peripheral blood mononuclear cells, such cells may be cultured in the presence of $WT1_{126}$ peptide, $WT1_{235}$ peptide, $WT1_{35}$ peptide or $WT1_{332}$ peptide. When the dendritic cells thus obtained are administered to a subject, the WT1-specific CTLs and/or WT1-specific helper T cells as described above are efficiently induced, thereby benign tumor (e.g. familial adenomatous polyposis) of the subject can be treated and/or prevented. The method for administering the dendritic cells to a subject is not particularly limited, and the cells can be administered in the same manner as the prophylactic or therapeutic composition described above, for example.

Preferred Embodiments

The preferred embodiments of the present disclosure will be described below. It is understood that the embodiments provided below are provided for a better understanding of the present disclosure and the scope of the present disclosure should not be limited to the following descriptions. Therefore, it is clear that a person skilled in the art can make appropriate modifications within the scope of the present disclosure in consideration of the description in the present specification. It is also understood that the following embodiments of the present disclosure may be used alone or in combination.

Also, all of the embodiments described below are comprehensive or specific examples. The numerical values, shapes, materials, components, steps, the order of steps, or other descriptions in the following embodiments are examples, and are not intended to limit the scope of claims. Further, among the components in the following embodiments, the components not described in an independent claim, which indicates the broadest concept, are described as optional components.

(Prophylactic or Therapeutic Compositions)

In one aspect, the present disclosure provides a composition for preventing or treating (prophylactic or therapeutic composition) for a benign tumor comprising a WT1 peptide or an analog thereof. WT1 has been shown to be highly expressed in cancer cells of malignant tumors, but its expression in benign tumors was not known. The present disclosure is based on the surprising finding that the WT1 protein is expressed in cells of benign tumors and provides a new therapeutic modality for benign tumors.

In one embodiment, the benign tumor of the present disclosure expresses WT1. Without being bound by theory, the WT1 peptide of the present disclosure acts as a cancer antigen and enhances the cytotoxic activity of CTLs and/or the activity of helper T cells, thereby causing cytotoxicity to cells of benign tumors, and due to its activity, the WT1 peptide vaccine of the present disclosure has therapeutic efficacy against benign tumors expressing WT1. The expression of WT1 protein is not limited to a specific benign tumor, but is observed in various hereditary and non-hereditary benign tumors. Therefore, the WT1 protein can be expressed not only in hereditary but also in acquired benign tumors, and it is understood that such types of benign tumors can be treated or prevented using the techniques of the present disclosure. In one embodiment, the benign tumor is selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, chondroma, and hemangioma.

In one embodiment, the present disclosure provides a composition for preventing or treating familial adenomatous polyposis comprising a WT1 peptide or an analog thereof. Although the WT1 peptide of an analog thereof has been shown to be effective in the treatment of angiogenesis, it was unexpected that the WT1 peptide or the analog thereof is effective for the treatment or prevention of familial adenomatous polyposis, which is refractory and previously had virtually no cure but resection. The present disclosure provides a new therapeutic modality for familial adenomatous polyposis for which resection was virtually the only treatment, and the treatment or prevention of the present disclosure does not require resection and thus it is useful to contribute to improvement of quality of life (QOL).

In one embodiment, the WT1 peptide of the present disclosure may be a single type of peptide or comprise multiple types of peptides. Further, the WT1 peptide used in the medicament or composition of the present disclosure may be a killer WT1 peptide or a helper WT1 peptide, or may be a mixture of these peptides. More preferably, the WT1 peptide comprises both a killer-type WT1 peptide and a helper-type WT1 peptide. A dimer of WT1 peptides may be used in the present disclosure. The dimer of WT1 peptides may be obtained by forming a disulfide bond between two WT1 peptides each having a cysteine residue. The WT1 peptide used in the pharmaceutical composition of the present disclosure may be a single type of peptide or comprise multiple types of peptides.

Whether WT1 peptide exerts a therapeutic or prophylactic effect in a subject depends on whether the WT1 peptide corresponds to the HLA type of the subject. Since it is currently known for many WT1 peptides to which HLA type the peptide is suitable, the WT1 peptide used in the present disclosure can be selected according to the HLA type of the subject. In addition, multiple types of WT1 peptides may be used in the pharmaceutical composition of the present disclosure to cover wide range of subjects.

In one preferred embodiment, the WIL peptide used in the present disclosure is $WT1_{126}$ killer peptide, $WT1_{235}$ killer peptide, $WT1_{35}$ helper peptide and/or $WT1_{332}$ helper peptide. Preferably, the WT1 peptide comprises both a killer peptide selected from $WT1_{126}$ peptide and $WT1_{235}$ peptide and a helper peptide selected from $WT1_{35}$ peptide and $WT1_{332}$ peptide. Without wishing to be bound by theory, it has been found in the present disclosure that the WT1 peptide is more effective when it comprises both killer and helper peptides than when it is used alone.

In another aspect, the WT1 peptide of the present disclosure comprises both the compound of formula (3) and $WT1_{35}$ helper peptide. The combination of the compound of formula (3) and $WT1_{35}$ helper peptide has not been known to show prophylactic and/or therapeutic efficacy against benign tumors, to the knowledge of the applicant.

In another aspect, the present disclosure provides a composition for preventing for treating a benign tumor comprising a nucleic acid molecule encoding a WT1 peptide or an analog thereof.

In certain embodiments, the present disclosure provides a composition for preventing or treating familial adenomatous polyposis comprising a nucleic acid molecule encoding a WT1 peptide or an analog thereof. In this case, the active ingredient in the pharmaceutical composition of the present disclosure can be said to be a polynucleotide encoding the WT1 peptide, but is not limited thereto. The nucleotide sequence of the polynucleotide can be determined based on the amino acid sequence of the WT1 peptide. The polynucleotide can be produced, for example, by a known method for DNA or RNA synthesis such as chemical synthesis or PCR.

In one embodiment, the prophylactic or therapeutic composition of the present disclosure comprises DNA encoding the WT1 peptide or the analog thereof.

In another embodiment, the prophylactic or therapeutic composition of the present disclosure comprises RNA encoding the WT1 peptide or the analog thereof.

In another embodiment, the prophylactic or therapeutic composition of the present disclosure comprises RNA and DNA encoding the WT1 peptide or the analog thereof.

In one embodiment, the prophylactic or therapeutic composition of the present disclosure comprises an adjuvant in addition to the above component.

In one preferred embodiment, the adjuvant used in the present disclosure includes Montanide® ISA51 adjuvants.

In one embodiment, the prophylactic or therapeutic composition of the present disclosure is administered once a week.

The medicament or composition of the present disclosure may be used in combination with an agent used for the treatment and/or prevention of a benign tumor (e.g. familial adenomatous polyposis).

The route of administration of the medicament or composition of the present disclosure is not particularly limited, and examples of preferred routes of administration include intradermal administration, subcutaneous administration, transdermal administration, and transmucosal administration (e.g. eye drops, nasal drops, sublingual administration).

The dosage form of the medicament or composition of the present disclosure is not particularly limited, and may be, for example, a dosage form such as an injection solution, an eye drop solution, a nasal drop solution, a lotion, a cream, a patch, a sublingual tablet, or a troche. These dosage forms can be prepared and administered by methods well known to those of skill in the art.

The dose of the WT1 peptide when the medicament or composition of the present disclosure is used is appropriately changed in consideration of factors such as the type of WT1 peptide, the route of administration, the dosage form, the type of disease, the severity of disease, and the health condition of the subject. In general, the dose of a WT1 peptide is 0.2 μg/kg to 1 mg/kg per adult per day. Similarly, the type, administration route, and dosage form of the WT1 peptide can be appropriately changed. In addition to a pharmaceutically acceptable carrier or excipient, the medicament or composition of the present disclosure may comprise a suitable adjuvant such as aluminum hydroxide. Alternatively, the medicament or composition of the present disclosure may comprise a WT1 peptide encapsulated in liposomes.

In this embodiment, for example, when the WT1 peptide is the compound of formula (2) or formula (3), the WT1 peptide may be administered intradermally, in the introduction phase at 3.5 mg per day for an adult every 2 weeks, 1 to 5 times in total, and in the maintenance phase 3.5 mg per day for an adult every 1 or 2 months, 3 to 6 times in total.

The dose may be in the range of 1.0 mg or more, 2.5 mg or more, 5.0 mg or more, 10 mg or more, 15 mg or more, 20 mg or more or 25 mg or more, or 100 mg or less, 50 mg or less, 40 mg or less, 30 mg or less, 25 mg or less, 20 mg or less, 15 mg or less, 10 mg or less, 5.0 mg or less or 2.5 mg or less per day for an adult. Specifically, the dose may be, for example, 0.5 mg, 1.0 mg, 1.5 mg, 2.0 mg, 2.5 mg, 3.0 mg, 3.5 mg, 4.0 mg, 4.5 mg, 5.0 mg, 5.5 mg, 6.0 mg, 6.5 mg, 7.0 mg, 7.5 mg, 8.0 mg, 8.5 mg, 9.0 mg, 9.5 mg, or 10 mg per day for an adult.

The administration interval can be appropriately selected from 1 week to 1 year, and may be, for example, 1 day or more, 1 week or more, 2 weeks or more, 3 weeks or more, 1 month or more, 2 months or more, 3 months or more, 4 months or more, 5 months or more or 6 months or more, or 1 year or less, 9 months or less, 6 months or less, 5 months or less, 4 months or less, 3 months or less, 2 months or less, 1 month or less, 3 weeks or less, 2 weeks or less, or 1 week or less. Specifically, the administration interval may be, for example, 1 day, 3 days, 5 days, 1 week, 2 weeks, 3 weeks, 1 month, 2 months, 3 months, 4 months, 5 months, 6 months, 9 months or 1 year.

The number of administration can be appropriately selected from 1 to 100 times in total, and may be, for example, 1 time or more, 2 times or more, 3 times or more, 4 times or more, 5 times or more, 6 times or more, 7 times or more, 8 times or more, 9 times or more or 10 times or more, or 100 times or less, 50 times or less, 40 times or less, 30 times or less, 20 times or less, 15 times or less, 10 times or less, 9 times or less, 8 times or less, 7 times or less, 6 times or less, 5 times or less, 4 times or less, 3 times or less, or 2 times or less. Specifically, the number of administration may be, for example, 1 time, 2 times, 3 times, 4 times, 5 times, 6 times, 7 times, 8 times, 9 times, 10 times, 11 times or 12 times.

In another aspect, the present disclosure provides a WT1 peptide or an analog thereof, or a nucleic acid molecule encoding a WT1 peptide or an analog thereof, for the treatment and/or prevention of a benign tumor (e.g. familial adenomatous polyposis).

In yet another aspect, the present disclosure relates to use of a WT1 peptide or an analog thereof, or a nucleic acid molecule encoding a WT1 peptide or an analog thereof, for the treatment and/or prevention of a benign tumor (e.g. familial adenomatous polyposis), or for the manufacture of a pharmaceutical composition for the treatment and/or prevention of a benign tumor (e.g. familial adenomatous polyposis). The present disclosure further provides a method of treating and/or preventing a benign tumor (e.g. familial adenomatous polyposis) comprising the step of administering to a subject in need thereof an effective amount of a WT1 peptide or an analog thereof, or a nucleic acid molecule encoding a WT1 peptide or an analog thereof. In a further embodiment, the present disclosure relates to use of a WT1 peptide or an analog thereof, or a nucleic acid molecule encoding a WT1 peptide or an analog thereof, for the manufacture of a medicament for the treatment and/or prevention of a benign tumor (e.g. familial adenomatous polyposis). In yet another aspect, the present disclosure relates to a method of treating and/or preventing a benign tumor (e.g. familial adenomatous polyposis) characterized by administering to a subject in need thereof a WT1 peptide or an analog thereof, or a nucleic acid molecule encoding a WT1 peptide or an analog thereof. All the explanations described herein including the above apply to these aspects as well.

(Methods of Inducing Immune Cells)

In another aspect, the present disclosure provides a method of inducing WT1-specific cytotoxic T cells (CTLS) and/or WT1-specific helper T cells for use in preventing or treating a benign tumor (e.g. familial adenomatous polyposis) characterized by comprising the step of culturing peripheral blood mononuclear cells derived from a subject in need of the treatment of a benign tumor (e.g. familial adenomatous polyposis) in the presence of any of the WT1 peptides or analogs thereof descried herein, or introducing a nucleic acid molecule encoding any of the WT1 peptides or analogs thereof descried herein into such peripheral blood mononuclear cells, and thereby inducing WT1-specific CTLs and/or WT1-specific helper T cells from the peripheral mononuclear cells. It will be understood by those skilled in the art that any explanation given in the section "Prophylactic or Therapeutic Compositions" also applies to this induction method.

In another aspect, the present disclosure provides a method of inducing WT1-presenting dendritic cells for use in preventing treating a benign or tumor (e.g. familial adenomatous polyposis) characterized by comprising the step of culturing immature dendritic cells derived from a subject in need of the treatment of a benign tumor (e.g. familial adenomatous polyposis) in the presence of any of the WT1 peptides or analogs thereof descried herein, or introducing a nucleic acid molecule encoding any of the WT1 peptides or analogs thereof descried herein into such immature dendritic cells, and thereby inducing WT1-presenting dendritic cells. It will be understood by those skilled in the art that any explanation given the "Prophylactic section or Therapeutic Compositions" also applies to this induction method.

In another aspect, the present disclosure relates to a composition comprising a WT1 peptide or an analog thereof, or a nucleic acid molecule encoding a WT1 peptide or an analog thereof, for inducing WT1-specific cytotoxic T cells and/or WT1-specific helper T cells, wherein the composition is for use in preventing or treating a benign tumor (e.g. familial adenomatous polyposis). It will be understood by those skilled in the art that any explanation given in the section: "Prophylactic. or Therapeutic Compositions" also applies to this composition.

In yet another aspect, the present disclosure relates to a composition comprising a WT1 peptide or an analog thereof, or a nucleic acid molecule encoding a WT1 peptide or an analog thereof, for inducing WT1-presenting dendritic cells, wherein the composition is for use in preventing or treating a benign tumor (e.g. familial adenomatous polyposis). It will be understood by those skilled in the art that any explanation given in the section "Prophylactic or Therapeutic Compositions" also applies to this composition.

In yet another aspect, the present disclosure provides a composition for preventing or treating a benign tumor (e.g. familial adenomatous polyposis) comprising WT1-specific cytotoxic T cells and/or WT1-specific helper T cells. It will be understood by those skilled in the art that any explanation: given in the section "Prophylactic or Therapeutic Compositions" also applies to this composition.

In yet another aspect, the present disclosure provides a composition for preventing or treating a benign tumor (e.g. familial adenomatous polyposis) comprising WT1-presenting dendritic cells. It will be understood by those skilled in the art that any explanation given in the section "Prophylactic or Therapeutic Compositions" also applies to this composition.

(Preparation Methods)

The peptide or derivative or nucleic acid molecule of the present disclosure can be prepared by preparation methods commonly used in the art. These preparation methods can be appropriately improved based on the knowledge of those who are familiar with immunological methods, molecular biological methods, biochemical methods, and microbiological methods; Specifically, the peptide or derivative or nucleic acid molecule of the present disclosure may be designed based on the amino acid sequence of a WT1 protein in nature (for example, SEQ ID NO: 1) or the nucleic acid sequence of a WT1 protein in nature, and may be prepared by a system such as an expression system using microorganisms. The starting materials and intermediates in the preparation methods can be purchased as commercial product, or can be obtained by methods described in publically known documents or from publically known compounds according to publically known methods. Analogs of these materials starting and intermediates may be used as long as they do not interfere with the preparing process.

(General Technology)

The immunological, molecular biological, biochemical, and microbiological techniques used herein are well known and commonly used in the art, and described in the references such as Sambrook J. et al. (1989), Molecular Cloning: A Laboratory Manual, Cold Spring Harbor and its 3rd Ed: (2001); Ausubel, F. M. (1987), Current Protocols in Molecular Biology, Greene Pub. Associates and Wiley Interscience; Ausubel, F. M. (1989). Short Protocols in Molecular Biology: A Compendium of Methods from Current Protocols in Molecular Biology, Greene Pub, Associates and wiley-Interscience; Innis, M. A. (1990). PCR Protocols: A Guide to Methods and Applications, Academic Press; Ausubel, F. M. (1992). Short Protocols in Molecular Biology: A Compendium of Methods from Current Protocols in Molecular Biology, Greene Pub, Associates; Ausubel, F. M. (1995). Short Protocols in Molecular Biology: A Compendium of Methods from Current Protocols in Molecular Biology, Greene Pub. Associates; Innis, M. A. et al. (1995); PCR Strategies, Academic Press, Ausubel, F. M. (1999). Short Protocols in Molecular Biology: A Compendium of Methods from Current Protocols in Molecular Biology, Wiley, and annual updates/Sninsky, J. J. et al. (1999). PCR Applications: Protocols for Functional Genomics, Academic Press; and a separate volume of Experimental Medicine "Experimental methods for gene transfer & expression analysis", Yodosha, 1997; and relevant part (or whole) of each reference is herein incorporated by reference.

(Notes)

In the present: specification, the term "or" is used when "at least one" of the matters listed in the text can be adopted. In the present specification, when specified as "within the range of" two values, the range also includes the two specific values.

References such as scientific literatures, patents, and patent applications cited herein are incorporated herein by reference in their entirety to the same extent as the content of each reference is specifically described herein.

The present disclosure has been described above with reference to preferred embodiments for ease of understanding. The present disclosure will be described below based on examples, "but the above: description and the following examples are provided for purposes of illustration only and not for the purpose of limiting the present disclosure.

Therefore, the scope of the present disclosure is not limited" to the embodiments or examples specifically described in the present specification, but is limited only by the scope of claims.

EXAMPLES

Examples are described below. The handling of organisms used in the following examples complied with the standards stipulated by Osaka University or regulatory agencies, if necessary. The reagents used in the examples are described below, but equivalents from other manufacturers (such as Sigma-Aldrich, FUJIFILM Wako Pure Chemical, Nacalai Tesque, R & D Systems, USCN Life Science INC, Thermo Fisher Scientific, Kanto Chemical, Funakoshi, Tokyo Chemical Industry, Merck) can also be used.
(Mice)

The following examples used $Apc^{Min/+}$ (C57BL/6J) mice (Jackson Laboratory, Bar Harbor, Maine, USA). The mice were bred in a specific microorganism-free (SPF) containment facility at the Institute of Experimental Animal Sciences, Osaka University medical school in compliance with the Osaka University Animal Experiment Regulations,
(Reagents)

The following examples used MAC class I ($H-2D^b$)-binding peptide: $WT1_{126-134}$ (RMPNAPYL, 9a.a) and MHC class TI ($H-2I-A^b$)-binding peptide $WT1_{35-52}$ (WAPVLDE-APPGASAYGSL, 18a.a.) purchased from SIGMA Genosys (Ishikari, Japan). The raw materials used in the mixture of the compound of formula (3) and the $WT1_{35-52}$ helper peptide were provided by Sumitomo Dainippon Pharma Co., Ltd. (Osaka, Japan). The peptides were stored at −20° C. until use: The peptides were dissolved in phosphate buffered saline (PBS; 137 mM NaCl, 2.7 mM KCL, 8.1 mM $Na_2HPO_4$, 1.47 mM $KH_2PO_4$) and stored at −20° C. Freund's Independent Adjuvant (IFA) and Montanide ISA 51 were purchased from Seppic S.A. (Orsay, France).

Example 1: Expression of WT1 Protein in Adenoma of Familial Adenomatous Polyposis This example shows that WT1 protein was expressed in adenoma of human patients with familial adenomatous polyposis,
(Experimental Methods)

The small and large intestines of human patients with familial adenomatous polyposis were fixed with formalin and embedded with paraffin, and the paraffin blocks were sliced to a thickness of 3 μm. To reduce endogenous peroxidase reaction, the paraffin sections were treated with 3% $H_2O_2$ solution, and then deparaffinized in xylene, and after stepwise rehydration with ethanol, for antigen retrieval, heated in 10 mM Tris EDTA buffer (10 mM Tris, 1 mM EDTA, pH 9.0) in an oil bath at 70° C. for 25 minutes and 110° C. for 25 minutes and cooled at room temperature for 3 hours. The treated sections were reacted overnight at 4° C. with anti-WT1 6FH2 mouse monoclonal antibody (Dako Cytomation, Inc., Carpinteria, CA) diluted 100-fold with PBST (PBS+0.05% Tween 20®). Then, the sections were treated with Dako REAL Envision HRP RABBIT/MOUSE (Dako Cytomation) at 37° C. for 30 minutes. Using Dako REAL Envision Detection System 15 Peroxidase/DAB+, Rabbit/Mouse (Dako Cytomation), WT1 protein was visualized according to the instruction manual. Then, the sections were stained with hematoxylin.

(Results)

The results of Example 1 are shown in Table 2 and FIG. 1. Table 2 shows the expression level of WT1 protein in adenomas, normal gland ducts and fibroblasts in specimens derived from each patient. Table 2 demonstrates that the expression level of WT1 protein in adenomas was significantly higher than that in normal gland ducts. In FIG. 1, the light staining indicates WT1 protein and the dark circular stained regions indicate nuclei. Expression of WT1 protein was observed in adenomas, but not in normal gland ducts.

TABLE 2

Familial adenomatous polyposis Immunostaining of WT1 protein in adenomas

| Case | Specimen No. | Adenomas | Normal gland ducts | Fibroblasts |
|---|---|---|---|---|
| Pt. 1 | #9 | + | + | +− |
| | #10 | + | +− | − |
| | #11 | ++ | −~+ | − |
| | #12 | ++ | ++ | − |
| | #13 | ++~+++ | +− | − |
| | #14 | ++ | + | − |
| Pt. 2 | #1 | ++~+++ | +− | − |
| | #3 | ++ | + | − |
| Pt. 3 | #16 | ++ | + | +− |
| | #19 | ++~+++ | +− | − |
| | #28 | ++ | +− | − |
| | #32 | ++ | ++ | − |
| Pt. 4 | #10 | ++~+++ | +− | − |
| | #13 | ++~+++ | ++ | +− |
| Pt. 5 | #9 | ++ | + | − |

Example 2: Expression of WT1 Protein in $APC^{Min/+}$ Mice

This example shows that WT1 protein was expressed in the small intestinal adenoma of $APC^{Min/+}$ mice, which are model mice for familial adenomatous polyposis.
(Experimental Methods)

The small and large intestine of 20-week-old $APC^{Min/+}$ (C57BL/6J) mice were fixed with formalin and embedded with paraffin, and the paraffin blocks were sliced to a thickness of 3 μm. The paraffin sections were deparaffinized with xylene, and after stepwise rehydration with ethanol, for antigen retrieval, irradiated with microwave in 10 mM citrate buffer (10 mM sodium citrate, 0.05% Tween 20, pH 6.0) for 15 minutes. The treated sections were reacted overnight at 4° C. with anti-WT1 6FH2 mouse monoclonal antibody (Dako Cytomation, Inc., Carpinteria, CA) diluted 100-fold with goat serum-containing PBS. Then, the sections were reacted with a biotinylated anti-mouse IgG antibody (Vector Labs., Burlingame, CA) diluted 100-fold with goat serum-containing PBS at 37° C. for 30 minutes. To reduce endogenous peroxidase reaction, the sections were treated with 3% $H_2O_2$ solution, and WT1 protein was visualized using Vectastain ABC kit (Vector Labs.) according to the instruction manual. Then, the sections were stained with hematoxylin.
(Results)

Figure 2:
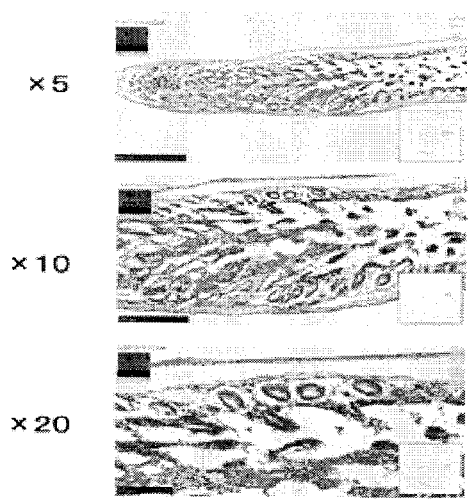
FIG. 2 is a micrograph showing the expression of WT1 protein in an $APC^{Min/+}$ mouse, Micrographs at 5×, 10×, and 20× magnifications are shown in order from the top. A scale bar is shown at the lower left of each photograph, and the lengths of 500 μm, 250 μm, and 100 μm are shown in order from the top. The lower right photograph of each tissue shows an enlarged area in the overall picture of the tissue. In all photographs, the dark staining indicates WT1 protein and the circular stained regions indicate nuclei.
Figure 3:
FIG. 3 is a micrograph showing the expression of WT1 protein in an $APC^{Min/+}$ mouse. The magnification is 40×, and a scale bar showing the length of 100 μm is shown in the lower left of the photograph. The dark staining indicates WT1 protein and the circular stained regions indicate nuclei.

The results of Example 2 are shown in FIGS. 2 and 3. FIG. 2 shows micrographs at 5×, 10×, and 20× magnifications in order from the top, and FIG. 3 shows micrographs at 40× magnification. In FIGS. 2 and 3, the dark staining indicates WT1 protein and the circular stained regions indicate nuclei. Expression of WT1 protein was observed in small intestinal adenomas of $APC^{Min/+}$ mice, which are model mice for familial adenomatous polyposis.

Example 3: Administration of WT1 Peptide Vaccine to Familial Adenomatous Polyposis Model Mice This example shows the administration scheme of the experiment that administered a WT1 peptide vaccine to $APC^{Min/+}$ mice.

(Experimental Methods)

Figure 4:
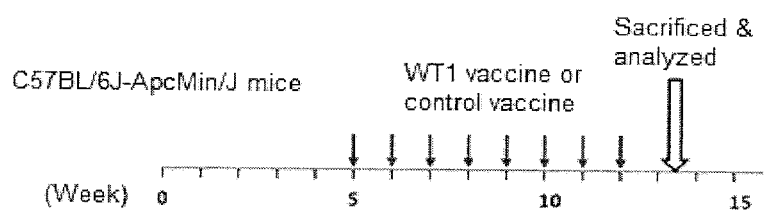
FIG. 4 shows the administration scheme of the experiment that administered a WT1 peptide vaccine to $APC^{Min/+}$ mice. The upper horizontal axis shows the age in weeks of $APC^{Min/+}$ mice, the time point of vaccination and the time point of euthanasia for analysis. On the upper horizontal axis, the lower numbers indicate the age in weeks of the mice, the upper short arrows indicate the time points when the vaccine was administered, and the upper long arrows indicate the time points when the mice were euthanized and subjected to analysis. The compositions of the WT1 vaccine and the control vaccine are shown below the horizontal axis.

The administration scheme of the WT1 peptide vaccine is shown in FIG. 4. A mixture of 100 g of $WT1_{126\text{-}134}$ killer peptide and 45 µg of $WT1_{35\text{-}52}$ helper peptide or PBS was emulsified with IFA Montanide ISA51 adjuvant to obtain a WT1 peptide vaccine or a control vaccine. The WT1 peptide vaccine or control vaccine was intradermally administered to the flanks of 4 to 5 week-old $APC^{Min/+}$ mice. Immunization was started from the 5th week after birth and performed 8 times at a frequency of once a week. The immunized mice were euthanized 10 days after the final immunization for further analysis. The administration of the WT1 peptide vaccine did not cause organ damage, as shown in Table 3 below.

TABLE 3

No difference between the two groups in body weight and organ weight (no organ damage with WT1 vaccine)

|  | Body weight (g) | Organ weight (g) | |
| --- | --- | --- | --- |
|  |  | Liver | Spleen |
| WT1 vaccine group (n = 11) | 22.3 | 1.07 | 0.13 |
| Control group (n = 11) | 22.5 | 1.06 | 0.12 |
| t-test | 0.80 | 0.90 | 0.731 |

Example 4: Prevention and Treatment of Adenoma by Administration of WT1 Peptide Vaccine This example shows that administration of a WT1 peptide vaccine to $APC^{Min/+}$ mice prevented the development of adenoma and treated adenoma.

(Experimental Methods)

The mice obtained according to the administration scheme described in Example 3 were used. The whole intestines were collected from the euthanized mice 10 days after the final immunization. The small intestine was divided into 8 to 10 fractions, and the large intestine was divided into the cecum and the ascending colon. Each fraction was vertically incised, washed with PBS, sandwiched between filter papers, and fixed in 4% paraformaldehyde/phosphate buffer at 4° C. for 24 hours or longer. The fixed intestinal tissue was stained with 1% methylene blue solution and then observed under a stereomicroscope for counting of the number of adenomas (polyps). The difference in the number of adenomas (polyps) between the WT1 peptide vaccine-administered group and the control vaccine-administered group was statistically analyzed by Student's t-test.

(Results)

Figure 5:
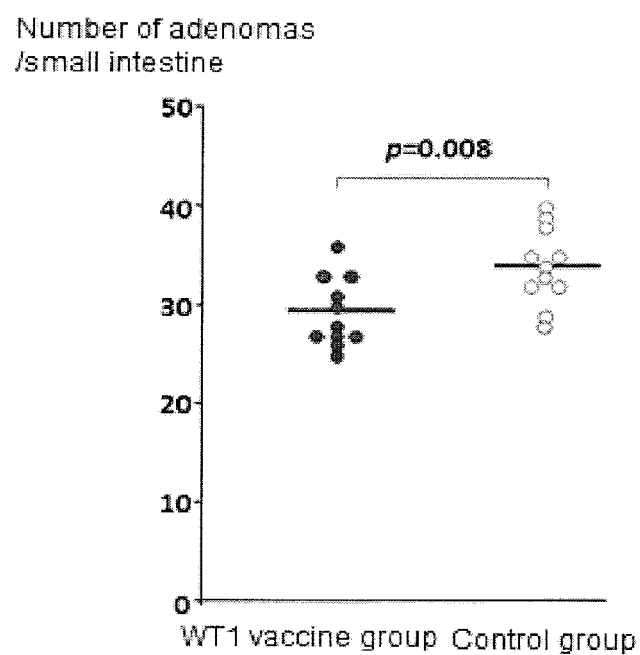
FIG. 5 is a graph showing the suppression of the development of adenoma by administration of the WT1 peptide vaccine. The vertical axis of the graph indicates the number of adenomas per small intestine, and the scatter plot on the left indicates the results of $APC^{Min/+}$ mice that received the WT1 peptide vaccine and the right scatter plot indicates the results of $APC^{Min/+}$ mice that received the control vaccine. The horizontal line in each scatter plot shows the mean value, and the result of the significance test is shown at the top of the graph.

The results of Example 4 are shown in FIG. 5. The horizontal axis of the graph shows the group that received the WT1 vaccine on the left side, and the group that received the control vaccine on the right side, and the vertical axis shows the number of adenomas per small intestine. The average number of adenomas per small intestine was about 29 in the WT1 peptide vaccine-administered group, whereas it was about 34 in the control vaccine-administered group, indicating that the administration of the WT1 peptide vaccine significantly suppressed the development of adenoma, and also treated the adenoma.

Example 5: Increase in WT1 Tetramer$^+$CD3$^+$ CD8$^+$T Cells by Administration of WT1 Peptide Vaccine This example shows that administration of a WT1 peptide vaccine to $APC^{Min/+}$ mice increased WT1 tetramer$^+$CD3$^+$CD8$^+$T cells.

(Experimental Methods)

The mice obtained according to the administration scheme described in Example 3 were used. Spleen cells were collected from the euthanized mice 10 days after the final immunization. After lysis of erythrocytes, the cells are stained with H-2D$^b$ WT1 tetramer (MBL, Aichi, Japan), and further with an anti-mouse CD3 antibody (17A2, BioLegend, San Diego, CA) and an anti-mouse CD8 antibody (KT15, MBL, Aichi, Japan). The stained cells were analyzed by FACSCanto, and the frequency of H-2D$^b$ WT1 tetramer$^+$CD3$^+$CD8$^+$T cells in CD3$^+$CD8$^+$T cells was measured. The difference in the frequency of H-2D$^b$ WT1 tetramer$^+$CD3$^+$CD8$^+$T cells between the WT1 peptide vaccine-administered group and the control vaccine-administered group was statistically analyzed by Student's t-test.

(Results)

Figure 6:
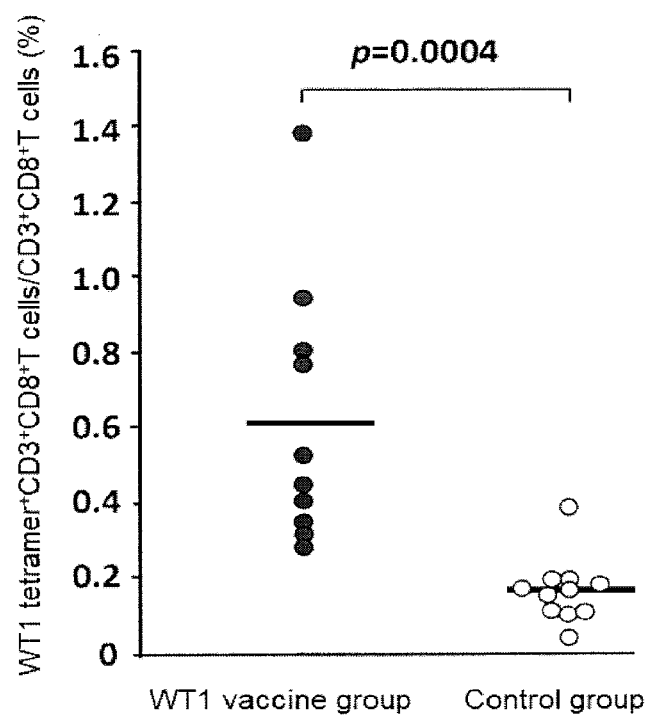
FIG. 6 is a graph showing that administration of the WT1 peptide vaccine increased WT1 tetramer$^+$CD3$^+$CD8$^+$T cells. The vertical axis of the graph shows the frequency of H-2D$^b$ WT1 tetramer$^+$CD3$^+$CD8$^+$T cells in CD3$^+$CD8$^+$T cells, and the scatter plot on the left shows the results of $APC^{Min/+}$ mice that received the WT1 peptide vaccine and the scatter plot on the right shows the results of $APC^{Min/+}$ mice that received the control vaccine. The horizontal line in each scatter plot shows the mean value, and the result of the significance test is shown at the top of the graph.
Figure 7:
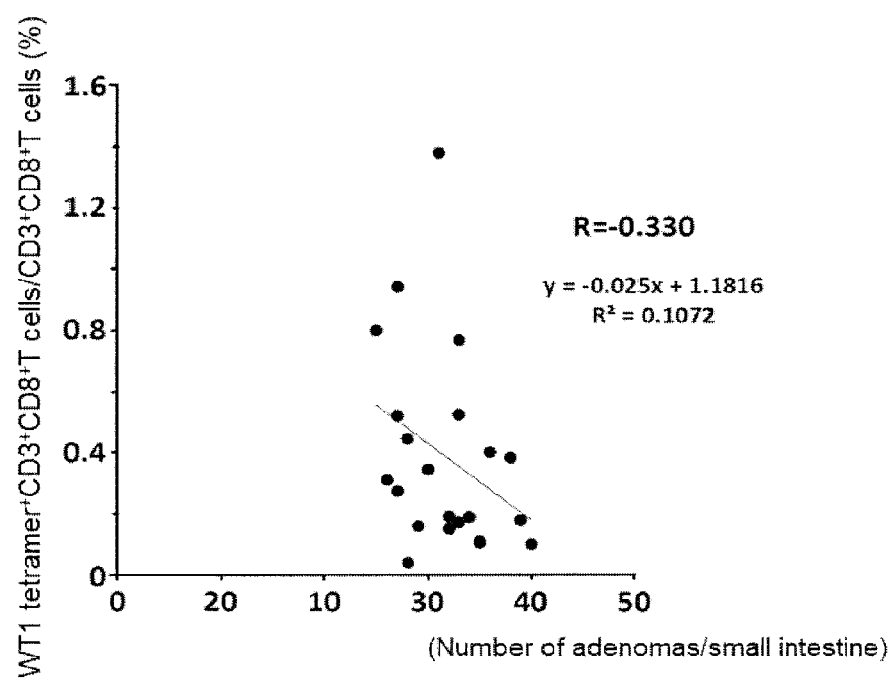
FIG. 7 is a graph showing regression analysis between the WT1 peptide vaccine-administered group and the control vaccine-administered group. The vertical axis indicates the frequency of H-2D$^b$ WT1 tetramer$^+$CD3$^+$CD8$^+$T cells in CD3$^+$CD8$^+$T cells, and the horizontal axis indicates the number of adenomas per small intestine. Each point is a graph plot of the number of adenomas and the frequency of WT1 tetramer$^+$CD3$^+$CD8$^+$T cells between the WT1 peptide vaccine-administered group and the control vaccine-administered group. The straight line in the graph shows the regression line, and the correlation coefficient (R), the function formula of the regression line, and the coefficient of determination ($R^2$) are shown on the right side in order from the top.

The results of Example 5 are shown in FIG. 6. The horizontal axis of the graph shows the group that received the WT1 peptide vaccine on the left side, and the group that received the control vaccine on the right side, and the vertical axis shows the frequency of H-2D$^b$ WT1 tetramer in CD3$^+$CD8$^+$ cells. The average number of the frequency of H-2D$^b$ WT1 tetramer$^+$CD3$^+$CD8$^+$T cells was about 0.6% in the WT1 vaccine-administered group, whereas it was about 0.2% in the control vaccine-administered group, indicating that the administration of the WT1 vaccine increased WT1 tetramer$^+$CD3$^+$CD8$^+$T cells.

Example 6: Statistical Analysis

This example shows that a correlation was observed between the number of adenomas in Example 4 and the WT1 tetramer$^+$CD3$^+$CD8$^+$T cells in Example 5.

(Experimental Methods)

The number of adenomas per small intestine obtained from Example 4 and the frequency of H-2D$^b$ WT1 tetramer$^+$CD3$^+$CD8$^+$T cells in CD3$^+$CD8$^+$T cells obtained from Example 5 were plotted on a scatter diagram by Microsoft Excel®. Further, for these results, a correlation was statistically analyzed by the Pearson correlation coefficient in Excel.

(Results)

It was found from the results of Example 6 that the differences in the number of adenomas (polyps) and in the frequency of WT1 tetramer between the WT1 peptide vaccine-administered group and the control vaccine-administered group showed a correlation, although it is weak.

Example 7: Examples with Single Agents

This example shows a comparison of the effect of preventing the development of adenoma and treating adenoma in $APC^{Min/+}$ mice between the group that receives both a killer type WT1 peptide vaccine and a helper type WT1 peptide vaccine and the group that receives a killer type WT1 peptide vaccine or a helper type WT1 peptide vaccine alone.

(Experimental Methods)

Figure 8:
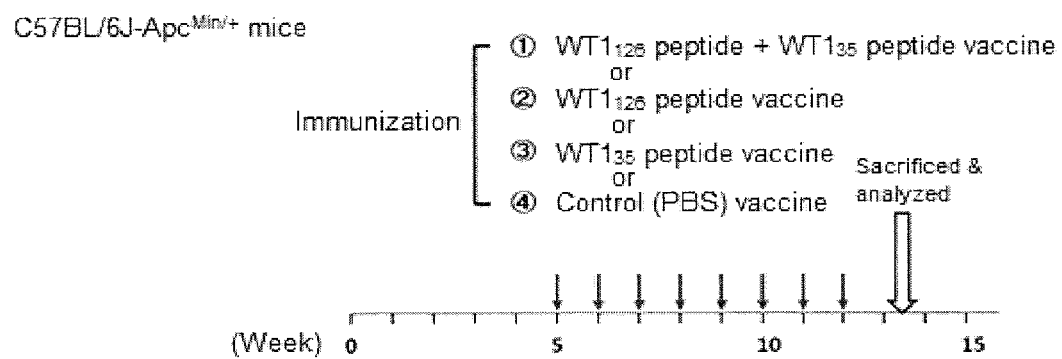
FIG. 8 shows the administration scheme of the experiment that administers a WT1 peptide vaccine to $APC^{Min/+}$ mice. The upper horizontal axis shows the age in weeks of $APC^{Min/+}$ mice, point of vaccination and the time point of the time euthanasia for analysis. On the upper horizontal axis, the lower numbers indicate the age in weeks of the mice, the upper short arrows indicate the time points when the vaccine is administered, and the upper long arrows indicate the time points when the mice are euthanized and subjected to analysis. The compositions of the WT1 vaccine and the control vaccine are shown below the horizontal axis.

The administration scheme of the WT1 peptide vaccine is shown in FIG. 8. A mixture of 100 μg of $WT1_{126-134}$ killer peptide and 45 μg of $WT1_{35-62}$ helper peptide, 100 μg of $WT1_{126-134}$ killer peptide alone, 45 μg of $WT1_{35-52}$ helper peptide alone, and PBS are emulsified with IFA Montanide ISA51 adjuvant, respectively. The mixture of the killer peptide and the helper peptide, the killer peptide alone, the helper peptide alone, or PBS-only control vaccine is intradermally administered to the flanks of 5 week-old $APC^{Min/+}$ mice. Immunization is started from the 5th week after birth and performed 8 times at a frequency of once a week. The immunized mice are euthanized 10 days after the final immunization for further analysis.

Example 8: Expression of WT1 in Other Benign Tumors

This example shows that WT1 is also expressed in non-hereditary colorectal adenoma.

(Experimental Methods)

Adenoma tissues were excised from human patients (3 patients) who developed non-hereditary colorectal adenoma, and the WT1 protein and nucleus were stained by the same methods as in Example 1.

(Results)

Figure 9:
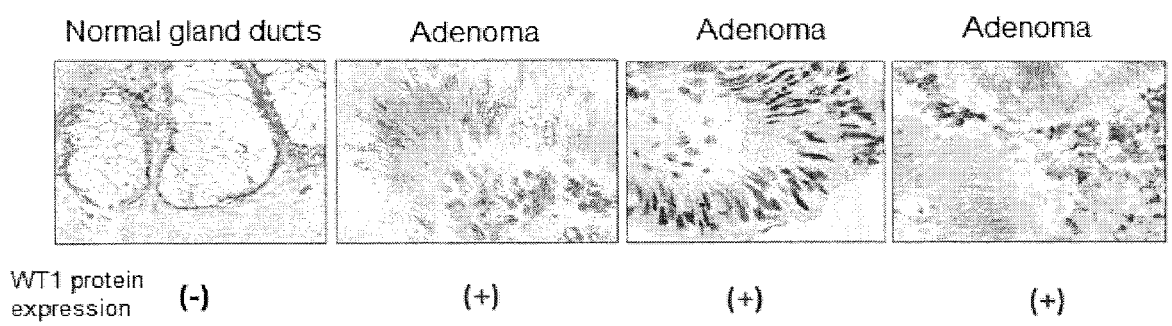
FIG. 9 shows micrographs showing the expression of WT1 protein in adenomas of human non-hereditary colorectal adenomatous patients. The first photograph from the left is the one of normal gland ducts, and the three photographs on the right are those of adenoma tissues obtained from three non-hereditary colorectal adenomatous patients. In all photographs, the light staining indicates WT1 protein and the dark circular or oval stained regions indicate nuclei. The expression level of WT1 protein is shown below each photograph, and the symbol (−) indicates that the expression level is low and the symbol (+) indicates that the expression level is high.

The results of Example 8 are shown in FIG. 9. In FIG. 9, the first from the left shows a microscopic image of normal gland ducts, and the three images on the right show microscopic images of adenoma tissues of non-hereditary colorectal adenoma. In FIG. 9, the light staining indicates WT1 protein and the dark circular or oval stained regions indicate nuclei. Expression of WT1 protein was observed in adenomas, but not in normal gland ducts.

Example 9: Administration of a Mixture of the Compound of Formula (3) and $WT1_{35-52}$ Helper Peptide to Familial Adenomatous Polyposis Model Mice This example shows the administration scheme of the experiment that administered a mixture of the compound of formula (3) and $WT1_{35-52}$ helper peptide to $APC^{Min/+}$ mice.

(Experimental Methods)

Figure 10:
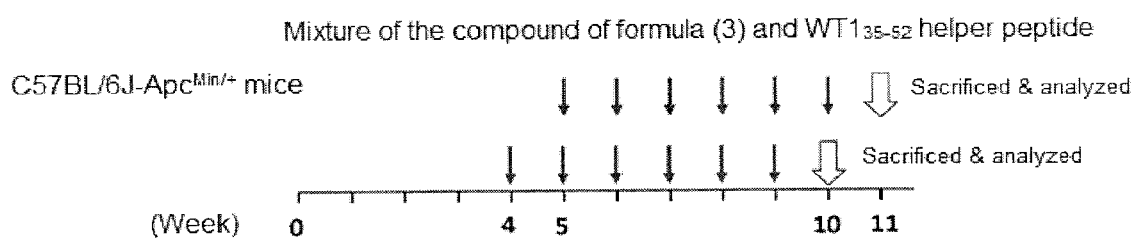
FIG. 10 shows the administration scheme of the experiment that administered mixture of the compound herein represented by the formula (3) and the $WT1_{35}$ helper peptide to $APC^{Min/+}$ mice. The horizontal axis shows the age in weeks of $APC^{Min/+}$ mice, the time point of vaccination and the time point of euthanasia for analysis. On the horizontal axis, the lower numbers indicate the age in weeks of the mice, and the upper arrows indicate the time points when the vaccine was administered and those when the mice were euthanized and subjected to analysis.

The administration scheme of the WT1 peptide vaccine is shown in FIG. 10. The WT1 peptide vaccine was dissolved with PBS, and the solution containing the WT1 peptide vaccine or PBS alone was emulsified with the IFA Montanide ISA51 adjuvant to give a WT1 peptide vaccine or a control vaccine. The WT1 peptide vaccine or control vaccine was intradermally administered to the flanks of 4 to 5 week-old $APC^{Min/+}$ mice. Immunization was started from the 4th to 5th week after birth and performed 6 times at a frequency of once a week. The immunized mice were euthanized 7 days after the final immunization for further analysis.

Example 10: Prevention and Treatment of Adenoma by Administration of a Mixture of the Compound of Formula (3) and $WT1_{35-52}$ Helper Peptide This example shows that administration of a mixture of the compound of formula (3) and $WT1_{35-52}$ helper peptide to $APC^{Min/+}$ mice prevented the development of adenoma and treated adenoma. The administration of the mixture of the compound of formula (3) and $WT1_{35-52}$ helper peptide did not cause organ damage as shown in Table 4 below.

TABLE 4

No difference between the two groups in body weight and organ weight (no organ damage with WT1 vaccine)

|  | Body weight (g) | Organ weight (g) Liver | Spleen |
|---|---|---|---|
| WT1 vaccine group (n = 6) | 23.0 | 1.19 | 0.22 |
| Control group (n = 6) | 21.6 | 1.08 | 0.22 |
| t-test | 0.37 | 0.34 | 0.98 |

(Experimental Methods)

The mice obtained according to the administration scheme described in Example 9 were used. Organs were removed from euthanized mice 7 days after the final immunization and weighed. The small intestine was divided into 8-10 fractions. Each fraction was vertically incised, washed with PBS, sandwiched between filter papers, and fixed in 4% paraformaldehyde/phosphate buffer at 4° C. for 24 hours or longer. The fixed intestinal tissue was stained with 1% methylene blue solution and then observed under a stereomicroscope for counting of the number of adenomas (polyps). The difference in the number of adenomas (polyps) between the WT1 peptide vaccine-administered group and the control vaccine-administered group was statistically analyzed by Student's t-test.

(Results)

Figure 11:
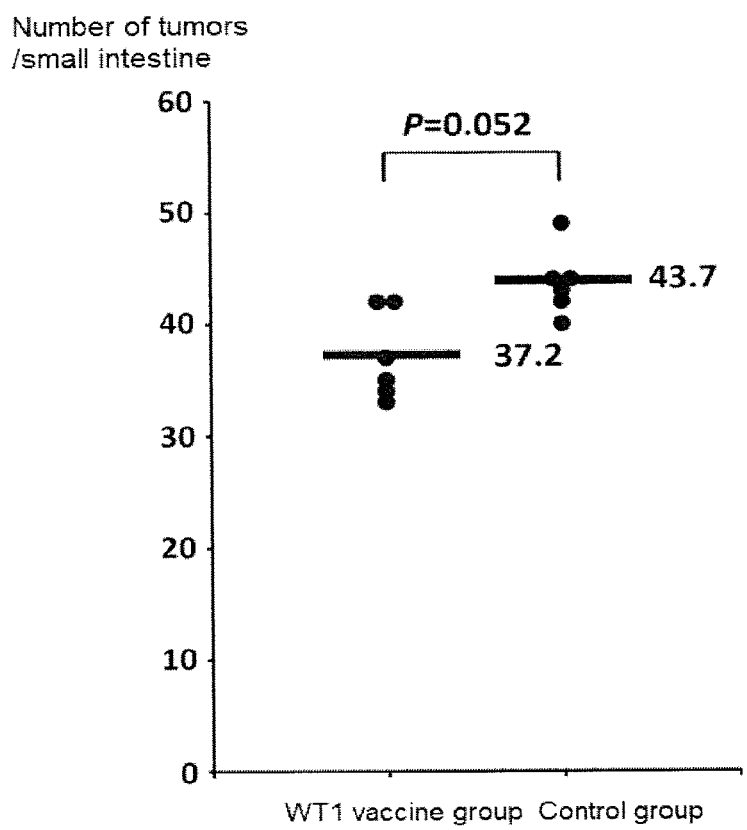
FIG. 11 is a graph showing the suppression of the development of adenoma by administration of a mixture of the compound herein represented by the formula (3) and $WT1_{35}$ helper peptide. The vertical axis of the graph indicates the number of adenomas per small intestine, and the scatter plot on the left indicates the results of $APC^{Min/+}$ mice that received the WT1 peptide vaccine and the scatter plot on the right indicates the results of $APC^{Min/+}$ mice that received the control vaccine. The horizontal line in each scatter plot shows the mean value, and the result of the significance test is shown at the top of the graph.

The results of Example 10 are shown in FIG. 11. The horizontal axis of the graph shows the group that received the WT1 peptide vaccine on the left side, and the group that received the control vaccine on the right side, and the vertical axis shows the number of adenomas per small intestine. The average number of adenomas per small intestine in the WT1 peptide vaccine-administered group was about 37.2, whereas it was about 43.7 in the control vaccine-administered group. Therefore, administration of the WT1 peptide vaccine appeared to suppress the development of adenoma and also treat the adenoma.

Example 11: Increase in WT1 Tetramer$^+$CD3$^+$ CD8$^+$T Cells by Administration of a Mixture of the Compound of Formula (3) and $WT1_{35-52}$ Helper Peptide This example shows that administration of a mixture of the compound of formula (3) and $WT1_{35-52}$ helper peptide to $APC^{Min/+}$ mice increased WT1 tetramer CD3$^+$CD8$^+$T cells.

(Experimental Methods)

The mice obtained according to the administration scheme described in Example 9 were used. Spleen cells were collected from the euthanized mice 7 days after the final immunization. After lysis of erythrocytes, the cells are stained with H-2D$^b$ WT1 tetramer (MBL, Aichi, Japan), and further with an anti-mouse CD3 antibody (17A2, BioLegend, San Diego, CA), an anti-mouse CD8 antibody (KT15, MBL, Aichi, Japan) and 7-AAD Viability Staining Solution (Bioscience, San Diego, CA). The stained cells were analyzed by FACSCanto, 7-AAD$^+$ dead cell fraction was removed, and the frequency of H-2D$^b$ WT1 tetramer$^+$CD3$^+$ CD8$^+$T cells in CD3$^+$CD8$^+$T cells was measured. The difference in the frequency of H-2D$^b$ WT1 tetramer$^+$CD3$^+$ CD8$^+$T cells between the WT1 peptide vaccine-administered group and the control vaccine-administered group was statistically analyzed by Student's t-test.

(Results)

Figure 12:
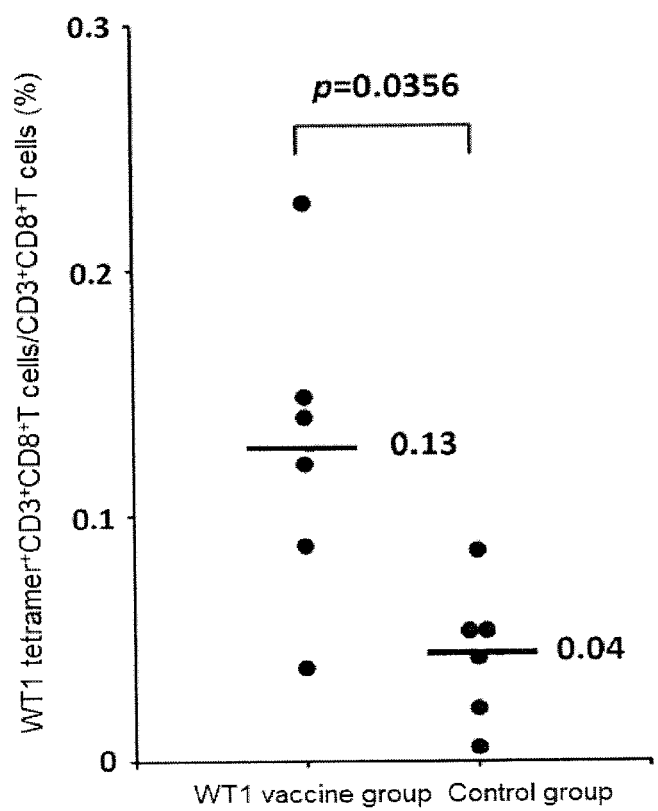
FIG. 12 graph showing the increase of WT1 tetramer$^+$ $CD3^+CD8^+T$ cells by administration of a mixture of the compound herein represented by the formula (3) and $WT1_{35}$ helper peptide. The vertical axis of the graph indicates the frequency of $H-2D^b$ WT1 tetramer$^+CD3^+CD8^+T$ cells in $CD3^+CD8^+$ cells, and the scatter plot on the left shows the results of $APC^{Min/+}$ mice that received the mixture of the compound herein represented by the formula (3) and $WT1_{35}$ helper peptide and the scatter plot on the right shows the results of $APC^{Min/+}$ mice that received the control vaccine. The horizontal line in each scatter plot shows the mean value, and the result of the significance test is shown at the top of the graph.
Figure 13:
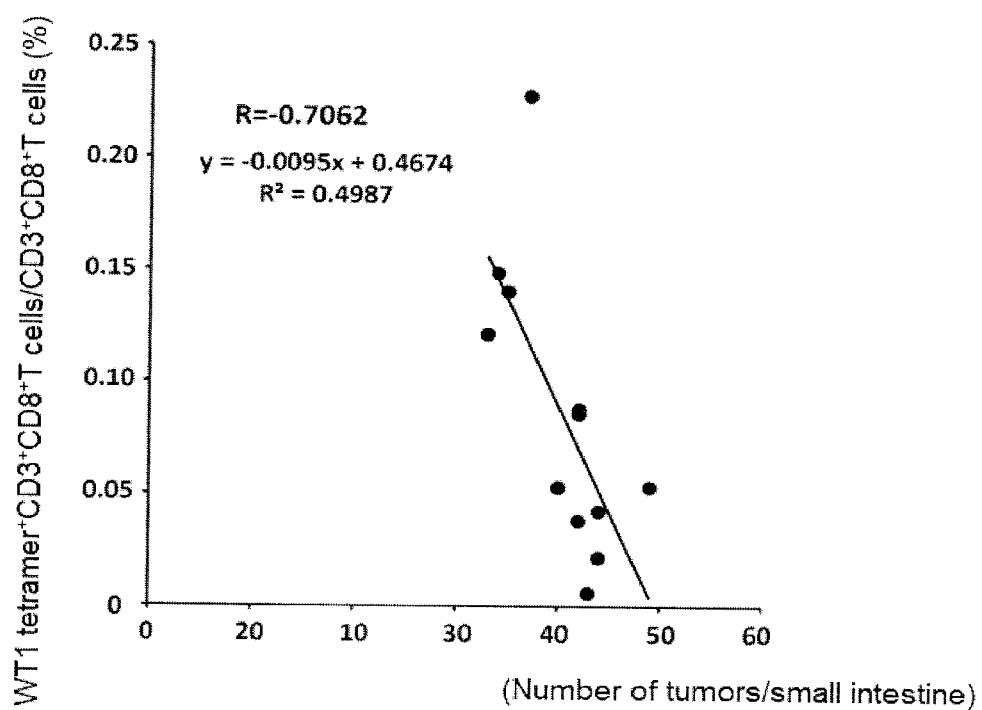
FIG. 13 is a graph showing regression analysis between the group that received the mixt of the compound herein represented by the formula (3) and $WT1_{35}$ helper peptide and the group that received the control vaccine. The vertical axis of the graph indicates the frequency of $H-2D^b$ WT1 tetramer$^+CD3^+CD8^+T$ cells in $CD3^+CD8^+T$ and the horizontal axis indicates the number of adenomas per small intestine. Each point is a graph plot of the number of adenomas and the frequency of WT1 tetramer $CD3^+CD8^+T$ cells between the group that received the mixture of the compound herein represented by the formula (3) and $WT1_{35}$ helper peptide and the group that received the control vaccine. The straight line in the graph shows the regression line, and the correlation coefficient (R), the function formula of the regression line, and the coefficient of determination ($R^2$) are shown on the right side in order from the top.

The results of Example 11 are shown in FIG. 12, The horizontal axis of the graph shows the group that received the WT1 peptide vaccine on the left side, and the group that received the control vaccine on the right side, and the vertical axis shows the frequency of H-2D$^b$ WT1 tetramer in CD3$^+$CD8$^+$ cells. The average number of the frequency of H-2D$^b$ WT1 tetramer$^+$CD3$^+$CD8$^+$ cells in CD3$^+$CD8$^+$ cells was about 0.13% in the WT1 vaccine-administered group, whereas it was about 0.04% in the control vaccine-administered group, indicating that the administration of the WT1 peptide vaccine increased WT1 tetramer$^+$CD3$^+$CD8$^+$T cells.

Example 12: Statistical Analysis

This example shows that a correlation was observed between the number of adenomas in Example 10 and the WT1 tetramer$^+$CD3$^+$CD8$^+$T cells in Example 11.
(Experimental Methods)

The number of adenomas per small intestine obtained from Example 10 and the frequency of H-2D$^b$ WT1 tetramer$^+$CD3$^+$CD8$^+$T cells in CD3$^+$CD8$^+$T cells obtained from Example 11 were plotted on a scatter diagram by Microsoft Excel®. Further, for these results, Correlation was the statistically analyzed by Pearson Correlation coefficient in Excel.
(Results)

It was found from the results of Example 12 that the differences in the number of adenomas (polyps) and in the frequency of WT1 tetramer between the WT1 peptide vaccine-administered group and the control vaccine-administered group showed a high correlation, demonstrating that WT1-specific immunity has a strong effect on suppression of tumors.
(Notes)

Although the present disclosure illustrates preferred embodiments of the present disclosure in the above, it is understood that the scope of the present disclosure should be construed only by the claims. It is understood that the patents, patent applications and other documents cited herein should be incorporated herein by reference in their entirety to the same extent as the contents of the references are specifically described herein. This application is accompanied by priority claim for Japanese Patent Application No. 2018-190461 submitted to the Japan Patent Office on Oct. 5, 2018, and it is understood that all of the prior application should be incorporated herein by reference.

INDUSTRIAL APPLICABILITY

The present disclosure is useful for preventing, benign (e.g. familial delaying and treating tumor adenomatous polyposis), and for preventing, delaying and treating of symptoms resulting from adenoma of a benign tumor (e.g. familial adenomatous polyposis), The WT1 peptide vaccine of the present disclosure is useful in that it enables us to avoid surgery such as endoscopic resection, and it is extremely safe having no serious side effects.

SEQUENCE LISTING FREE TEXT

SEQ ID NO: 1 Full-length amino acid sequence of human WT1 protein
SEQ ID NO: 2 Amino acid sequence of human WT1$_{126}$ peptide
SEQ ID NO: 3 Amino acid sequence of human WT1$_{235}$ peptide
SEQ ID NO: 4 Amino acid sequence of human WT1$_{35}$ peptide
SEQ ID NO: 5 Amino acid sequence of human WT1$_{332}$ peptide
SEQ ID NO: 6 Amino acid sequence of human WT1$_{126}$ P1G peptide
SEQ ID NO: 7 Amino acid sequence of human WT1$_{126}$ P1A peptide
SEQ ID NO: 8 Amino acid sequence of human WT1$_{126}$ P1V peptide
SEQ ID NO: 9 Amino acid sequence of human WT1$_{126}$ P1L peptide
SEQ ID NO: 10 Amino acid sequence of human WT1$_{126}$ P1I peptide
SEQ ID NO: 11 Amino acid sequence of human WT1$_{126}$ P1M peptide
SEQ ID NO: 12 Amino acid sequence of human WT1$_{126}$ P1W peptide
SEQ ID NO: 13 Amino acid sequence of human WT1$_{126}$ P1F peptide
SEQ ID NO: 14 Amino acid sequence of human WT1$_{126}$ P1Y peptide
SEQ ID NO: 15 Amino acid sequence of human WT1$_{126}$ P2V peptide
SEQ ID NO: 16 Amino acid sequence of human WT1$_{126}$ P2Q peptide
SEQ ID NO: 17 Amino acid sequence of human WT1$_{126}$ P2A peptide
SEQ ID NO: 18 Amino acid sequence of human WT1$_{126}$ P2L peptide
SEQ ID NO: 19 Amino acid sequence of human WT1$_{126}$ P2I peptide
SEQ ID NO: 20 Amino acid sequence of human WT1$_{126}$ P3I peptide
SEQ ID NO: 21 Amino acid sequence of human WT1$_{126}$ P3L peptide
SEQ ID NO: 22 Amino acid sequence of human WT1$_{126}$ P3G peptide
SEQ ID NO: 23 Amino acid sequence of human WT1$_{126}$ P3A peptide
SEQ ID NO: 24 Amino acid sequence of human WT1$_{126}$ P3V peptide
SEQ ID NO: 25 Amino acid sequence of human WT1$_{126}$ P3M peptide
SEQ ID NO: 26 Amino acid sequence of human WT1$_{126}$ P3P peptide 26
SEQ ID NO: 27 Amino acid sequence of human WT1$_{126}$ P3W peptide
SEQ ID NO: 28 Amino acid sequence of human WT1$_{126}$ P9V peptide
SEQ ID NO: 29 Amino acid sequence of human WT1$_{126}$ P9A peptide
SEQ ID NO: 30 Amino acid sequence of human WT1$_{126}$ P9I peptide
SEQ ID NO: 31 Amino acid sequence of human WT1$_{126}$ P9M peptide
SEQ ID NO: 32 Amino acid sequence of human WT1$_{126}$ P1D peptide
SEQ ID NO: 33 Amino acid sequence of human WT1$_{126}$ P1E peptide
SEQ ID NO: 34 Amino acid sequence of human WT1$_{126}$ P1H peptide
SEQ ID NO: 35 Amino acid sequence of human WT1$_{126}$ P1K peptide
SEQ ID NO: 36 Amino acid sequence of human WT1$_{126}$ P1N peptide SEQ ID NO: 37 Amino acid sequence of human $WT1_{126}$ P1P peptide
SEQ ID NO: 38 Amino acid sequence of human $WT1_{126}$ P1Q peptide
SEQ ID NO: 39 Amino acid sequence of human $WT1_{126}$ P1S peptide
SEQ ID NO: 40 Amino acid sequence of human $WT1_{126}$ P1T peptide
SEQ ID NO: 41 Amino acid sequence of human $WT1_{126}$ P2I & P9I peptide
SEQ ID NO: 42 Amino Acid Sequence of human $WT1_{126}$ P2I & P9V peptide
SEQ ID NO: 43 Amino acid sequence of human $WT1_{126}$ P2L & P9I peptide
SEQ ID NO: 44 Amino acid sequence of human $WT1_{126}$ P2L & P9V peptide
SEQ ID NO: 45 Amino acid sequence of human $WT1_{238m}$ peptide
SEQ ID NO: 46 Amino acid sequence of a variant of human $WT1_{125}$ peptide
SEQ ID NO: 47 Amino acid sequence of a variant of human $WT1_{235}$ peptide
SEQ ID NO: 48 Amino acid sequence of a variant of human $WT1_{235}$ peptide
SEQ ID NO: 49 Amino acid sequence of a variant of human $WT1_{235}$ peptide
SEQ ID NO: 50 Amino acid sequence of a variant of human $WT1_{35}$ peptide
SEQ ID NO: 51 Amino acid sequence of a variant of human $WT1_{35}$ peptide
SEQ ID NO: 52 Amino acid sequence of human $WT1_{30}$ peptide
SEQ ID NO: 53 Amino acid sequence of human $WT1_{187}$ peptide
SEQ ID NO: 54 Amino acid sequence of a variant of human $WT1_{125}$ peptide
SEQ ID NO: 55 Amino acid sequence of a variant of human $WT1_{235}$ peptide
SEQ ID NO: 56 Amino acid sequence of a variant of human $WT1_{235}$ peptide
SEQ ID NO: 57 Amino acid sequence of a variant of human $WT1_{235}$ peptide
SEQ ID NO: 58 Amino acid sequence of a variant of human $WT1_{10}$ peptide
SEQ ID NO: 59 Amino acid sequence of a variant of human $WT1_{187}$ peptide
SEQ ID NO: 60 Amino acid sequence of a variant of human $WT1_{187}$ peptide
SEQ ID NO: 61 Amino acid sequence of a variant of human $WT1_{125}$ peptide
SEQ ID NO: 62 Amino acid sequence of a variant of human $WT1_{122}$ peptide
SEQ ID NO: 63 Amino acid sequence of a variant of human $WT1_{35}$ peptide
SEQ ID NO: 64 Amino acid sequence of a variant of human $WT1_{35}$ peptide
SEQ ID NO: 65 Amino acid sequence of a variant of human $WT1_{35}$ peptide
SEQ ID NO: 66 Amino acid sequence of a variant of human $WT1_{35}$ peptide
SEQ ID NO: 67 Amino acid sequence of a variant of human $WT1_{35}$ peptide
SEQ ID NO: 68 Amino acid sequence of a variant of human $WT1_{37}$ peptide
SEQ ID NO: 69 Amino acid sequence of a variant of human $WT1_{122}$ peptide
SEQ ID NO: 70 Amino acid sequence of a variant of human $WT1_{122}$ peptide
SEQ ID NO: 71 Amino acid sequence of a variant of human $WT1_{122}$ peptide
SEQ ID NO: 72 Amino acid sequence of a variant of human $WT1_{122}$ peptide

The invention claimed is:

1. A method for treating a benign tumor expressing WT1 selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in a subject, the method comprising:
    administering to the subject an effective amount of a peptide selected from the group consisting of
    RMFPNAPYL of SEQ ID NO: 2,
    RYFPNAPYL of SEQ ID NO: 46,
    YMFPNAPYL of SEQ ID NO: 14,
    CYTWNOMNL of SEQ ID NO: 45,
    CMTWNQMNL of SEQ ID NO: 3,
    C-CYTWNQMNL of SEQ ID NO: 47 wherein C-C shown in the formula means that the C residues are linked together by a disulfide bond, and
    C-CMTWNQMNL of SEQ ID NO: 48 wherein C-C shown in the formula means that the C residues are linked together by a disulfide bond.

2. The method according to claim 1, wherein the method comprises administering a peptide selected from the group consisting of

```
RMFPNAPYL of SEQ ID NO: 2,

RYFPNAPYL of SEQ ID NO: 46,

YMFPNAPYL of SEQ ID NO: 14,

CYTWNQMNL of SEQ ID NO: 45,
and

CMTWNQMNL of SEQ ID NO: 3.
```

3. A method for treating a benign tumor expressing WT1 selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in a subject, the method comprising:
    administering to the subject an effective amount of a conjugate of formula (2) or a conjugate of formula (3),

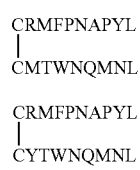

wherein C-C shown in the formulas (2) and (3) means that the C residues are linked together by a disulfide bond.

4. The method 3, wherein the method comprises administering the conjugate of formula (3),

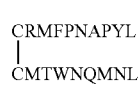

5. The method according to claim 1, further comprising: administering at least one peptide selected from the group consisting of

```
WAPVLDFAPPGASAYGSL of SEQ ID NO: 4,

CWAPVLDFAPPGASAYGSL of SEQ ID NO: 50
and

WAPVLDFAPPGASAYGSLC of SEQ ID NO: 51.
```

6. The method according to claim 3, wherein the method comprises administering the conjugate of formula (2), and a peptide WAPVLDFAPPGASAYGSL of SEQ ID NO: 4.

7. The method according to claim 4, wherein the method comprises administering the conjugate of formula (3), and a peptide WAPVLDFAPPGASAYGSL of SEQ ID NO: 4.

8. The method according claim 1, wherein the method further comprises administering an adjuvant.

9. The method according to claim 8, wherein the adjuvant is Montanide® ISA51 adjuvant.

10. The method according to claim 1, wherein the benign tumor is selected from the group consisting of familial adenomatous polyposis, and non-hereditary colorectal adenoma.

11. The method according to claim 10, wherein the benign tumor is familial adenomatous polyposis.

12. The method according to claim 1, wherein the administering is once a week.

13. A method for treating a benign tumor expressing WT1 selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in a subject, the method comprising:
    administering to the subject an effective amount of a nucleic acid molecule encoding a peptide selected from the group consisting of
    RMFPNAPYL of SEQ ID NO: 2,
    RYFPNAPYL of SEQ ID NO: 46,
    YMFPNAPYL of SEQ ID NO: 14,
    CYTWNQMNL of SEQ ID NO: 45,
    CMTWNQMNL of SEQ ID NO: 3,
    C-CYTWNQMNL of SEQ ID NO: 47 wherein C-C shown in the formula means that the C residues are linked together by a disulfide bond, and
    C-CMTWNQMNL of SEQ ID NO: 48 wherein C-C shown in the formula means that the C residues are linked together by a disulfide bond.

14. The method according to claim 13, wherein the nucleic acid molecule includes RNA and/or DNA.

15. The method according to claim 13, wherein the benign tumor is selected from the group consisting of familial adenomatous polyposis, and non-hereditary colorectal adenoma.

16. The method according to claim 15, wherein the benign tumor is familial adenomatous polyposis.

17. The method according to claim 13, wherein the method comprises administering the nucleic acid molecule once a week.

18. A method, comprising:
    culturing peripheral blood mononuclear cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in the presence of a peptide; and inducing WT1-specific CTLs and/or WT1-specific helper T cells from the peripheral blood mononuclear cells, wherein the peptide is selected from the group consisting of RMFPNAPYL of SEQ ID NO: 2,
RYFPNAPYL of SEQ ID NO: 46,
YMFPNAPYL of SEQ ID NO: 14,
CYTWNOMNL of SEQ ID NO: 45,
CMTWNQMNL of SEQ ID NO: 3,
C-CYTWNQMNL of SEQ ID NO: 47 wherein C-C shown in the formula means that the C residues are linked together by a disulfide bond, and
C-CMTWNQMNL of SEQ ID NO: 48 wherein C-C shown in the formula means that the C residues are linked together by a disulfide bond.

19. The method according to claim 18, further comprising administering to the subject an effective amount of the WT1-specific CTLs and/or WT1-specific helper T cells.

20. A method, comprising:
culturing immature dendritic cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in the presence of a peptide; and
inducing WT1-presenting dendritic cells,
wherein the peptide is selected from the group consisting of RMFPNAPYL of SEQ ID NO: 2,
RYFPNAPYL of SEQ ID NO: 46,
YMFPNAPYL of SEQ ID NO: 14,
CYTWNOMNL of SEQ ID NO: 45,
CMTWNQMNL of SEQ ID NO: 3,
C-CYTWNQMNL of SEQ ID NO: 47 wherein C-C shown in the formula means that the C residues are linked together by a disulfide bond, and
C-CMTWNQMNL of SEQ ID NO: 48 wherein C-C shown in the formula means that the C residues are linked together by a disulfide bond.

21. The method according to claim 20, further comprising:
administering to the subject an effective amount of the WT1-presenting dendritic cells.

22. A method, comprising:
culturing peripheral blood mononuclear cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in the presence of a conjugate of formulas (2) or (3); and
inducing WT1-specific CTLs and/or WT1-specific helper T cells from the peripheral blood mononuclear cells,
wherein the conjugate of the formula (2) is

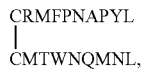

and the conjugate of the formula (3) is

wherein C-C shown in the formulas (2) and (3) means that the C residues are linked together by a disulfide bond.

23. The method according to claim 22, further comprising:
administering to the subject an effective amount of the WT1-specific CTLs and/or WT1-specific helper T cells.

24. A method, comprising:
culturing immature dendritic cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma in the presence of a conjugate of formulas (2) or (3); and
inducing WT1-presenting dendritic cells,
wherein the conjugate of the formula (2) is

and the conjugate of the formula (3) is

wherein C-C shown in the formulas (2) and (3) means that the C residues are linked together by a disulfide bond.

25. A method, comprising:
introducing a nucleic acid molecule, which encodes a peptide into peripheral blood mononuclear cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma; and
inducing WT1-specific CTLs and/or WT1-specific helper T cells from the peripheral blood mononuclear cells,
wherein the peptide is selected from the group consisting of RMFPNAPYL of SEQ ID NO: 2,
RYFPNAPYL of SEQ ID NO: 46,
YMFPNAPYL of SEQ ID NO: 14,
CYTWNQMNL of SEQ ID NO: 45,
CMTWNQMNL of SEQ ID NO: 3,
C-CYTWNQMNL of SEQ ID NO: 47 wherein C-C shown in the formula means that the C residues are linked together by a disulfide bond, and
C-CMTWNQMNL of SEQ ID NO: 48 wherein C-C shown in the formula means that the C residues are linked together by a disulfide bond.

26. A method, comprising:
introducing a nucleic acid molecule, which encodes a conjugate of formulas (2) or (3) into peripheral blood mononuclear cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma; and
inducing WT1-specific CTLs and/or WT1-specific helper T cells from the peripheral blood mononuclear cells,
wherein the conjugate of the formula (2) is

and the conjugate of the formula (3) is

wherein C-C shown in the formulas (2) and (3) means that the C residues are linked together by a disulfide bond.

27. A method, comprising:
introducing a nucleic acid molecule, which encodes a peptide into immature dendritic cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma; and
inducing WT1-presenting dendritic cells,
wherein the peptide is selected from the group consisting of
RMFPNAPYL of SEQ ID NO: 2,
RYFPNAPYL of SEQ ID NO: 46,
YMFPNAPYL of SEQ ID NO: 14,
CYTWNQMNL of SEQ ID NO: 45,
CMTWNQMNL of SEQ ID NO: 3,
C-CYTWNQMNL of SEQ ID NO: 47 wherein C-C shown in the formula means that the C residues are linked together by a disulfide bond, and
C-CMTWNQMNL of SEQ ID NO: 48 wherein C-C shown in the formula means that the C residues are linked together by a disulfide bond.

28. A method, comprising:
introducing a nucleic acid molecule, which encodes a conjugate of formulas (2) or (3) into immature dendritic cells from a subject in need of treatment for a benign tumor selected from the group consisting of familial adenomatous polyposis, non-hereditary colorectal adenoma, intraductal papillary mucinous neoplasm, meningioma, schwannoma, epithelial adenoma of an organ, papilloma, non-epithelial myoma, lipoma, and chondroma; and
inducing WT1-presenting dendritic cells,
wherein the conjugate of the formula (2) is

and the conjugate of the formula (3) is

wherein C-C shown in the formulas (2) and (3) means that the C residues are linked together by a disulfide bond.

* * * * *

SEQUENCE LISTING

```
<160> NUMBER OF SEQ ID NOS: 72

<210> SEQ ID NO 1
<211> LENGTH: 449
<212> TYPE: PRT
<213> ORGANISM: Homo sapiens

<400> SEQUENCE: 1

Met Gly Ser Asp Val Arg Asp Leu Asn Ala Leu Leu Pro Ala Val Pro
1               5                   10                  15

Ser Leu Gly Gly Gly Gly Gly Cys Ala Leu Pro Val Ser Gly Ala Ala
            20                  25                  30

Gln Trp Ala Pro Val Leu Asp Phe Ala Pro Pro Gly Ala Ser Ala Tyr
        35                  40                  45

Gly Ser Leu Gly Gly Pro Ala Pro Pro Ala Pro Pro Pro Pro
    50                  55                  60

Pro Pro Pro His Ser Phe Ile Lys Gln Glu Pro Ser Trp Gly Gly
65                  70                  75                  80

Ala Glu Pro His Glu Glu Gln Cys Leu Ser Ala Phe Thr Val His Phe
                85                  90                  95

Ser Gly Gln Phe Thr Gly Thr Ala Gly Ala Cys Arg Tyr Gly Pro Phe
            100                 105                 110

Gly Pro Pro Pro Pro Ser Gln Ala Ser Ser Gly Gln Ala Arg Met Phe
        115                 120                 125
```

```
Pro Asn Ala Pro Tyr Leu Pro Ser Cys Leu Glu Ser Gln Pro Ala Ile
    130                 135                 140

Arg Asn Gln Gly Tyr Ser Thr Val Thr Phe Asp Gly Thr Pro Ser Tyr
145                 150                 155                 160

Gly His Thr Pro Ser His His Ala Ala Gln Phe Pro Asn His Ser Phe
                165                 170                 175

Lys His Glu Asp Pro Met Gly Gln Gln Gly Ser Leu Gly Glu Gln Gln
            180                 185                 190

Tyr Ser Val Pro Pro Val Tyr Gly Cys His Thr Pro Thr Asp Ser
        195                 200                 205

Cys Thr Gly Ser Gln Ala Leu Leu Leu Arg Thr Pro Tyr Ser Ser Asp
    210                 215                 220

Asn Leu Tyr Gln Met Thr Ser Gln Leu Glu Cys Met Thr Trp Asn Gln
225                 230                 235                 240

Met Asn Leu Gly Ala Thr Leu Lys Gly Val Ala Ala Gly Ser Ser Ser
                245                 250                 255

Ser Val Lys Trp Thr Glu Gly Gln Ser Asn His Ser Thr Gly Tyr Glu
            260                 265                 270

Ser Asp Asn His Thr Thr Pro Ile Leu Cys Gly Ala Gln Tyr Arg Ile
        275                 280                 285

His Thr His Gly Val Phe Arg Gly Ile Gln Asp Val Arg Arg Val Pro
    290                 295                 300

Gly Val Ala Pro Thr Leu Val Arg Ser Ala Ser Glu Thr Ser Glu Lys
305                 310                 315                 320

Arg Pro Phe Met Cys Ala Tyr Pro Gly Cys Asn Lys Arg Tyr Phe Lys
                325                 330                 335

Leu Ser His Leu Gln Met His Ser Arg Lys His Thr Gly Glu Lys Pro
            340                 345                 350

Tyr Gln Cys Asp Phe Lys Asp Cys Glu Arg Arg Phe Ser Arg Ser Asp
        355                 360                 365

Gln Leu Lys Arg His Gln Arg Arg His Thr Gly Val Lys Pro Phe Gln
    370                 375                 380

Cys Lys Thr Cys Gln Arg Lys Phe Ser Arg Ser Asp His Leu Lys Thr
385                 390                 395                 400

His Thr Arg Thr His Thr Gly Lys Thr Ser Glu Lys Pro Phe Ser Cys
                405                 410                 415

Arg Trp Pro Ser Cys Gln Lys Lys Phe Ala Arg Ser Asp Glu Leu Val
            420                 425                 430

Arg His His Asn Met His Gln Arg Asn Met Thr Lys Leu Gln Leu Ala
        435                 440                 445

Leu

<210> SEQ ID NO 2
<211> LENGTH: 9
<212> TYPE: PRT
<213> ORGANISM: artificial sequence
<220> FEATURE:
<223> OTHER INFORMATION: Synthetic peptide

<400> SEQUENCE: 2

Arg Met Phe Pro Asn Ala Pro Tyr Leu
1               5

<210> SEQ ID NO 3
<211> LENGTH: 9
```

```
<212> TYPE: PRT
<213> ORGANISM: artificial sequence
<220> FEATURE:
<223> OTHER INFORMATION: Synthetic peptide

<400> SEQUENCE: 3

Cys Met Thr Trp Asn Gln Met Asn Leu
1               5

<210> SEQ ID NO 4
<211> LENGTH: 18
<212> TYPE: PRT
<213> ORGANISM: artificial sequence
<220> FEATURE:
<223> OTHER INFORMATION: Synthetic peptide

<400> SEQUENCE: 4

Trp Ala Pro Val Leu Asp Phe Ala Pro Pro Gly Ala Ser Ala Tyr Gly
1               5                   10                  15

Ser Leu

<210> SEQ ID NO 5
<211> LENGTH: 16
<212> TYPE: PRT
<213> ORGANISM: artificial sequence
<220> FEATURE:
<223> OTHER INFORMATION: Synthetic peptide

<400> SEQUENCE: 5

Lys Arg Tyr Phe Lys Leu Ser His Leu Gln Met His Ser Arg Lys His
1               5                   10                  15

<210> SEQ ID NO 6
<211> LENGTH: 9
<212> TYPE: PRT
<213> ORGANISM: artificial sequence
<220> FEATURE:
<223> OTHER INFORMATION: Synthetic peptide

<400> SEQUENCE: 6

Gly Met Phe Pro Asn Ala Pro Tyr Leu
1               5

<210> SEQ ID NO 7
<211> LENGTH: 9
<212> TYPE: PRT
<213> ORGANISM: artificial sequence
<220> FEATURE:
<223> OTHER INFORMATION: Synthetic peptide

<400> SEQUENCE: 7

Ala Met Phe Pro Asn Ala Pro Tyr Leu
1               5

<210> SEQ ID NO 8
<211> LENGTH: 9
<212> TYPE: PRT
<213> ORGANISM: artificial sequence
<220> FEATURE:
<223> OTHER INFORMATION: Synthetic peptide

<400> SEQUENCE: 8

Val Met Phe Pro Asn Ala Pro Tyr Leu
1               5

<210> SEQ ID NO 9
```

```
<211> LENGTH: 9
<212> TYPE: PRT
<213> ORGANISM: artificial sequence
<220> FEATURE:
<223> OTHER INFORMATION: Synthetic peptide

<400> SEQUENCE: 9

Leu Met Phe Pro Asn Ala Pro Tyr Leu
1               5

<210> SEQ ID NO 10
<211> LENGTH: 9
<212> TYPE: PRT
<213> ORGANISM: artificial sequence
<220> FEATURE:
<223> OTHER INFORMATION: Synthetic peptide

<400> SEQUENCE: 10

Ile Met Phe Pro Asn Ala Pro Tyr Leu
1               5

<210> SEQ ID NO 11
<211> LENGTH: 9
<212> TYPE: PRT
<213> ORGANISM: artificial sequence
<220> FEATURE:
<223> OTHER INFORMATION: Synthetic peptide

<400> SEQUENCE: 11

Met Met Phe Pro Asn Ala Pro Tyr Leu
1               5

<210> SEQ ID NO 12
<211> LENGTH: 9
<212> TYPE: PRT
<213> ORGANISM: artificial sequence
<220> FEATURE:
<223> OTHER INFORMATION: Synthetic peptide

<400> SEQUENCE: 12

Trp Met Phe Pro Asn Ala Pro Tyr Leu
1               5

<210> SEQ ID NO 13
<211> LENGTH: 9
<212> TYPE: PRT
<213> ORGANISM: artificial sequence
<220> FEATURE:
<223> OTHER INFORMATION: Synthetic peptide

<400> SEQUENCE: 13

Phe Met Phe Pro Asn Ala Pro Tyr Leu
1               5

<210> SEQ ID NO 14
<211> LENGTH: 9
<212> TYPE: PRT
<213> ORGANISM: artificial sequence
<220> FEATURE:
<223> OTHER INFORMATION: Synthetic peptide

<400> SEQUENCE: 14

Tyr Met Phe Pro Asn Ala Pro Tyr Leu
1               5

<210> SEQ ID NO 15
<211> LENGTH: 9
```

```
<212> TYPE: PRT
<213> ORGANISM: artificial sequence
<220> FEATURE:
<223> OTHER INFORMATION: Synthetic peptide

<400> SEQUENCE: 15

Arg Val Phe Pro Asn Ala Pro Tyr Leu
1               5

<210> SEQ ID NO 16
<211> LENGTH: 9
<212> TYPE: PRT
<213> ORGANISM: artificial sequence
<220> FEATURE:
<223> OTHER INFORMATION: Synthetic peptide

<400> SEQUENCE: 16

Arg Gln Phe Pro Asn Ala Pro Tyr Leu
1               5

<210> SEQ ID NO 17
<211> LENGTH: 9
<212> TYPE: PRT
<213> ORGANISM: artificial sequence
<220> FEATURE:
<223> OTHER INFORMATION: Synthetic peptide

<400> SEQUENCE: 17

Arg Ala Phe Pro Asn Ala Pro Tyr Leu
1               5

<210> SEQ ID NO 18
<211> LENGTH: 9
<212> TYPE: PRT
<213> ORGANISM: artificial sequence
<220> FEATURE:
<223> OTHER INFORMATION: Synthetic peptide

<400> SEQUENCE: 18

Arg Leu Phe Pro Asn Ala Pro Tyr Leu
1               5

<210> SEQ ID NO 19
<211> LENGTH: 9
<212> TYPE: PRT
<213> ORGANISM: artificial sequence
<220> FEATURE:
<223> OTHER INFORMATION: Synthetic peptide

<400> SEQUENCE: 19

Arg Ile Phe Pro Asn Ala Pro Tyr Leu
1               5

<210> SEQ ID NO 20
<211> LENGTH: 9
<212> TYPE: PRT
<213> ORGANISM: artificial sequence
<220> FEATURE:
<223> OTHER INFORMATION: Synthetic peptide

<400> SEQUENCE: 20

Arg Met Ile Pro Asn Ala Pro Tyr Leu
1               5

<210> SEQ ID NO 21
<211> LENGTH: 9
<212> TYPE: PRT
```

```
<213> ORGANISM: artificial sequence
<220> FEATURE:
<223> OTHER INFORMATION: Synthetic peptide

<400> SEQUENCE: 21

Arg Met Leu Pro Asn Ala Pro Tyr Leu
1               5

<210> SEQ ID NO 22
<211> LENGTH: 9
<212> TYPE: PRT
<213> ORGANISM: artificial sequence
<220> FEATURE:
<223> OTHER INFORMATION: Synthetic peptide

<400> SEQUENCE: 22

Arg Met Gly Pro Asn Ala Pro Tyr Leu
1               5

<210> SEQ ID NO 23
<211> LENGTH: 9
<212> TYPE: PRT
<213> ORGANISM: artificial sequence
<220> FEATURE:
<223> OTHER INFORMATION: Synthetic peptide

<400> SEQUENCE: 23

Arg Met Ala Pro Asn Ala Pro Tyr Leu
1               5

<210> SEQ ID NO 24
<211> LENGTH: 9
<212> TYPE: PRT
<213> ORGANISM: artificial sequence
<220> FEATURE:
<223> OTHER INFORMATION: Synthetic peptide

<400> SEQUENCE: 24

Arg Met Val Pro Asn Ala Pro Tyr Leu
1               5

<210> SEQ ID NO 25
<211> LENGTH: 9
<212> TYPE: PRT
<213> ORGANISM: artificial sequence
<220> FEATURE:
<223> OTHER INFORMATION: Synthetic peptide

<400> SEQUENCE: 25

Arg Met Met Pro Asn Ala Pro Tyr Leu
1               5

<210> SEQ ID NO 26
<211> LENGTH: 9
<212> TYPE: PRT
<213> ORGANISM: artificial sequence
<220> FEATURE:
<223> OTHER INFORMATION: Synthetic peptide

<400> SEQUENCE: 26

Arg Met Pro Pro Asn Ala Pro Tyr Leu
1               5

<210> SEQ ID NO 27
<211> LENGTH: 9
<212> TYPE: PRT
<213> ORGANISM: artificial sequence
```

```
<220> FEATURE:
<223> OTHER INFORMATION: Synthetic peptide

<400> SEQUENCE: 27

Arg Met Trp Pro Asn Ala Pro Tyr Leu
1               5

<210> SEQ ID NO 28
<211> LENGTH: 9
<212> TYPE: PRT
<213> ORGANISM: artificial sequence
<220> FEATURE:
<223> OTHER INFORMATION: Synthetic peptide

<400> SEQUENCE: 28

Arg Met Phe Pro Asn Ala Pro Tyr Val
1               5

<210> SEQ ID NO 29
<211> LENGTH: 9
<212> TYPE: PRT
<213> ORGANISM: artificial sequence
<220> FEATURE:
<223> OTHER INFORMATION: Synthetic peptide

<400> SEQUENCE: 29

Arg Met Phe Pro Asn Ala Pro Tyr Ala
1               5

<210> SEQ ID NO 30
<211> LENGTH: 9
<212> TYPE: PRT
<213> ORGANISM: artificial sequence
<220> FEATURE:
<223> OTHER INFORMATION: Synthetic peptide

<400> SEQUENCE: 30

Arg Met Phe Pro Asn Ala Pro Tyr Ile
1               5

<210> SEQ ID NO 31
<211> LENGTH: 9
<212> TYPE: PRT
<213> ORGANISM: artificial sequence
<220> FEATURE:
<223> OTHER INFORMATION: Synthetic peptide

<400> SEQUENCE: 31

Arg Met Phe Pro Asn Ala Pro Tyr Met
1               5

<210> SEQ ID NO 32
<211> LENGTH: 9
<212> TYPE: PRT
<213> ORGANISM: artificial sequence
<220> FEATURE:
<223> OTHER INFORMATION: Synthetic peptide

<400> SEQUENCE: 32

Asp Met Phe Pro Asn Ala Pro Tyr Leu
1               5

<210> SEQ ID NO 33
<211> LENGTH: 9
<212> TYPE: PRT
<213> ORGANISM: artificial sequence
<220> FEATURE:
```

<223> OTHER INFORMATION: Synthetic peptide

<400> SEQUENCE: 33

Glu Met Phe Pro Asn Ala Pro Tyr Leu
1               5

<210> SEQ ID NO 34
<211> LENGTH: 9
<212> TYPE: PRT
<213> ORGANISM: artificial sequence
<220> FEATURE:
<223> OTHER INFORMATION: Synthetic peptide

<400> SEQUENCE: 34

His Met Phe Pro Asn Ala Pro Tyr Leu
1               5

<210> SEQ ID NO 35
<211> LENGTH: 9
<212> TYPE: PRT
<213> ORGANISM: artificial sequence
<220> FEATURE:
<223> OTHER INFORMATION: Synthetic peptide

<400> SEQUENCE: 35

Lys Met Phe Pro Asn Ala Pro Tyr Leu
1               5

<210> SEQ ID NO 36
<211> LENGTH: 9
<212> TYPE: PRT
<213> ORGANISM: artificial sequence
<220> FEATURE:
<223> OTHER INFORMATION: Synthetic peptide

<400> SEQUENCE: 36

Asn Met Phe Pro Asn Ala Pro Tyr Leu
1               5

<210> SEQ ID NO 37
<211> LENGTH: 9
<212> TYPE: PRT
<213> ORGANISM: artificial sequence
<220> FEATURE:
<223> OTHER INFORMATION: Synthetic peptide

<400> SEQUENCE: 37

Pro Met Phe Pro Asn Ala Pro Tyr Leu
1               5

<210> SEQ ID NO 38
<211> LENGTH: 9
<212> TYPE: PRT
<213> ORGANISM: artificial sequence
<220> FEATURE:
<223> OTHER INFORMATION: Synthetic peptide

<400> SEQUENCE: 38

Gln Met Phe Pro Asn Ala Pro Tyr Leu
1               5

<210> SEQ ID NO 39
<211> LENGTH: 9
<212> TYPE: PRT
<213> ORGANISM: artificial sequence
<220> FEATURE:
<223> OTHER INFORMATION: Synthetic peptide

<400> SEQUENCE: 39

Ser Met Phe Pro Asn Ala Pro Tyr Leu
1               5

<210> SEQ ID NO 40
<211> LENGTH: 9
<212> TYPE: PRT
<213> ORGANISM: artificial sequence
<220> FEATURE:
<223> OTHER INFORMATION: Synthetic peptide

<400> SEQUENCE: 40

Thr Met Phe Pro Asn Ala Pro Tyr Leu
1               5

<210> SEQ ID NO 41
<211> LENGTH: 9
<212> TYPE: PRT
<213> ORGANISM: artificial sequence
<220> FEATURE:
<223> OTHER INFORMATION: Synthetic peptide

<400> SEQUENCE: 41

Arg Ile Phe Pro Asn Ala Pro Tyr Ile
1               5

<210> SEQ ID NO 42
<211> LENGTH: 9
<212> TYPE: PRT
<213> ORGANISM: artificial sequence
<220> FEATURE:
<223> OTHER INFORMATION: Synthetic peptide

<400> SEQUENCE: 42

Arg Ile Phe Pro Asn Ala Pro Tyr Val
1               5

<210> SEQ ID NO 43
<211> LENGTH: 9
<212> TYPE: PRT
<213> ORGANISM: artificial sequence
<220> FEATURE:
<223> OTHER INFORMATION: Synthetic peptide

<400> SEQUENCE: 43

Arg Leu Phe Pro Asn Ala Pro Tyr Ile
1               5

<210> SEQ ID NO 44
<211> LENGTH: 9
<212> TYPE: PRT
<213> ORGANISM: artificial sequence
<220> FEATURE:
<223> OTHER INFORMATION: Synthetic peptide

<400> SEQUENCE: 44

Arg Leu Phe Pro Asn Ala Pro Tyr Val
1               5

<210> SEQ ID NO 45
<211> LENGTH: 9
<212> TYPE: PRT
<213> ORGANISM: artificial sequence
<220> FEATURE:
<223> OTHER INFORMATION: Synthetic peptide

```
<400> SEQUENCE: 45

Cys Tyr Thr Trp Asn Gln Met Asn Leu
1               5

<210> SEQ ID NO 46
<211> LENGTH: 9
<212> TYPE: PRT
<213> ORGANISM: artificial sequence
<220> FEATURE:
<223> OTHER INFORMATION: Synthetic peptide

<400> SEQUENCE: 46

Arg Tyr Phe Pro Asn Ala Pro Tyr Leu
1               5

<210> SEQ ID NO 47
<211> LENGTH: 10
<212> TYPE: PRT
<213> ORGANISM: artificial sequence
<220> FEATURE:
<223> OTHER INFORMATION: Synthetic peptide
<220> FEATURE:
<221> NAME/KEY: DISULFID
<222> LOCATION: (1)..(2)

<400> SEQUENCE: 47

Cys Cys Tyr Thr Trp Asn Gln Met Asn Leu
1               5                   10

<210> SEQ ID NO 48
<211> LENGTH: 10
<212> TYPE: PRT
<213> ORGANISM: artificial sequence
<220> FEATURE:
<223> OTHER INFORMATION: Synthetic peptide
<220> FEATURE:
<221> NAME/KEY: DISULFID
<222> LOCATION: (1)..(2)

<400> SEQUENCE: 48

Cys Cys Met Thr Trp Asn Gln Met Asn Leu
1               5                   10

<210> SEQ ID NO 49
<211> LENGTH: 19
<212> TYPE: PRT
<213> ORGANISM: artificial sequence
<220> FEATURE:
<223> OTHER INFORMATION: Synthetic peptide

<400> SEQUENCE: 49

Pro Gly Cys Asn Lys Arg Tyr Phe Lys Leu Ser His Leu Gln Met His
1               5                   10                  15

Ser Arg Lys

<210> SEQ ID NO 50
<211> LENGTH: 19
<212> TYPE: PRT
<213> ORGANISM: artificial sequence
<220> FEATURE:
<223> OTHER INFORMATION: Synthetic peptide

<400> SEQUENCE: 50

Cys Trp Ala Pro Val Leu Asp Phe Ala Pro Pro Gly Ala Ser Ala Tyr
1               5                   10                  15

Gly Ser Leu
```

<210> SEQ ID NO 51
<211> LENGTH: 19
<212> TYPE: PRT
<213> ORGANISM: artificial sequence
<220> FEATURE:
<223> OTHER INFORMATION: Synthetic peptide

<400> SEQUENCE: 51

Trp Ala Pro Val Leu Asp Phe Ala Pro Pro Gly Ala Ser Ala Tyr Gly
1               5                   10                  15

Ser Leu Cys

<210> SEQ ID NO 52
<211> LENGTH: 9
<212> TYPE: PRT
<213> ORGANISM: artificial sequence
<220> FEATURE:
<223> OTHER INFORMATION: Synthetic peptide

<400> SEQUENCE: 52

Ala Leu Leu Pro Ala Val Pro Ser Leu
1               5

<210> SEQ ID NO 53
<211> LENGTH: 9
<212> TYPE: PRT
<213> ORGANISM: artificial sequence
<220> FEATURE:
<223> OTHER INFORMATION: Synthetic peptide

<400> SEQUENCE: 53

Ser Leu Gly Glu Gln Gln Tyr Ser Val
1               5

<210> SEQ ID NO 54
<211> LENGTH: 9
<212> TYPE: PRT
<213> ORGANISM: artificial sequence
<220> FEATURE:
<223> OTHER INFORMATION: Synthetic peptide

<400> SEQUENCE: 54

Arg Val Pro Gly Val Ala Pro Thr Leu
1               5

<210> SEQ ID NO 55
<211> LENGTH: 9
<212> TYPE: PRT
<213> ORGANISM: artificial sequence
<220> FEATURE:
<223> OTHER INFORMATION: Synthetic peptide
<220> FEATURE:
<221> NAME/KEY: misc_feature
<222> LOCATION: (1)..(1)
<223> OTHER INFORMATION: Xaa is Ser or Ala

<400> SEQUENCE: 55

Xaa Met Thr Trp Asn Gln Met Asn Leu
1               5

<210> SEQ ID NO 56
<211> LENGTH: 9
<212> TYPE: PRT
<213> ORGANISM: artificial sequence
<220> FEATURE:
<223> OTHER INFORMATION: Synthetic peptide

```
<220> FEATURE:
<221> NAME/KEY: misc_feature
<222> LOCATION: (1)..(1)
<223> OTHER INFORMATION: Xaa is selected from the group consisting of
      Ser, Ala, Abu, Arg, Lys, Orn, Cit, Leu, Phe and Asn

<400> SEQUENCE: 56

Xaa Tyr Thr Trp Asn Gln Met Asn Leu
1               5

<210> SEQ ID NO 57
<211> LENGTH: 9
<212> TYPE: PRT
<213> ORGANISM: artificial sequence
<220> FEATURE:
<223> OTHER INFORMATION: Synthetic peptide

<400> SEQUENCE: 57

Ala Tyr Leu Pro Ala Val Pro Ser Leu
1               5

<210> SEQ ID NO 58
<211> LENGTH: 9
<212> TYPE: PRT
<213> ORGANISM: artificial sequence
<220> FEATURE:
<223> OTHER INFORMATION: Synthetic peptide

<400> SEQUENCE: 58

Phe Leu Gly Glu Gln Gln Tyr Ser Val
1               5

<210> SEQ ID NO 59
<211> LENGTH: 9
<212> TYPE: PRT
<213> ORGANISM: artificial sequence
<220> FEATURE:
<223> OTHER INFORMATION: Synthetic peptide

<400> SEQUENCE: 59

Ser Met Gly Glu Gln Gln Tyr Ser Val
1               5

<210> SEQ ID NO 60
<211> LENGTH: 9
<212> TYPE: PRT
<213> ORGANISM: artificial sequence
<220> FEATURE:
<223> OTHER INFORMATION: Synthetic peptide

<400> SEQUENCE: 60

Ser Leu Met Glu Gln Gln Tyr Ser Val
1               5

<210> SEQ ID NO 61
<211> LENGTH: 9
<212> TYPE: PRT
<213> ORGANISM: artificial sequence
<220> FEATURE:
<223> OTHER INFORMATION: Synthetic peptide

<400> SEQUENCE: 61

Arg Tyr Pro Gly Val Ala Pro Thr Leu
1               5

<210> SEQ ID NO 62
<211> LENGTH: 20
```

<212> TYPE: PRT
<213> ORGANISM: artificial sequence
<220> FEATURE:
<223> OTHER INFORMATION: Synthetic peptide

<400> SEQUENCE: 62

Pro Gly Cys Asn Lys Arg Tyr Phe Lys Leu Ser His Leu Gln Met His
1               5                   10                  15

Ser Arg Lys His
            20

<210> SEQ ID NO 63
<211> LENGTH: 17
<212> TYPE: PRT
<213> ORGANISM: artificial sequence
<220> FEATURE:
<223> OTHER INFORMATION: Synthetic peptide

<400> SEQUENCE: 63

Cys Asn Lys Arg Tyr Phe Lys Leu Ser His Leu Gln Met His Ser Arg
1               5                   10                  15

Lys

<210> SEQ ID NO 64
<211> LENGTH: 18
<212> TYPE: PRT
<213> ORGANISM: artificial sequence
<220> FEATURE:
<223> OTHER INFORMATION: Synthetic peptide

<400> SEQUENCE: 64

Cys Asn Lys Arg Tyr Phe Lys Leu Ser His Leu Gln Met His Ser Arg
1               5                   10                  15

Lys His

<210> SEQ ID NO 65
<211> LENGTH: 20
<212> TYPE: PRT
<213> ORGANISM: artificial sequence
<220> FEATURE:
<223> OTHER INFORMATION: Synthetic peptide

<400> SEQUENCE: 65

Cys Asn Lys Arg Tyr Phe Lys Leu Ser His Leu Gln Met His Ser Arg
1               5                   10                  15

Lys His Thr Gly
            20

<210> SEQ ID NO 66
<211> LENGTH: 19
<212> TYPE: PRT
<213> ORGANISM: artificial sequence
<220> FEATURE:
<223> OTHER INFORMATION: Synthetic peptide

<400> SEQUENCE: 66

Cys Trp Ala Pro Val Leu Asp Phe Ala Pro Pro Gly Ala Ser Ala Tyr
1               5                   10                  15

Gly Ser Leu

<210> SEQ ID NO 67
<211> LENGTH: 19
<212> TYPE: PRT
<213> ORGANISM: artificial sequence

```
<220> FEATURE:
<223> OTHER INFORMATION: Synthetic peptide

<400> SEQUENCE: 67

Trp Ala Pro Val Leu Asp Phe Ala Pro Pro Gly Ala Ser Ala Tyr Gly
1               5                   10                  15

Ser Leu Cys

<210> SEQ ID NO 68
<211> LENGTH: 9
<212> TYPE: PRT
<213> ORGANISM: artificial sequence
<220> FEATURE:
<223> OTHER INFORMATION: Synthetic peptide

<400> SEQUENCE: 68

Val Leu Asp Phe Ala Pro Pro Gly Ala
1               5

<210> SEQ ID NO 69
<211> LENGTH: 19
<212> TYPE: PRT
<213> ORGANISM: artificial sequence
<220> FEATURE:
<223> OTHER INFORMATION: Synthetic peptide

<400> SEQUENCE: 69

Ser Gly Gln Ala Arg Met Phe Pro Asn Ala Pro Tyr Leu Pro Ser Cys
1               5                   10                  15

Leu Glu Ser

<210> SEQ ID NO 70
<211> LENGTH: 19
<212> TYPE: PRT
<213> ORGANISM: artificial sequence
<220> FEATURE:
<223> OTHER INFORMATION: Synthetic peptide

<400> SEQUENCE: 70

Ser Gly Gln Ala Tyr Met Phe Pro Asn Ala Pro Tyr Leu Pro Ser Cys
1               5                   10                  15

Leu Glu Ser

<210> SEQ ID NO 71
<211> LENGTH: 16
<212> TYPE: PRT
<213> ORGANISM: artificial sequence
<220> FEATURE:
<223> OTHER INFORMATION: Synthetic peptide

<400> SEQUENCE: 71

Ser Gly Gln Ala Arg Met Phe Pro Asn Ala Pro Tyr Leu Pro Ser Cys
1               5                   10                  15

<210> SEQ ID NO 72
<211> LENGTH: 16
<212> TYPE: PRT
<213> ORGANISM: artificial sequence
<220> FEATURE:
<223> OTHER INFORMATION: Synthetic peptide

<400> SEQUENCE: 72

Ser Gly Gln Ala Tyr Met Phe Pro Asn Ala Pro Tyr Leu Pro Ser Cys
1               5                   10                  15
```